United States Patent
Ditizio et al.

(10) Patent No.: US 9,121,098 B2
(45) Date of Patent: *Sep. 1, 2015

(54) NANOLAYER DEPOSITION PROCESS FOR COMPOSITE FILMS

(75) Inventors: Robert Anthony Ditizio, Petaluma, CA (US); Tue Nguyen, Fremont, CA (US); Tai Dung Nguyen, Fremont, CA (US)

(73) Assignee: ASM International N.V. (NL)

( * ) Notice: Subject to any disclaimer, the term of this patent is extended or adjusted under 35 U.S.C. 154(b) by 51 days.

This patent is subject to a terminal disclaimer.

(21) Appl. No.: 13/235,909

(22) Filed: Sep. 19, 2011

(65) Prior Publication Data

US 2012/0021138 A1 Jan. 26, 2012

Related U.S. Application Data

(63) Continuation-in-part of application No. 12/732,825, filed on Mar. 26, 2010, and a continuation of application No. 10/360,135, filed on Feb. 4, 2003, now Pat. No. 7,713,592.

(51) Int. Cl.
*H05H 1/00* (2006.01)
*C23C 16/56* (2006.01)
(Continued)

(52) U.S. Cl.
CPC .............. *C23C 16/56* (2013.01); *C23C 16/409* (2013.01); *C23C 16/45531* (2013.01); *C23C 16/45536* (2013.01)

(58) Field of Classification Search
CPC .............. C23C 16/4408; C23C 16/409; C23C 16/45523; C23C 16/56
USPC .................................. 427/535, 536, 539, 576
See application file for complete search history.

(56) References Cited

U.S. PATENT DOCUMENTS 3,632,406 A 1/1972 Clough et al.
4,439,463 A 3/1984 Miller
(Continued)

FOREIGN PATENT DOCUMENTS

JP H05-148654 6/1993
JP 10-064849 3/1998
(Continued)

OTHER PUBLICATIONS

Office Action dated Mar. 25, 2013 in U.S. Appl. No. 13/449,175, filed Apr. 17, 2012.
(Continued)

*Primary Examiner* — Michael Wieczorek
(74) *Attorney, Agent, or Firm* — Knobbe Martens Olson & Bear LLP

(57) ABSTRACT

A NanoLayer Deposition (NLD) process for depositing composite films of tertiary, quaternary, pentanary, and hexary stoichiometric films is provided. The inventive deposition process is a cyclic process consisting of a sequence of thin film deposition and treatment steps to obtain a desired film stoichiometry. The deposition steps are not self-limiting as in atomic layer deposition. In one embodiment for depositing a compound oxide film, the deposition process comprises a first deposition, followed by a hydrogen-containing plasma treatment, a second deposition followed by a hydrogen-containing plasma treatment, and then a third deposition followed by a hydrogen-containing plasma and then an oxygen-containing plasma treatment to produce a stoichiometric quaternary film. The cyclic process is repeated until the desired overall film thickness is achieved. The inventive process is used to fabricate high k dielectric films, ferroelectric films, piezoelectric films, and other complex oxides.

35 Claims, 18 Drawing Sheets

(51) Int. Cl.
*C23C 16/40* (2006.01)
*C23C 16/455* (2006.01)

(56) References Cited

U.S. PATENT DOCUMENTS

| | | | |
|---|---|---|---|
| 4,750,077 A | 6/1988 | Amagasa | |
| 4,783,248 A | 11/1988 | Kohlhase et al. | |
| 4,900,716 A * | 2/1990 | Fujita et al. | 505/446 |
| 4,918,031 A | 4/1990 | Flamm et al. | |
| 4,935,661 A | 6/1990 | Heinecke et al. | |
| 5,102,694 A | 4/1992 | Taylor et al. | |
| 5,242,530 A | 9/1993 | Batey et al. | |
| 5,273,783 A | 12/1993 | Wanner | |
| 5,314,603 A | 5/1994 | Sugiyama et al. | |
| 5,344,792 A | 9/1994 | Sandhu et al. | |
| 5,460,689 A | 10/1995 | Raaijmakers et al. | |
| 5,468,341 A | 11/1995 | Samukawa | |
| 5,492,283 A | 2/1996 | Raaijmakers et al. | |
| 5,529,657 A | 6/1996 | Ishii | |
| 5,556,501 A | 9/1996 | Collins et al. | |
| 5,571,366 A | 11/1996 | Ishii et al. | |
| 5,576,071 A * | 11/1996 | Sandhu | 427/534 |
| 5,580,385 A | 12/1996 | Paranjpe et al. | |
| 5,627,013 A * | 5/1997 | Kamisawa | 430/325 |
| 5,654,679 A | 8/1997 | Mavretic et al. | |
| 5,688,565 A * | 11/1997 | McMillan et al. | 427/565 |
| 5,747,116 A | 5/1998 | Sharan et al. | |
| 5,773,363 A | 6/1998 | Derderian et al. | |
| 5,792,522 A | 8/1998 | Jin et al. | |
| 5,870,121 A | 2/1999 | Chan | |
| 5,871,811 A | 2/1999 | Wang et al. | |
| 5,902,563 A | 5/1999 | Pinneo | |
| 5,916,365 A | 6/1999 | Sherman | |
| 5,919,531 A | 7/1999 | Arkles et al. | |
| 5,961,793 A | 10/1999 | Ngan | |
| 5,968,610 A | 10/1999 | Liu et al. | |
| 5,972,179 A | 10/1999 | Chittipeddi et al. | |
| 5,981,373 A | 11/1999 | Sunada | |
| 5,985,375 A | 11/1999 | Donohoe et al. | |
| 5,989,999 A | 11/1999 | Levine et al. | |
| 5,993,916 A | 11/1999 | Zhao et al. | |
| 6,015,590 A | 1/2000 | Suntola et al. | |
| 6,024,826 A | 2/2000 | Collins et al. | |
| 6,040,021 A | 3/2000 | Miyamoto | |
| 6,054,191 A | 4/2000 | Sharan et al. | |
| 6,066,609 A | 5/2000 | Martin et al. | |
| 6,089,184 A | 7/2000 | Kaizuka et al. | |
| 6,101,971 A | 8/2000 | Denholm et al. | |
| 6,110,531 A * | 8/2000 | Paz de Araujo et al. | 427/255.25 |
| 6,146,907 A * | 11/2000 | Xiang et al. | 438/3 |
| 6,150,209 A | 11/2000 | Sun et al. | |
| 6,158,384 A | 12/2000 | Ye et al. | |
| 6,159,842 A | 12/2000 | Chang et al. | |
| 6,200,651 B1 | 3/2001 | Roche et al. | |
| 6,200,893 B1 | 3/2001 | Sneh | |
| 6,221,792 B1 | 4/2001 | Yang et al. | |
| 6,236,076 B1 * | 5/2001 | Arita et al. | 257/295 |
| 6,268,288 B1 | 7/2001 | Hautala et al. | |
| 6,306,211 B1 | 10/2001 | Takahashi et al. | |
| 6,331,493 B1 | 12/2001 | Sharan | |
| 6,333,202 B1 | 12/2001 | Adkisson et al. | |
| 6,342,277 B1 | 1/2002 | Sherman | |
| 6,406,991 B2 | 6/2002 | Sugihara | |
| 6,436,819 B1 | 8/2002 | Zhang et al. | |
| 6,451,161 B1 | 9/2002 | Jeng et al. | |
| 6,451,390 B1 | 9/2002 | Goto et al. | |
| 6,451,695 B2 | 9/2002 | Sneh | |
| 6,475,910 B1 | 11/2002 | Sneh | |
| 6,492,283 B2 | 12/2002 | Raaijmakers et al. | |
| 6,521,529 B1 | 2/2003 | Ngo et al. | |
| 6,521,544 B1 | 2/2003 | Agarwal et al. | |
| 6,534,395 B2 | 3/2003 | Werkhoven et al. | |
| 6,560,991 B1 | 5/2003 | Kotliar | |
| 6,610,169 B2 | 8/2003 | Nguyen et al. | |
| 6,613,656 B2 | 9/2003 | Li | |
| 6,689,220 B1 | 2/2004 | Nguyen | |
| 6,756,318 B2 | 6/2004 | Nguyen et al. | |
| 6,833,161 B2 | 12/2004 | Wang et al. | |
| 6,951,804 B2 | 10/2005 | Seutter et al. | |
| 6,987,059 B1 | 1/2006 | Burke et al. | |
| 7,148,155 B1 | 12/2006 | Tarafdar et al. | |
| 7,235,484 B2 | 6/2007 | Nguyen et al. | |
| 7,361,387 B2 | 4/2008 | Nguyen | |
| 7,442,615 B2 | 10/2008 | Nguyen et al. | |
| 7,718,538 B2 | 5/2010 | Kim et al. | |
| 7,867,905 B2 | 1/2011 | Nguyen et al. | |
| 8,658,259 B2 * | 2/2014 | Nguyen et al. | 427/535 |
| 2002/0004293 A1 | 1/2002 | Soininen et al. | |
| 2002/0106846 A1 | 8/2002 | Seutter et al. | |
| 2002/0110991 A1 | 8/2002 | Li | |
| 2002/0170677 A1 | 11/2002 | Tucker et al. | |
| 2002/0192954 A1 | 12/2002 | Sneh | |
| 2002/0197403 A1 | 12/2002 | Arkles et al. | |
| 2002/0197864 A1 | 12/2002 | Sneh | |
| 2003/0082296 A1 | 5/2003 | Elers et al. | |
| 2003/0161952 A1 | 8/2003 | Wang et al. | |
| 2006/0211223 A1 | 9/2006 | Brcka | |

FOREIGN PATENT DOCUMENTS

| | | |
|---|---|---|
| JP | 2002-541332 | 12/2002 |
| KR | 2001-0082706 | 8/2001 |
| WO | WO 0061833 | 10/2000 |
| WO | WO 00/79019 A1 | 12/2000 |

OTHER PUBLICATIONS

Office Action dated Apr. 12, 2013 in U.S. Appl. No. 13/480,912, filed May 25, 2012.
Office Action dated Mar. 4, 2013 in U.S. Appl. No. 12/783,431, filed May 19, 2010.
Office Action dated Jun. 11, 2013 in U.S. Appl. No. 12/732,825, filed Mar. 26, 2010.
Office Action dated Sep. 24, 2013 in U.S. Appl. No. 12/783,431, filed May 19, 2010.
Rejection dated May 30, 2013 in Korean Application No. 10-2013-7018629, filed Jul. 16, 2012.
Office Action dated Mar. 13, 2013 in U.S. Appl. No. 13/449,241, filed Apr. 17, 2012.
Final Office Action dated Aug. 7, 2013 in U.S. Appl. No. 13/480,912, filed May 25, 2012.
Final Office Action dated Aug. 22, 2013 in U.S. Appl. No. 13/449,175, filed Apr. 17, 2012.
Office Action dated Oct. 17, 2012 in Korean Patent Application No. 10-2012-7018629, filed Jul. 16, 2012.
Final Office Action dated Oct. 28, 2013 in U.S. Appl. No. 13/449,241, filed Apr. 17, 2012.
Office Action dated Nov. 8, 2013 in U.S. Appl. No. 13/480,912, filed May 25, 2012.
Final Office Action dated Dec. 2, 2013 in U.S. Appl. No. 13/449,175, filed Apr. 17, 2012.
Office Action dated Dec. 24, 2013 in Korean Patent Application No. 10-2013-7023126, filing date Aug. 8, 2013.
Heckman et al., "The evolution of RF power delivery in plasma processing," World Wide Web Page advanced-energy.com/upload/File/White_Papers/SL-WHITE8-270-01.pdf, 1998.
Park et al., "Effect of ion bombardment during chemical vapor deposition of TiN films," J. Electrochem. Soc., 2000, pp. 2711-2717, vol. 147, No. 7, The Electromechanical Society, Inc.
Scholl, Richard A., "Forward And Reflected Powers. What Do They Mean?" Advanced Energy Industries, Inc., World Wide Web Page advanced -energy.com/upload/File/White_Papers/SL-WHITE7-270-01.pdf, 4 pages, 1998.
Data Sheet for Inductively-Coupled Plasma (ICP) Source, Advanced Energy, Industries, Inc., Copyright 2000, 2 pages.
Data sheet for AZX Series 13.56 MHz RF Impedance Matching Networks, Advanced Energy, Industries, Inc., Copyright 1994, 4 pages.
Data sheet for Impedance Matching Option for NOVA RF Plasma Generators, ENI, Copyright 2000, 2 pages.

(56) References Cited

OTHER PUBLICATIONS

Data sheet for HFV-L Variable-Frequency Generators, Advanced Energy, Industries, Inc., 1999, 4 pages.
Tech note 33: "Introducing Power Supplies and Plasma Systems," World Wide Web Page advanced-energy.com/upload/File/White_Papers/SL-WHITE17-270-01.pdf, 8 pages, 1992.
Tech note 34: "Impedance Matching," World Wide Web Page advanced-energy.com/upload/File/White_Papers/eng-white18-270-02.pdf, 12 pages, 2006.
International Search Report dated Sep. 2, 2004, PCT application No. PCT/US04/03349 filed Feb. 4, 2004, 10 pages.
Office Action dated May 21, 2014 in U.S. Appl. No. 12/783,431, filed May 19, 2010.
Final Office Action dated Dec. 12, 2014 in U.S. Appl. No. 12/783,431, filed May 19, 2010.
Office Action dated May 22, 2014 in U.S. Appl. No. 13/449,241, filed Apr. 17, 2012.
Final Office Action dated Dec. 4, 2014 in U.S. Appl. No. 13/449,241, filed Apr. 17, 2012.
Final Office Action dated May 7, 2014 in U.S. Appl. No. 13/449,175, filed Apr. 17, 2012.
Final Office Action dated Apr. 2, 2014 in U.S. Appl. No. 13/480,912, filed May 25, 2012.
Office Action dated Aug. 25, 2014 in U.S. Appl. No. 13/480,912, filed May 25, 2012.
Final Office Action dated Dec. 10, 2014 in U.S. Appl. No. 13/480,912, filed May 25, 2012.
Rejection dated May 27, 2014 in Korean Application No. 10-2012-7018629, filed Jul. 16, 2012.

* cited by examiner

NANOLAYER DEPOSITION PROCESS FOR COMPOSITE FILMS

CLAIM TO PRIORITY

The present invention is a continuation-in-part of U.S. patent application Ser. No. 12/732,825, filed Mar. 26, 2010, which is a continuation of U.S. patent application Ser. No. 10/360,135, filed Feb. 4, 2003, now U.S. Pat. No. 7,713,592, issued May 11, 2010, all applications and patents which are incorporated herein by reference in their entirety.

BACKGROUND OF THE INVENTION

The present invention relates to the deposition of a tertiary, quaternary, pentary, and hexary composite film and specifically to thin film processing and semiconductor thin film processing.

Deposition is one of the basic fabrication processes of modern semiconductor device structures. Deposition techniques include Physical Vapor Deposition (PVD, or sputtering), Chemical Vapor Deposition (CVD), and numerous variations of CVD such as pulsed-CVD, sequential CVD and Atomic Layer Deposition (ALD).

A PVD process uses a high vacuum apparatus and generated plasma to sputter atoms and clusters of atoms from a target toward the surface of a substrate upon which the film is to be deposited. PVD is a line-of-sight deposition process, in that sputtered material from the target tends to move from the target to the substrate and adhere to the first point of contact. This line-of-sight characteristic results in poor coverage on the sidewalls of three-dimensional surface topographies on the wafer surface. Efforts have been made in recent years to improve the conformality of PVD systems but conformal films are generally very difficult to achieve in PVD equipment, especially with aspect ratios of greater than 4:1.

In CVD, a gas or vapor mixture is flowed over the wafer surface at an elevated temperature. Reactions then take place at the hot surface where deposition takes place. The basic characteristic of CVD process is the combined reaction at the substrate of the various precursors in the gas stream. In the case of a mixture of silane and oxygen, for example, silicon from the silane reacts with oxygen to produce silicon dioxide. Excess hydrogen from the silane can either be incorporated into the growing film or pumped away, depending to some extent on the process conditions. The reaction often requires the presence of an energy source such as thermal energy (in the form of resistive heated substrate, or radiative heating) or plasma energy (in the form of plasma excitation). The temperature of the wafer surface is an important factor in the CVD deposition process, because the rate of deposition depends the decomposition and reaction of the precursors, and the reactions rates and decomposition rates are temperature dependent processes. Surface temperature can also affect the uniformity of deposition over the wafer surface. CVD typically requires high temperature for deposition which may not be compatible with other processes in the semiconductor fabrication sequence. CVD at lower temperature tends to produce low quality films in term of film purity, density, and crystallinity. Incomplete reactions, however, at lower temperatures can be enhanced with plasma energy in plasma enhanced CVD process, for example, and by photon energy. CVD technology has been used in semiconductor processing for many years, and the behavior of a wide range of CVD and metalo-organic precursors are understood over wide ranges of temperature. In terms of conformality, CVD processes, much like PVD processes, suffer from poor step coverage over three-dimensional structures on the wafer surface.

Variations of CVD include pulsed-CVD or sequential CVD. In pulsed and sequential CVD, the delivery of the chemical precursors, or the delivery of power from an energy source, is pulsed in such a way that these parameters are not delivered in a continuous manner as in conventional CVD. Pulsing of the chemical precursors can be of one or more of the chemical species required for the growing film. Alternatively, pulsing of the power source can vary energy sources such as plasma energy, thermal energy, laser energy, and photon energy. A major advantage of pulsed-CVD is the potential effect that the transient state resulting from the on-off switching of the precursor or power source has on the process results. Pulsed operational modes are desirable can lead to a reduction in substrate damage and other potentially deleterious effects because of the reduction in delivered power to the substrate with only a modest impact on the reactivity since peak powers can remain the same. The potential reduction in the delivery of precursors for processes in which the delivery of precursors is pulsed is desirable to improve the rate of film growth per volume of incident gas flow, to reduce costs.

Pulsed-CVD can be used to create gradient deposition such as U.S. Pat. No. 5,102,694 of Taylor et al. Taylor discloses a pulsed deposition process in which the precursors are periodically reduced to create a gradient of composition in the deposited films. Taylor's pulsed-CVD relies only on the changing of the first set of precursors to vary the film compositions.

Pulsed-CVD can be used to modulate the precursors flow such as U.S. Pat. No. 5,242,530, entitled "Pulsed gas plasma-enhanced chemical vapor deposition of silicon", of Batey et al. Batey discloses a pulsed deposition process in which the precursor silane is modulated during a steady flow of plasma hydrogen. The pulsing of silane creates a sequence of deposition steps during the parts of the cycle in which the silane is not flowing, coupled with a sequence of cleaning steps during the parts of the cycle that the silane is not flowing. When silane is not flowing, the flow of plasma-activated hydrogen cleans the surface in preparation for the next cycle of silane gas flow.

Pulsed-CVD can be used to pulse the plasma energy needed for the deposition process such as U.S. Pat. No. 5,344,792, entitled "Pulsed plasma-enhanced CVD of metal silicide conductive films such as TiSi.sub.2", of Sandhu et al. Sandhu discloses a pulsed deposition process in which the precursors are introduced into a process chamber, then the plasma energy is introduced in pulsed mode to optimize the deposition conditions. U.S. Pat. No. 5,985,375, entitled "Method for pulsed plasma enhanced vapor deposition", of Donohoe et al. discloses a similar pulsed-CVD process with the plasma energy in pulsed mode but with a power-modulated energy waveform. The pulsing of the plasma energy allows the deposition of a metal film with desired characteristics. U.S. Pat. No. 6,200,651, entitled "Method of chemical vapor deposition in a vacuum plasma processor responsive to a pulsed microwave source", of Roche et al. discloses a pulsed-CVD process with an electron cyclotron resonance plasma having a repetitive pulsed microwave field to optimize the deposited films. U.S. Pat. No. 6,451,390, entitled "Deposition of TEOS oxide using pulsed RF plasma", of Goto et al. discloses a TEOS oxide deposition process using a pulsed, RF plasma to control the deposition rate of silicon dioxide. The pulsing feature offers the optimization of the deposited films through the transient state instead of the steady state. Pulsing of plasma during a nitridation process of gate oxide shows less damage than a continuous plasma nitridation process because of increased interactions in the transient plasma state and a reduction in damage due to shorter plasma time.

Pulsed-CVD can be used to pulse the precursors needed for the deposition process such as U.S. Pat. No. 6,306,211, entitled "Method for growing semiconductor film and method for fabricating semiconductor devices", of Takahashi et al. Takahashi discloses a pulsed-CVD process to deposit epitaxial film of $Si_xGe_yC_z$. Epitaxial deposition requires a single crystal substrate, and the deposited film extends the single crystal nature of the substrate. Epitaxial growth differs from typical CVD in that the films are more typically polycrystalline or amorphous. To extend the single crystal nature of the substrate, the deposited precursors need to bond with the substrate at specific lattice sites, and therefore, low precursor flows are generally preferable in epitaxial deposition to allow the precursors enough time to rearrange into the correct lattice sites. A typical epitaxial process might include a continuous flow of hydrogen to dilute the flow of precursors. Sequential pulses of silicon-based precursor, germanium-based precursor, and carbon-based precursor are then introduced to deposit an epitaxial film of $Si_xGe_yC_z$. To deposit epitaxial films, small amounts of precursors are needed, and the introduction of these small amounts of precursors can be accomplished with short pulses of precursor gases (on the order of micro seconds in duration) and further diluted in high flows of hydrogen. Takahashi discloses that the pulses of the precursors are not overlapped, but is silent on the separation of these pulses. The objective of Takahashi pulsed-CVD is to deposit compound films, therefore the separation of these precursors is not relevant.

Pulsed-CVD as described by Takahashi et al. to deposit epitaxial film of $Si_xGe_yC_z$, does not allow for the deposition of high coverage or conformal film on a non-flat substrate, such as in a via or trench for interconnects or dielectrics in semiconductor devices. The objective of Takahashi pulsed-CVD is to deposit epitaxial films with sufficiently planar surfaces, without mentioning of possible deposition on trenches or vias.

ALD is another variation of CVD using chemical vapor for deposition. In ALD, various gas flows are introduced into a chamber in alternating and separated sequences. For example, a first precursor vapor is delivered into the chamber to be adsorbed on the substrate, the gas flow of this first vapor is then discontinued and residual gases are evacuated from the chamber. Another precursor vapor is then delivered into the chamber to react with the adsorbed molecules on the substrate to form a desired film. The flow of the second precursor gas is then discontinued and residual gases are evacuated from the chamber. This sequence is repeated for many cycles until the deposited film reaches the desired thickness. There are numerous variations of ALD processes, but the ALD processes all share two common characteristics: sequential precursor gas flow and self-limiting thickness per cycle. The sequential precursor flow and evacuation characteristic offers the elimination of gas phase reaction commonly associated with CVD processes. The self-limiting thickness per cycle characteristic offers excellent surface coverage, because the total film thickness does not depend on precursor flow, nor on process time. The total film thickness depends only on the number of cycles. The ALD process then is not sensitive to the substrate temperature. A limitation of ALD is the requirement for reactive sets of paired precursors consisting of a saturating precursor and a reactant. The saturating precursor must adsorb onto the surface of the substrate, and remain bound to the substrate until the delivery of the second reactive precursor to complete the reaction. Non-saturating precursors are better characterized as CVD precursors, since the deposition rate is dependent on substrate temperature and time.

The maximum thickness per cycle in a true ALD process is a single monolayer since the process of saturating the surface is limited by the availability of surface sites. In this process, the precursors do not decompose and do not bond to other precursor gas molecules. The requirement for exposed surface sites for precursor adsorption results in the self-limiting characteristic of ALD and the observed high conformality associated with ALD processes.

Observations of actual ALD processes generally show that the deposition rate is less than a monolayer per cycle as a result of the need to pack large, first precursor molecules together on the surface during the adsorption step. After reaction with the second precursor, a large percentage of the first precursor molecule forms volatile reaction byproducts that are not incorporated into the growing film but rather are pumped away.

Small chamber volumes are typically employed in ALD processing to minimize pumping steps times and fast switching is desirable to minimize transients. The throughput of an ALD process depends on cycle time, which benefits from a small chamber volume. A typical ALD cycle can be as short as a few seconds in duration.

U.S. Pat. No. 5,916,365 to Sherman entitled "Sequential chemical vapor deposition" provides for sequential chemical vapor deposition (ALD) by a sequence of chamber evacuating, adsorption of the first precursor onto the substrate, then another chamber evacuation, then a second radical precursor to react with the adsorbed precursor on the substrate surface, and a third chamber evacuation. The Sherman process produces sub-monolayers per cycle due to the use of the adsorption of saturating first precursors in the adsorption steps. The process cycle can be repeated to grow the desired thickness of film. Sherman discloses an ALD process in which the first precursor process flow is self-limiting, meaning no matter how long the process is, the adsorption thickness cannot be increased. U.S. Pat. No. 6,015,590 to Suntola et al., entitled "Method for growing thin films" discloses an ALD process which completely separates the precursors. Suntola process is an improved ALD process (called ALE by Suntola) meaning the deposition is achieved through the saturation of precursors on the substrate surface and the subsequent reaction with the paired reactants. The advantage of the Suntola process is in the complete separation of precursors, with a better than 99% purging between pulses of precursors to prevent cross reactions.

U.S. Pat. No. 6,200,893, and its divisions (U.S. Pat. Nos. 6,451,695, 6,475,910, U.S. patent publication 2001/0002280, U.S. patent publication 2002/0192954, U.S. patent publication 2002/0197864) to Sneh entitled "Radical-assisted sequential CVD" discuss a method for ALD deposition. The Sneh process sequence is a variation of the ALD process. Sneh discloses a deposition step for the first precursor introduction, but this deposition of Sneh is self-limiting because of the surface saturation with ligands. In U.S. Pat. No. 6,475,910, Sneh discloses a method to extend the thickness of the first precursor introduction step through the addition of another ALD step to increase the thickness of the first precursor introduction step. In a way, this is similar to a nested loop, where the thickness of the first precursor flow step of an ALD process can be increased by another ALD process.

SUMMARY OF THE INVENTION

The present invention provides a hybrid deposition process of CVD and ALD, called NanoLayer Deposition (NLD). A co-pending application "Nanolayer thick film processing system and method" U.S. patent application Ser. No. 09/954,244, filed Sep. 10, 2001 and published Mar. 13, 2003, Pub. No. 20030049375 A1, now U.S. Pat. No. 6,756,318, issued Jun. 29, 2004 has been disclosed and is hereby incorporated by reference in their entirety.

In one aspect of the invention, the present invention method to deposit a thin film on a substrate comprises the steps of:
DEPOSITION STEP (a). depositing thin films on a substrate, the deposition process being not self-limiting;
TREATMENT STEP (b). treating the deposited thin films to attain a composited film;
REPEATING STEP (c). repeating step (a) and (b) until attain a desired film thickness.

In step (a) of the embodiment of the present invention described above, the deposition is not self-limiting and is a function of substrate temperature and process time. This first step is similar to a CVD process using a set of precursors. Deposition conditions are much simpler to achieve with less initial surface preparation and fewer special considerations, for example, as compared to ALD processes.

The Treatment Step (b) treats and modifies the film characteristics of the as-deposited films, for example, by modifying the film composition, by introducing or moving impurities from the deposited films, or by depositing another layer on the deposited film. The additional layer can react with the existing layer to form a compound layer, or can have a minimum reaction to form a nanolaminate film.

The repeating step (c) forms a cyclic process consisting of a sequence of thin film deposition (a) and treatment (b) steps to obtain a desired film characteristic, such as film stoichiometry.

In some embodiments, the deposition comprises introducing a first plurality of precursors to deposit a first film layer. The treatment comprises plasma treating the deposited first film layer to modify the film characteristics. The treatment can comprise one or more plasma treatment steps, with different reactive gas species. For example, a hydrogen-containing plasma treatment can be used to remove carbon impurity, followed by an oxygen plasma treatment to form an oxide compound. The process is then repeated to form a thin film having a desired stoichiometry.

In some embodiments, the deposition comprises a sequence of introducing a first plurality of precursors to deposit a first film layer, followed by introducing a second plurality of precursors to deposit a second film layer. The treatment can comprise one or more plasma treatment steps, with different reactive gas species to modify the characteristics of the two deposited layers. For example, the plasma treatment can form a stoichiometric compound layer of first and second layers. With the layer thicknesses optimized, e.g., by controlling the deposition step, the mixing of the first and second layers can be performed with any degree of mixing. For example, a stoichiometric compound layer, a graded compound layer, or a laminate of two layers can be achieved. The process is repeated to form a thin film having a desired stoichiometry.

In some embodiments, the deposition comprises a sequence of deposition and plasma treatment. For example, a first film layer is deposited followed by a plasma treatment. Then a second film layer is deposited, followed by a second plasma treatment. The first and second treatment can treat the individual layers, such as a hydrogen-containing plasma treatment can be used to remove carbon impurity of each individual layers. Alternatively, an oxygen-containing plasma treatment can be used to form oxide compound of each individual layers. Alternatively, different plasma treatment can be used for different layers, such as a first hydrogen-containing plasma treatment can be used to remove carbon impurity of first layer, and a second oxygen-containing plasma treatment can be used to form oxide compound of second layer. After the deposition, the layers are subjected to a plasma treatment. The treatment can comprise one or more plasma treatment steps, with different reactive gas species to modify the characteristics of the two deposited layers. For example, the plasma treatment can form a stoichiometric compound layer of first and second treated layers. For example, a stoichiometric compound layer, a graded compound layer, or a laminate of two layers can be achieved. The process is repeated to form a thin film having a desired stoichiometry.

Variations of the above process can be included, such as processes for depositing composite films of tertiary, quaternary, pentanary, and hexary stoichiometric films. For example, the inventive process can be used to fabricate high k dielectric films, ferroelectric films, piezoelectric films, and other complex oxides.

DETAILED DESCRIPTION OF THE INVENTION

Figure 1:
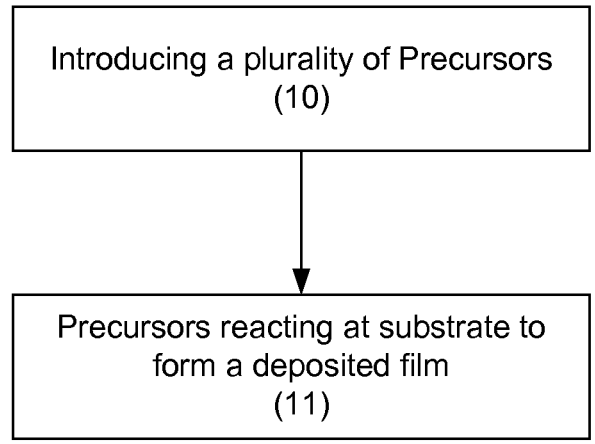
FIG. 1 is a flowchart of a prior art CVD process.

The present invention provides a hybrid deposition process of CVD and ALD, called NanoLayer Deposition (NLD). A co-pending application "Nanolayer thick film processing system and method" U.S. patent application Ser. No. 09/954, 244, filed Sep. 10, 2001 and published Mar. 13, 2003, Pub. No. 20030049375 A1, now U.S. Pat. No. 6,756,318, issued Jun. 29, 2004 has been disclosed and is hereby incorporated by reference in their entirety.

In one aspect of the invention, the present invention method to deposit a thin film on a substrate comprises the steps of:

DEPOSITION STEP (a). introducing a first plurality of precursors to deposit a thin film on a substrate, the deposition process being not self-limiting;

PURGING/
REPLACEMENT STEP (b). purging the first precursors; and

TREATMENT STEP (c). introducing a second plurality of precursors to modify the deposited thin film, the second plurality of precursors having at least one precursor different from the first plurality of precursors.

In step (a) of the embodiment of the present invention described above, the deposition is not self-limiting and is a function of substrate temperature and process time. This first step is similar to a CVD process using a first set of precursors. In Purging/Replacement Step (b), the first set of precursors is turned off and purged and a second set of precursors is introduced. The purpose of the purging step is to avoid the potential interactions between the two sets of precursors. The purging can be accomplished by a pumping step to evacuate the existing precursors in the process chamber. In these cases, the characteristic of the pumping step is a reduction in the chamber pressure to evacuate residual gases and vapors. Alternatively, the purging can also be accomplished by a replacement step by using a non reacting gas such as nitrogen or inert gas to assist in the removal of residual precursors from the process chamber. A characteristic of the replacement step is the maintaining of chamber pressure, with the first precursor gas turned off and the purge gas turned on. A combination of these two steps can also be used in the purging step, such as a pumping step followed by a nitrogen or argon replacement step.

The second set of precursors in Treatment Step (c) modifies the film characteristics of the as-deposited film. The second set of precursors can treat the deposited film by modifying the film composition, and by introducing or moving impurities from the deposited film. The second set of precursors can also deposit another layer on the deposited film. The additional layer can react with the existing layer to form a compound layer, or can have a minimum reaction to form a nanolaminate film. The deposition step is preferably a disordered film deposition, in contrast to an ordered film deposition as in an epitaxial film. Deposition conditions for disordered film deposition are much simpler to achieve with less initial surface preparation and fewer special considerations relating to the crystalline structure of the deposited films. In ordered film deposition, such as in epitaxial film deposition, small amounts of precursors are typically used to allow the precursors sufficient time to produce the desired crystalline structure.

The present NLD method to deposit a film differs markedly from CVD methods. For example, the present NLD method utilizes a cyclical, sequential process with the introduction of a second set of precursors. The present NLD method also differs from pulsed-CVD and sequential CVD with the introduction of a purging step, and with the introduction of the second set of precursors. The introduction of the second set of precursors after the purging step for the first precursors in a cyclic sequential process, allows for the modification of the deposited film in a manner not possible in CVD, pulsed-CVD, and sequential CVD methods.

The pulsed-CVD processes employing the pulsing of precursors to modify the film composition in such as way as to vary the gradient of the deposited films differs from the present invention NLD process because of the lacking of the second set of precursors to modify the properties of the deposited films.

The pulsed-CVD processes employing the pulsing of deposition precursors in the presence of plasma precursors, to modify the deposited film characteristics, differ from the present invention NLD process because of the lack of the purging step between the pulses, and because the plasma precursors are present throughout the deposition time. This pulsed-CVD process allows for the mixture of the continuous plasma precursors and the deposition precursors. The NLD process, however, provides a purging step between the two sets of precursors to avoid cross contamination and to avoid potential gas phase reactions. During the purging step, for example, residual MOCVD precursors can be removed from the chamber before igniting the plasma.

The pulsed-CVD processes employing the pulsing of plasma energy to modify the deposited film characteristics, differ from the present invention NLD process because of the lack of the second set of precursors to modify the properties of the deposited films and the lack of the purging step between the pulses. The pulsing feature in pulsed-CVD is used to optimize specific characteristics of the deposited films in the transient state instead of the steady state, and therefore, differs significantly from the present invention NLD method of using the second set of precursors to modify the deposited film characteristics.

The pulsed-CVD processes employing the pulsing of deposition precursors to form epitaxial films differ from the present invention NLD process because of the lacking of the purging step between the precursor pulses. The purging step allows for the use of incompatible precursors due to the temporal separation between the introduction of the first and second precursors. Differences between pulsed-CVD and NLD also include the conceptual purpose of the two methods. The objective of pulsed-CVD is to employ a suitable set of precursors and conditions to deposit the desired films, while the objective of NLD is to deposit a film, even an undesired film, and to provide a modification and treatment step to convert the undesired film into a desired film. Instead of finding a way to deposit a film with all the desired characteristics as in CVD or pulsed-CVD, NLD finds a way to treat or modify an existing film to achieve a film with the desired characteristics. Further, recognizing that treating and modifying of an existing film is difficult when the thickness is large, NLD offers a cyclic process of depositing and treating or modifying, so that the treatment process is performed on very thin films that are then built up in a sequence of deposition and treatment steps to achieve a thicker film. Specific motivations for first depositing an undesirable film, followed by a treatment step, include but are not limited to providing the desired film properties at lower temperatures than that which are required in pulsed-CVD, to improve the conformality and step coverage of the deposited films, and to increase the flexibility in creating and modifying film properties to produce a much wider range of potential film properties than those that are available using competing techniques.

The present NLD method to deposit a film also differs markedly from the ALD method in that the NLD method uses a non self-limiting deposition step. The deposition step in the present invention NLD method is a function of substrate temperature and process time. The deposition/adsorption step in an ALD process, however, is a self-limiting step based on the saturation of precursor ligands on the substrate surface. Once the surface is saturated, the deposition/adsorption in ALD method stops. Excess precursor vapors can no longer adsorb on the saturated surface. In other words, the deposition/adsorption step of ALD method is independent of time after reaching saturation. The ALD method also has less or no dependence on substrate temperature in comparison to CVD and NLD methods. The present invention NLD method, therefore, has many distinct differences from the ALD method.

In another aspect of the present invention, the method of deposition further comprises the addition of a purging/replacement Step d after Step c. Similar to the purging step that preceded Step c, the purging/replacement step that follows Step c is intended to remove residual second precursors from the process chamber, either by evacuation, by replacement, or by any combination of evacuation and replacement. In many applications, the treatment step can only treat a thin film, or the treatment step is much more effective in cases in which the deposited films are thin, and therefore, the present invention further comprises a further step of repeating steps a through c, or a through d in the case of having a second purging step, in a cyclic manner until a desired thickness is reached. The second purging Step d is optional because its purpose is to prevent possible reaction between the two sets of precursors. In cases in which the reactivity between the two precursors is low, the purging Step d can be eliminated to reduce the process time and increase throughput.

The present invention also provides for the extension to a plurality of additional sets of precursors and purging steps. A third set of reactive precursors introduced in a second treatment step, for example, would provide an additional treatment option to further modify the characteristics of the deposited films. In a simple case, for example, the substrate can be exposed to a first precursor containing aluminum at a temperature such that the deposition is not self-limiting to deposit a thin aluminum-containing film with as-yet undesirable film properties. This deposition step could then be followed by a treatment step in a nitrogen-containing plasma to modify the film properties to achieve a newly modified film with as-yet undesirable film properties, but with a combination of aluminum and nitrogen, and perhaps some impurities. This treatment step is then followed by a second treatment step in an oxygen-containing plasma to modify the film properties to achieve a newly modified film with constituent elements of aluminum, nitrogen, and oxygen with desired film properties.

The inventive process can be used to create a wide range of composite and nanolaminate films.

The present invention NLD process can be performed in any process chamber such as a standard CVD process chamber or an ALD small volume, fast switching valve process chamber. The chamber wall can be cold wall, or warm wall, or hot wall depending on the desired outputs. The delivery system can be showerhead delivery to provide uniform flow, or a sidewall inlet to provide laminar flow, or a shower ring to offer circular delivery. The precursor delivery can be liquid injection where the liquid precursors are delivered to a heated vaporizer to convert the precursors into vapor form before delivering into the process chamber. The precursor delivery can be vapor draw where the vapor of a liquid precursor is drawn from the liquid precursor container. The precursor delivery can be from a bubbler in which the vapor from the liquid precursor is enhanced with the bubbling feature of a non reactive carrier gas.

The steps in the present invention can be any CVD deposition step such as thermally activated CVD and plasma enhanced CVD. The plasma-enhanced CVD can use parallel plate plasma, capacitively-coupled plasma, inductively-coupled plasma (ICP), microwave plasma, downstream plasma, or remote plasma. Thermally activated plasma can use conventional resistive heating, rapid thermal processing using lamp heating, and other heating methods known and understood in the art. The deposition step can be a deposition step, and the treatment step can be a deposition step as well to modify the deposited film properties from the first step.

The treatment step can be a plasma treatment, or a temperature treatment. The plasma treatment can be an energetic species, and can be further enhanced with a bias to give kinetic energy to the energetic species. A strong bias can create reactions such as an ion implantation, as is observed in immersion ion implantation technology. In general, a highly energetic species in the treatment step can help in modifying the deposited film properties. Bombarding ionic species can be employed to improve the roughness of the deposited film, to modify the crystallinity, and to incorporate and remove impurities, for example. A chemical reaction can be employed in the treatment step to remove impurities, to change film compositions, and to modify the physical properties of the films, for example.

The present invention can use any CVD precursors or MOCVD precursors. The deposition step is further enhanced with the second set of precursors to allow for the fabrication of thin films with properties that are difficult or impossible to obtain with the CVD and ALD methods. Precursors used in NLD can be thermally activated, plasma activated, or rapid thermal processing activated. The precursors can be hydrogen, nitrogen, oxygen, ozone, inert gas, water, or inorganic precursors such as $NH_3$, $SiH_4$, $NF_3$, metal precursors such as $TiCl_4$, organic precursors, or metal organic precursors such as TDMAT, TDEAT, TMEAT, PDMAT, and PDEAT. This list is not intended to limit the scope of the invention but rather is presented as a representative example of some of the types of gases that can be used as precursors in the creation of NLD processes.

In general, the process temperature of the present invention is lower than the temperature of similar CVD processes to obtain reduced, yet more controllable deposition rates, and better uniformity. A typical process temperature is between 100 degrees Celsius and 1000 degrees Celsius, depending on the allowable thermal budget of the fabrication sequence and substrate. Metal interconnect and low-k (low dielectric constant) films often require process temperatures, for example, of less than 350-400 degrees Celsius, thus requiring the use of innovative processes that do not exceed these temperatures. Most device fabrication processes have limitations to the maximum temperature to which the substrate can be exposed at every step in the process. Innovative processes such as NLD, provide for deposition processes at lower temperatures, to produce the required film properties, that are not possible with higher temperature CVD processes.

The process times of the present invention, for each step in the sequence, is within the range of msec to many minutes.

During the treatment steps described in a typical NLD process, a plasma is often used to generate reactive species and to enable ion bombardment of ionic species to interact with the deposited film. To treat the sidewall surface of a high aspect ratio trench, a high density, high pressure plasma can be used. High density plasma can be accomplished with inductive coupling, capacitive-coupling, microwave, rf, or other techniques known in the art. High density plasma treatments can also be accomplished with using a remote plasma source.

FIG. 1 shows a flowchart of a prior art CVD process. In step 10, the precursors are introduced into the process chamber. The precursors react at the substrate surface to form a deposited film in step 11. The conditions for the precursors to react can include exposure to plasma energy, thermal energy, photon energy, and laser energy, for example. The CVD process is of a non self-limiting nature, meaning that the deposition thickness increases with process time and substrate temperature.

Figure 2:
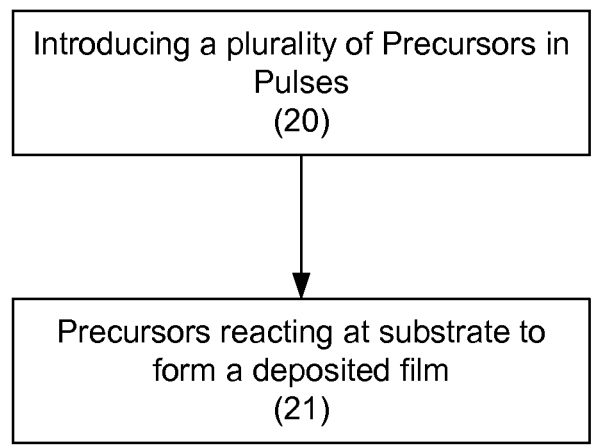
FIG. 2 is a flowchart of a prior art pulsed-CVD process.

FIG. 2 shows a flowchart of prior art for a pulsed-CVD process. In step 20, precursors are introduced into the process chamber in pulses. The precursors react at the substrate surface to form a deposited film in step 21. Similar to CVD processes, pulsed-CVD processes can incorporate plasma energy, thermal energy, photon energy, and laser energy, for example. The pulsed-CVD process conditions can include precursor pulsing, plasma pulsing, thermal energy pulsing, photon energy pulsing, and laser energy pulsing, for example. The pulsed-CVD process is a cyclical, repetitive CVD process with the characteristics of a transient CVD process as opposed to a steady state CVD process.

Figure 3:
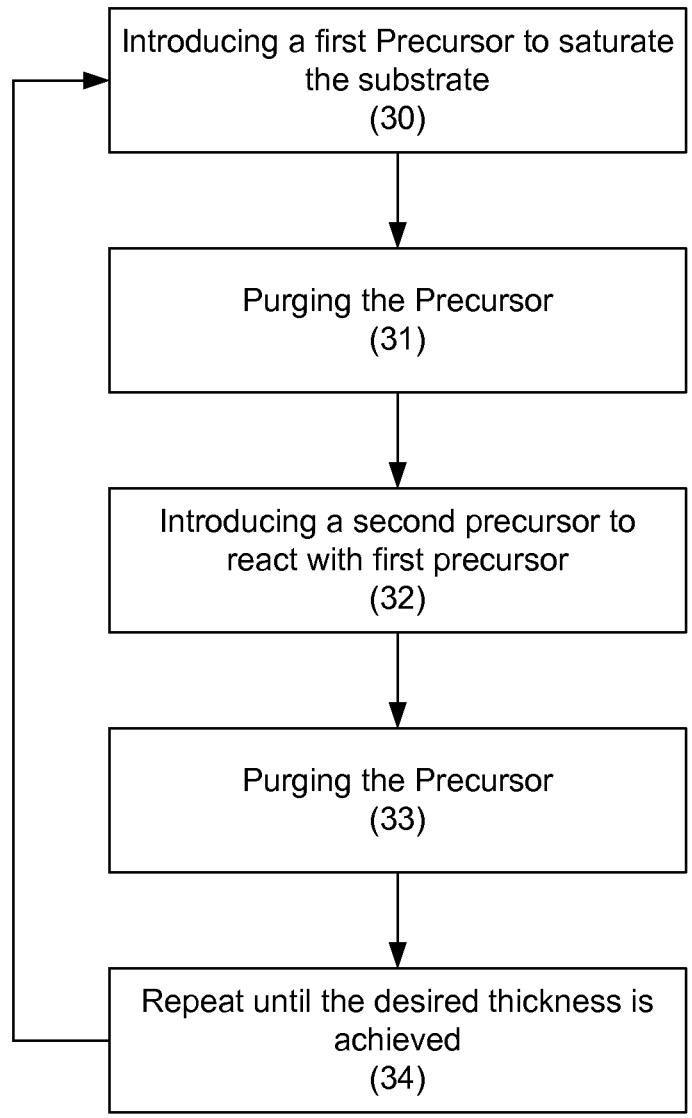
FIG. 3 is a flowchart of a prior art ALD process.

FIG. 3 shows a flowchart of a prior art ALD process. In step 30, a first set of precursors are introduced into the process chamber that are characteristically surface-saturating to coat the substrate surface in a self-limiting manner, and insensitive to process time and temperature. The first precursors are then purged from the process chamber in step 31. A second set of precursors is introduced into the process chamber in step 32 that is known to be chemically reactive to the first set of precursors. This second set of precursors reacts with the adsorbed first precursors on the substrate surface to form a sub-monolayer film. The second precursors are then purged from the process chamber in step 33. This purging of the second precursors in step 33 is optional. The cyclical sequence can be repeated in step 34 until a desired thickness is reached. The ALD process is characterized by the saturation of precursors in step 31, meaning the deposition or adsorption of precursors in this step is self-limiting, and is insensitive to process time and substrate temperature. Additionally, the two sets of precursors that react in step 32, after the introduction of the second set of precursors, react upon combination to create the desired compound on the substrate surface. The purging step 31 is required to separate the two sets of precursors, spatially and temporally, to prevent gas phase reaction and to preserve the surface reaction of ALD process.

Figure 4:
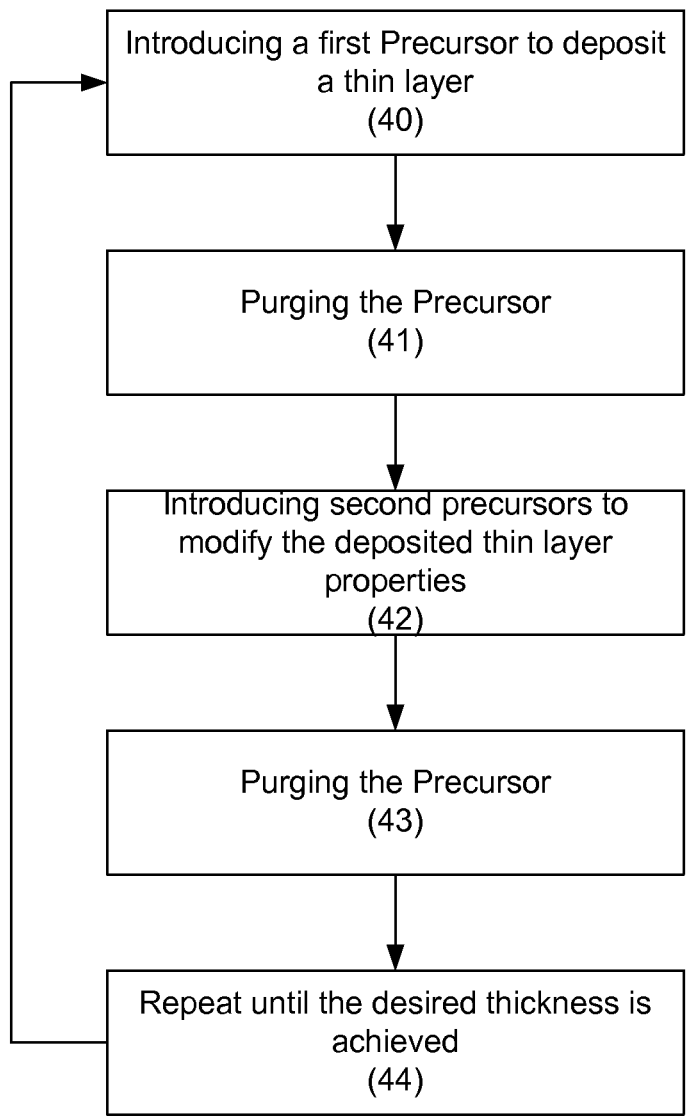
FIG. 4 is a flowchart of the NLD process with optional purge steps.

FIG. 4 shows a flowchart of the NLD process. In step 40, a first precursor, or set of precursors, is introduced into the process chamber to form a thin layer on the substrate surface. The first precursors, and byproducts from the deposition, are then purged from the process chamber in step 41. A second precursor, or set of precursors, that are typically activated with a power source to create a plasma, is introduced into the process chamber in step 42 to treat or modify the properties of the deposited layer. This second precursor, or second set of precursors, is evacuated or purged from the process chamber in step 43. This purging step 43 is optional. The sequence can be repeated in step 44 until a desired thickness is reached. The NLD process differs from ALD in that the deposition of the thin layer is non self-limiting in step 40, meaning the deposition of precursors in this step is dependent on the process time and substrate temperature. The two sets of precursors do not spontaneously react in step 42 as is the case when the two precursors are combined in ALD, but rather the second set of precursors in NLD, upon activation with a plasma source, or other energy source, react with the byproducts from the first precursor, or first set of precursors, that have formed a layer with less-than-desirable, intermediate film properties on the substrate after step 40. The modification step 42 is then used to modify or treat the as-deposited film to convert the film from a layer with less-than-desirable film properties to a film with desired film properties. The conversion from the undesirable film properties can improve the film density, change the film thickness, incorporate impurities, remove impurities, change the crystallinity of the film, modify the film composition, modify the stoichiometry, or change any other physical, electronic, magnetic, or other characteristic of the film. The purging step 41 is typically used to separate the first precursor, or first set of precursors, and the second precursor, or second set of precursors to prevent gas phase reactions, but purging step 41 may not always be required since the NLD process does not rely on a spontaneous reactions, or inter-reactions, between the two precursors, or sets of precursors.

Figure 5:
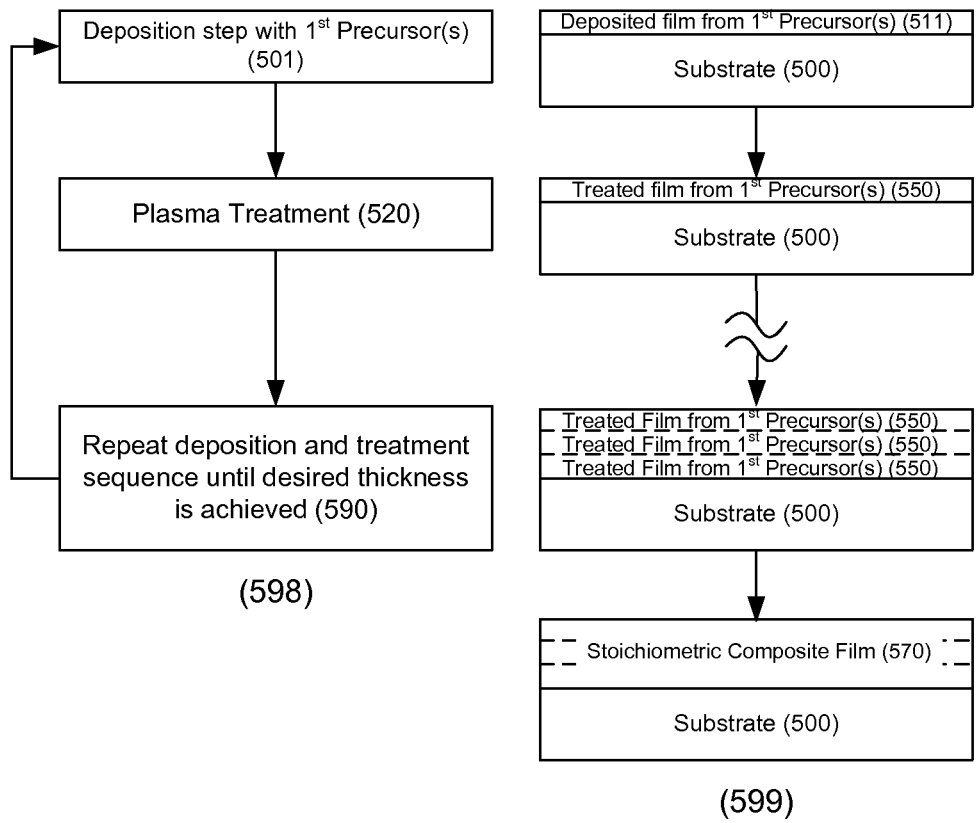
FIG. 5 is a flowchart for the NLD process with schematic of the growing film structure after three cycles.

FIG. 5 shows a flowchart of an NLD process sequence 598 with corresponding schematic of film growth sequence 599 on substrate 500. First deposition step 501 is the exposure of the substrate 500 to first precursors, or set of precursors, to deposit a layer 511. Layer 511 can be a continuous layer, or a discontinuous layer. The first deposition step can be a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The deposition step 501 is followed by plasma treatment 520 to modify the properties of the as-deposited layer 511 to produce the treated film 550. The modification step can change the film density, change the film thickness, incorporate impurities, remove impurities, change the crystallinity of the film, modify the film composition, modify the stoichiometry, or change any other physical, electronic, magnetic, or other characteristic of the film. After plasma treatment 520 to produce the treated layer 550, the process sequence used to produce the treated layer is repeated 590, in the simplest case, to build a stack of layers 550 on substrate 500 to produce stoichiometric composite film 570. As will be discussed, variations in the process sequence for the deposition step 501 and the treatment step 520 can be used to fabricate graded film structures.

Figure 6:
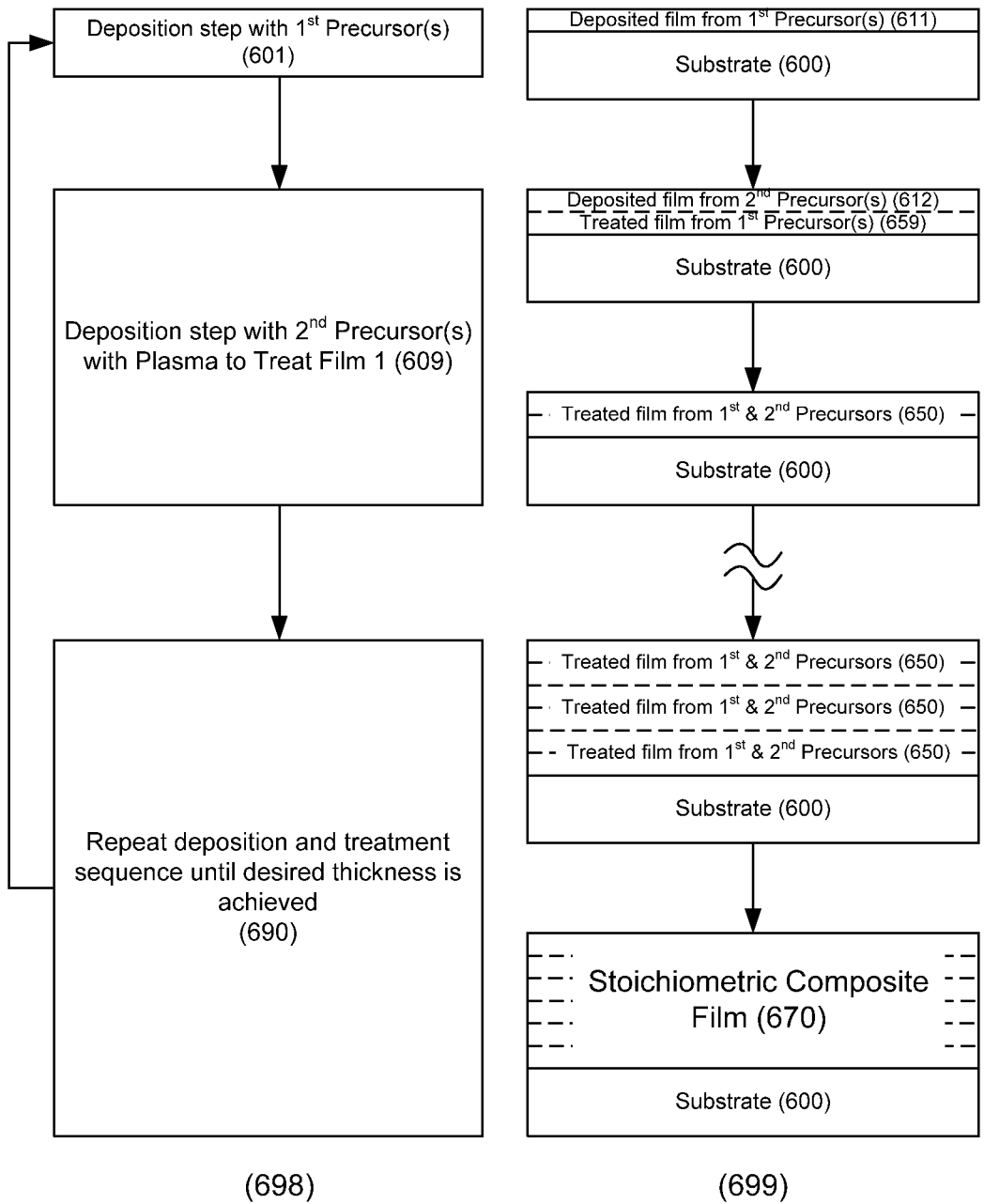
FIG. 6 is a flowchart for the present invention NLD process with two deposition steps; the second deposition step is used to deposit a second layer and to treat the first deposited layer.

FIG. 6 shows a flowchart of an NLD process sequence 698 with corresponding schematic of the film growth sequence 699 to illustrate an additional feature of NLD. In the NLD process sequence 698, the deposition with first precursors 601 is followed by a deposition step 609 that both deposits a film 612 and treats the film 611. Deposition step 609 modifies a property of layer 611 to produce a treated underlying film 659, and with the deposited film from the second precursors 609, produces a treated combination 650 of films 659 and 612. The use of the plasma treatment of the non-self-limited deposition in NLD, allows for modifications of deposited thin films 601 using a specific step as in treatment 520 shown in FIG. 5, and for the modifications of deposited films using treatments 609 that both deposit a layer 612 and treat previously deposited layers 611 to form treated layers 659, 650 in process sequence 698. Stoichiometric films are fabricated by repeating the deposition and treatment steps 690 to produce the film 670 with desired stoichiometry and film thickness.

The present NLD method to deposit a film differs significantly from CVD methods in that the NLD method introduces a cyclical process and a second precursor, or second set of precursors. The present NLD method differs from pulsed-CVD, or sequential CVD in that the NLD method introduces a purging step and a second precursor, or second set of precursors. The cyclic sequential deposition used in NLD with two precursors, or two sets of precursors with a purging step to separate the two precursors, or two sets of precursors, allows for the modification of the deposited film in a manner not possible in CVD and pulsed-CVD methods. The following examples discuss the advantages of NLD relative to CVD. In this section, the term CVD includes pulsed-CVD and sequential CVD methods.

Additionally, NLD offers the ability to build complex compound and nanolaminate film structures with a level of flexibility not available with CVD.

A typical CVD process is operated at a sufficiently high temperature to produce desired film properties, and for a sufficient duration to produce the desired film thickness. The uniformity and surface coverage of the CVD process would depend solely on the reaction mechanism of the chemical precursors and the initial substrate surface. In contrast, the NLD method provides a second set of precursors to modify the substrate surface characteristics during the deposition process, effectively providing a mechanism that allows for the cyclical re-conditioning of the surface to control the exposed surface properties, and to minimize variations in these properties over the course of the deposition. The NLD method provides greater control of the substrate surface properties during film growth to improve the surface coverage properties of the depositing films. An NLD silicon dioxide deposition using TEOS and oxygen as the first set of precursors and plasma argon, or plasma hydrogen, or plasma nitrogen as the second set of precursors offers improved uniformity and surface coverage for thin film growth over a CVD process that uses TEOS/oxygen mixture alone. Similarly, an NLD silicon nitride deposition process using silane/ammonia as a first set of precursors, and plasma argon, or plasma hydrogen, or plasma nitrogen as the second set of precursors, offers improved uniformity and surface coverage for thin film growth than a CVD process using a silane/ammonia mixture alone.

Another example of the benefits of NLD over CVD is the allowance for reduced process temperatures with the NLD processes. The substrate temperature in the CVD process is determined by the reaction mechanism necessary to provide an acceptable quality film. A small reduction in the process temperature in CVD processes could significantly alter the deposited film properties through incomplete reactions, impurity incorporation, and changes in stoichiometry. In contrast, the present invention NLD method allows for operation at lower temperatures than CVD, without a compromise in film quality, through the ability to modify the deposited film with secondary treatment processes that can convert non-ideal, as-deposited films to higher quality films at lower temperatures than that which can be achieved with CVD. The distinction of lower temperature processing with the NLD method, in comparison to the CVD method, for the same set of first precursors sets apart the NLD process as an enabling technology over conventional CVD methods. Since the deposition steps in both NLD and CVD depend on the substrate temperature, the lower substrate temperature in the NLD method also provides better control of the film properties because of the reduced deposition rate.

Another example of the benefits of NLD over CVD is the allowance for a method to densify the deposited film. In the CVD method, a full thickness of a film is typically deposited, and then subjected to a secondary treatment such as annealing. The secondary process can take more time, and is often less effective, for thick films relative to thin films. A 1 micron thick film, for example, is likely to be less affected by an annealing step than a film that is 0.5 microns in thickness for the same annealing treatment time. In contrast, the deposition of thin layers in an NLD process, followed by in situ treatment steps, provides for a cyclical method of depositing and treating, for which a small fraction of the overall film thickness is deposited and modified for each cycle in the process. The thinner layers can allow for more direct and effective treatments than that which can be provided with secondary treatments after deposition of the overall film thickness. Out-diffusion of undesirable impurities can also take considerably more time in thick films deposited by CVD.

Another example of the benefits of NLD over CVD is the capability for modifying the composition and stoichiometry of a layer during film growth. Residual carbon, for example, can be removed from a layer that was deposited from a metalo-organic precursor during each cycle in the NLD process during the treatment steps. In CVD, a thick film is typically deposited that contains a certain amount of carbon, depending on the process temperature and deposition conditions. The completed film is then subjected to an energetic species such as plasma ionized hydrogen to react with the carbon and to remove the carbon from the deposited film. For thick films, highly energetic species are needed to treat the full film thickness, and in many cases is impractical and can potentially cause damage to the deposited film, or the underlying substrate. In contrast, the present invention NLD method offers the cyclic sequential method of deposition and carbon removal treatment of a small fraction of the whole film during each cycle of the cyclical NLD process. Since the layer to be treated is much thinner than the overall film thickness, and can be chosen as thin as one desires, the energy of the energetic species can be low and within the range of practicality, to remove the carbon and not damage the deposited film, or the underlying substrate.

Another example of the benefits of NLD over CVD is the potential to eliminate gas phase reactions. In the deposition of TiN using TDMAT (tetra dimethyl amine titanium) metal organic precursor with $NH_3$, for example, the CVD method would be impractical since TDMAT reacts with $NH_3$ in the gas phase to create particles and roughen the deposited film. A CVD deposition of an entire film using TDMAT, followed by a treatment NH3 to modify the film properties would not be possible to treat the whole film thickness. In contrast, the present invention NLD method offers the cyclic sequential method of depositing using TDMAT and NH3 treatment of a small fraction of the targeted film thickness. With a deposited film thickness of TDMAT of less than a few nanometer (1-2 nm), a treatment with NH3, or N2, or a N2/H2 mixture, for example, is practical and effective for creating high quality titanium nitride films. Similar processes and results can be expected and obtained from first precursors, or sets of precursors, from an exemplary list of TDEAT, TMEAT, for other titanium-containing metallo-organic precursors, PDMAT, PDEAT for other tantalum-containing metallo-organic precursors, for other metallo-organic metal precursors containing copper, such as Cu (hfac) (tmvs), and inorganic copper-containing precursors such as Cu hfac (I), Cu hfac (II), copper iodine, copper chloride, and for inorganic titanium-containing precursors such as titanium chloride. Suitable secondary precursors, or sets of precursors, might include for example, plasma treatments with N2, H2, Ar, He, NH3, or mixtures of these and other gases.

Another example of the benefits of NLD over CVD is the potential to modify and control the stoichiometry of a deposited film during the film growth. Examples of films that might be deposited using NLD over conventional CVD are oxygen-rich films, nitrogen-rich films, oxy-nitride films, and metal-rich films. To vary the content of any component in a deposited film, such as oxygen for example, CVD method would require the adjustment of all of the precursor components. This is not an easy task since the incorporation of a element is not directly proportional to its presence in the precursor vapor form. In many cases, control of the content of films deposited by CVD may not be possible since these films are a product of a chemical reaction, and excess precursors do not generally participate in the reaction. In contrast, the present invention NLD method offers the cyclic sequential method of depositing and treating of a small fraction of the overall targeted film thickness. The treatment step is separate from the deposition step, and can be designed to achieve specific compounds or stoichiometric compositions in the resulting films. If an oxygen-rich film is desired, for example, an energetic oxygen treatment step, such as a plasma oxygen, or an ozone treatment, could be used to incorporate higher levels of oxygen than that which would otherwise have been incorporated into the deposited film. The incorporation of additional oxygen can be done if the deposited film is thin enough, a condition available in the present invention NLD method, but not with CVD. If a nitrogen-rich film is desired, an energetic nitrogen treatment step such as a plasma nitrogen, or an ammonia (NH3) flow, could incorporate additional nitrogen into the deposited film than that which otherwise would have been incorporated. If an oxy-nitride film is desired, an energetic oxygen treatment step could be used to incorporate additional oxygen into a deposited nitride film, for example, or an energetic nitrogen treatment step could be used to incorporate additional nitrogen into the deposited oxide film.

The NLD method provides a high level of flexibility in adjusting the stoichiometry of a deposited film over conventional CVD and other deposition methods, and this flexibility is provided throughout the deposition of the film.

Another example of the benefits of NLD over CVD is the potential to incorporate impurities into the growing film to modify one or more of the properties of the deposited film. Examples of impurity incorporation in films grown by the NLD method include copper doping of aluminum film, carbon doping of silicon dioxide films, and fluorine doping of silicon dioxide films. The electromigration resistance of pure aluminum is much poorer than in aluminum films that contain small amounts of copper, typically of less than a few percent. The ability to accomplish this task with CVD would require a combination of compatible precursors of aluminum and copper that can deposit the desired mixture. In contrast, the present invention NLD method offers the cyclic sequential method of depositing a fraction of the aluminum film, followed by a deposition step to incorporate copper into the fractional film thickness during the treatment step. In this example, the aluminum is introduced during the first deposition step from an aluminum-containing precursor, and the copper is introduced from a copper-containing precursor during the treatment step, that is a combination of a treatment and deposition step, resulting in a high level of control in the creation of the resulting aluminum/copper alloys. The separate and sequential introduction of the aluminum and the copper precursors provides is not available in CVD. Similar results and flexibility can be achieved with carbon-doping of silicon dioxide and fluorine-doping of silicon dioxide, among many other examples.

Another example of the benefits of NLD over CVD is the ability to fabricate multilayer film stacks, films with complex stoichiometries, and nanolaminate films. Nanolaminate films are multilayer films but the layers can be very thin in some cases, sometimes incomplete layers, and sometimes even less than a monolayer. A CVD method would be impractical as it requires multiple process chambers and the capability for moving between these chambers without incurring contamination and impurities. In contrast, the present invention NLD method offers the cyclic sequential method of depositing a first layer film, followed by the deposition of a second layer film during the treatment sequence. The first layer could be as thin as a fraction of a monolayer, or thick, with many monolayers. This is also true for the second and subsequent layers.

The present NLD method to deposit a film also differs significantly from ALD method in that the present NLD method has a non self-limiting deposition step. The deposition rates in the deposition steps in the present invention NLD method are dependent on the substrate temperature and process time, unlike ALD processes. In ALD, the rate of adsorption of precursors is self-limiting, based on the saturation of precursor ligands on the substrate surface. After a brief exposure of the substrate to the gaseous precursor in an ALD process, the surface becomes saturated and the deposition stops, and any excess precursor vapor has no further effect on contributing to the thickening of the layer deposited on the substrate. In other words, the adsorption or deposition step of the ALD method is independent of time after reaching saturation. The ALD method also has less dependent on substrate temperature than CVD or NLD methods. Therefore the present invention NLD method has distinct differences from the ALD method.

The non self-limiting feature of the present invention NLD method allows for the use of CVD and metallo-organic CVD precursors, commonly used in the CVD method. The range of precursors available for ALD, in contrast, is limited since ALD precursors must exhibit saturating and self-limiting characteristics to provide ALD-like adsorption, to deposit thin layers up to a monolayer in thickness. The differing deposition behaviors between ALD and NLD limit the availability of precursors for the ALD method, and broaden the range of precursors available for the NLD method, to the extent that all CVD and Metallo-organic CVD precursors can be utilized in NLD. The self limiting adsorption of ALD allows for the maximum of a monolayer to be deposited in each deposition cycle. Further exposure of the substrate to conditions that will result in the saturation of the surface with ALD precursors does not result in additional precursor being deposited.

The precursor designed for ALD must readily adsorb at bonding sites on the deposited surface in a self-limiting mode. Once adsorbed, the precursor must react with the second ALD precursor, sometimes referred to as the reactant, to form the desired film.

The requirements for ALD differ from CVD, for which precursors arrive at the substrate simultaneously, resulting in a continuous deposition of film from the reaction of the precursors at the substrate surface. Many useful CVD precursors are not viable as ALD precursors and vice versa. The selection of precursors for the ALD method is not trivial or obvious. The ALD process requires a matched pair of precursors, the first to saturate the surface and the second to react to form the targeted film. An example of a matched set of ALD precursors, studied extensively in the literature is trimethyl-aluminum and water.

Another example of the benefits of NLD over ALD is the ease of incorporation of techniques that have been developed in the art to enhance the CVD technology, such as plasma technology and rapid thermal processing technology, that can be incorporated into NLD. By sharing precursors with CVD, these techniques can be implemented into the NLD method as well. A plasma deposition step in NLD can be designed and tested quickly because of the available knowledge base in CVD methods.

Another example of the benefits of NLD over ALD is the relative insensitivity to surface conditions in NLD. In any deposition technology, nucleation and film growth can be significantly affected by the cleanliness of the substrate surface. Surface preparation techniques can lead to differences in film quality and film properties.

As a consequence of the differing deposition mechanisms of NLD and ALD, the NLD process is less sensitive than ALD. In ALD, the substrate and substrate preparation are very critical due to the molecular bonding of the ALD precursors with surface sites on the exposed substrate. Small variations in surface cleanliness or surface preparation can lead to large differences in film quality and film properties in ALD.

In contrast, NLD processes are less sensitive to the surface preparation because the deposition method proceeds as a decomposition of molecules in the gas phase in the vicinity of the substrate surface in NLD processes, and depend largely on the reaction of precursors in the gas flow and the temperature of the surface. Similar deposition processes can occur over a wide range of surfaces and surface preparations. Nucleation times in NLD processes are subject to vary since different surfaces have different times for the precursors to nucleate and start depositing.

Variations in nucleation times have been observed in our laboratory when depositing TiN using NLD processes on different substrates: a silicon dioxide substrate, an organic polymer substrate, and a porous dielectric substrate. The TiN films on these three different substrates have similar film quality and properties, with differences only in film thickness, due to the difference in nucleation times on the various surfaces.

The deposition of epitaxial films also requires intensive preparation of the substrate so that the first layer of deposited atoms grows epitaxially, or in an ordered arrangement consistent with the substrate crystal.

The NLD process of non-epitaxial films allows conformal deposition or highly uniform coverage of a thin film over vias and trenches, and especially high aspect ratio structures in semiconductor devices.

Another example of the benefits of NLD over ALD is the ability to use MOCVD precursors. The MOCVD precursors contain a significant amount of carbon. The present invention NLD process can use MOCVD precursors to deposit thin layers with carbon impurities that are then removed in subsequent treatment steps. An effective carbon removal step, for example, might use ionized hydrogen or nitrogen, such as plasma hydrogen or nitrogen.

Another example of the benefits of NLD over ALD is the non self-limiting behavior of the present invention NLD method. This non self-limiting behavior allows for the adjustment of the thickness of the deposited layer to achieve a higher thickness per cycle. The ALD method is based on the saturation of ligands on the substrate surface, and therefore the deposited film thickness per cycle and cannot exceed a monolayer for each deposition cycle. In contrast, the thickness per cycle in the present invention NLD method is a function of process temperature and process time. As the deposition time is increased, or the deposition temperature is increased, the thickness of the deposited layer also increases.

The optimum thickness for an NLD process cycle is the largest thickness per cycle that can be treated during the associated treatment step, or treatment steps. An NLD process, for example, that deposits TiN using TDMAT precursor and plasma nitrogen treatment can generally have a thickness per cycle from less than a nanometer to a few nanometers. The ultimate thickness depends largely on the efficacy of the treatment cycles. The use of high density plasma and substrate biasing in the treatment steps can lead to more effective film modification than low density, unbiased treatments, for example. The ability to vary the thickness per cycle allows the NLD process to use fewer cycles for the same total film thickness, leading to a faster process time and offering higher potential throughput than ALD processing.

Another example of the benefits of NLD over ALD is that the non self-limiting feature of the present invention NLD method also allows the NLD method to vary the individual deposited layers throughout the thickness of the resulting film. An application, for example, that requires higher film quality at the interfaces than in the bulk, will benefit from having the ability to deposit very high quality layers at the top and bottom of the film stack and lower quality films, presumably deposited at a higher deposition rate or lower treatment time per cycle, in the intermediate layers. This flexibility is not possible with ALD.

Another example of the benefits of NLD over ALD is in the dependence of the NLD process on time and substrate temperature. With this dependence is the ability to operate at a higher temperature, and the ability to vary the deposition thickness and to deposit a greater thickness per cycle.

The change in substrate temperature is probably best accomplished by rapid thermal processing using radiative heat transfer for rapid response time. Alternatively, a resistive heated substrate could provide the baseline temperature, and lamp heating could provide the increase in temperature needed for increased thickness per cycle.

Conversely, the ALD process temperature is largely fixed by the chemical reactions between the ligands of the precursors, and therefore, the ALD method is insensitive to the substrate temperature.

Another example of the benefits of NLD over ALD is the reduced sensitivity of the NLD process to purging steps between the deposition and treatment steps in the present invention NLD method. This insensitivity arises for many processes because of the lack of reactivity between the CVD or MOCVD first precursors and the second precursors used in the NLD process. In cases in which the sets of precursors are compatible, the purging steps in the NLD process may not be required, and may be reduced or eliminated to improve the throughput of the process. The purging steps in the NLD method are beneficial in cases in which the precursors are spontaneously reactive, as in ALD. In contrast, the ALD method requires a purging step between these two steps because the designed reaction is intended to be restricted to the substrate surface, and without the purging steps, undesirable reactions can occur elsewhere in the process chamber.

Another example of the benefits of NLD over ALD is in the controllability of surface coverage. The ALD method has excellent conformality and surface coverage, with the capability to provide equal step coverage at the tops and bottoms of high aspect ratio trench and via features. The ALD technique, however, cannot be used to produce step coverage that deviate from equal step coverage at the tops and bottoms of trench and via structures. The conformal nature of the ALD process is a characteristic of the ALD method and is not a tunable feature.

In contrast, in the present invention NLD, the step coverage characteristics can be modified by varying the thickness per cycle, by varying the deposition temperature, and potentially by varying other process parameters. Because the deposition step in NLD is based on CVD, the thinner the thickness per cycle in NLD, the higher the step coverage (the ratio of the thickness at the top of a feature relative to the bottom of a feature.) This degree of control offers NLD an advantage in depositions on porous substrates, for example. ALD deposition on an open-pored, porous substrate will travel through all the pores and deposit everywhere, potentially shorting the circuit if the deposited film is conductive. In contrast, the NLD method can deliver a very high deposition rate at the beginning of the deposition cycle, effectively sealing the open pores before starting deposition of a high quality thin conformal film. By starting an NLD process with conditions that produce low step coverage, the degree of penetration into porous material is significantly less than in the ALD method.

Another example of the benefits of NLD over ALD is the flexibility of the chamber design.

In ALD, the throughput is largely dependent on the cycle time due to the lack of dependence of the deposited thickness per cycle. The chamber design volume must be minimized, to enable rapid cycling and purging of precursors and to achieve an acceptable throughput with a practical pumping package. Fast switching valves are also required to ensure quick response times for precursor delivery and the synchronization of the precursor flows and the purging steps.

In contrast, in the present invention NLD method, the chamber design issues are not as critical because of the potential higher thickness per cycle feature, leading to fewer cycles and potentially higher throughput. A conventional CVD chamber with large volume and slow valve response time is often adequate to perform NLD processing for many applications although the NLD process could benefit from many of the features of advanced ALD chamber designs.

The increased level of flexibility available with NLD allows for tradeoffs in throughput versus tool complexity that are not readily available with ALD.

An example of an advantage in the flexibility in chamber design that can be observed with NLD is the ease with which a high density plasma source can be integrated into the NLD process flow. High density plasma designs often require large chamber volumes to equalize the energy of the charged and neutral particles. This relaxation in the volume requirement for NLD can be contrasted with the small chamber volume requirement of ALD processing.

Deposition of Composite Films

The versatility of the NLD process provides for the ability to create complex stoichiometric films. Variations of the inventive method applied specifically to the fabrication of complex stoichiometric films are described. p For the deposition of composite films using three or more elements in the growing film, in the simplest case for example, multiple precursors can be combined in a first deposition step to deposit a thick film, which is then treated with one or more plasma treatment steps to convert the as-deposited film to a film with the desired film properties. The multiple precursors can be combined in a single deposition step or set of steps, which is then followed by a treatment step, or the multiple precursors can be combined in a sequence of individual deposition steps, each followed by a treatment step, or some of the multiple precursors can be combined in a single deposition, followed by a treatment step, and others with a sequence of individual deposition steps followed by a deposition step. In these latter two cases, the individual deposition steps can be used to deposit the required stoichiometric fraction of one or more elements. In these latter two cases, the order with which the steps are executed can be reversed or interchanged so long as the net result is to produce a favorable stoichiometric mix for the compound film.

Using the inventive method described in the following paragraphs, compound films with two (binary), three (tertiary), four (quaternary), five (pentary), six (hexary), elements, or more can be formed. Although most films used in practice fall within the range of 1-6 elements, the inventive technique can be extended beyond the methods described to produce compound films with more than six elements.

Figure 7:
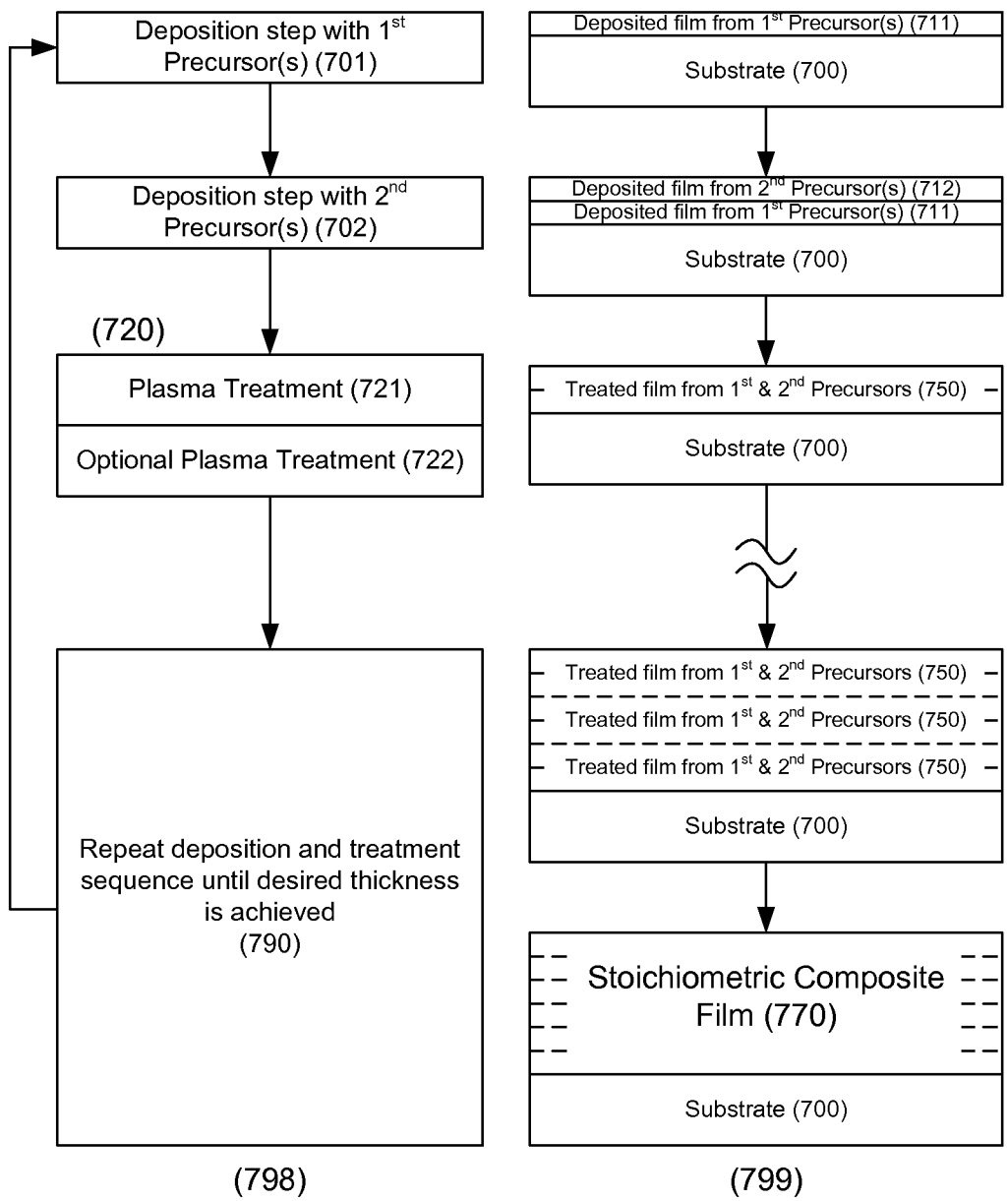
FIG. 7 is a flowchart for the present invention NLD process with two deposition steps, followed by a treatment step, or combination of treatment steps.

FIG. 7 shows a flowchart of an NLD process sequence 798 with corresponding schematic of film growth sequence 799 on substrate 700. First deposition step 701 is the exposure of the substrate 700 to a first precursor, or set of precursors, to deposit layer 711. The deposition step 701 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

In the embodiment illustrated in FIG. 7, the deposition step 701 in embodiment 798 with the first precursor, or set of precursors is followed by a second deposition step 702 that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

In the embodiment illustrated in FIG. 7, the second deposition step 702 produces the deposited layer 712 above the deposited film 711 from the first precursor. Some modifications to the properties of the layer 711 may occur as a result of the exposure to the deposition step 712, relative to the as-deposited film, and remain within the scope of the current invention. Following film deposition 702 from the second set of precursors is the plasma treatment 720 to produce treated film 750. The plasma treatment 720 can be a single step 721 or multiple steps 721-722. The plasma treatment 720 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 700. Similarly, plasma treatment 721 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 700. Similarly, plasma treatment 722 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 700. The plasma treatment 720, or combination of plasma treatments 720, modifies the properties of the deposited layers 711, 712 to produce treated stoichiometric layer 750, a combination of the elements from the deposition steps 701-702, and from the plasma treatment(s) 720. The modification step can change the film density, change the film thickness, incorporate impurities, remove impurities, change the crystallinity of the film, modify the film composition, modify the stoichiometry, or change any other physical, electronic, magnetic, or other characteristic of the film.

After the first deposited and treated layer 750 is formed, the process of depositing and treating is repeated 790 to produce a stoichiometric composite film 770, a composition of multiple layers of treated films 750. Variations in the process sequence for the deposition step 701 and the treatment step 720 also can be implemented in the inventive process to produce graded film structures in which the properties in the stack of the thin films 750 used to produce the stoichiometric composite film 770 are varied throughout the sequence of repeated depositions and treatments 790.

In the embodiments described, the term layer and film are used interchangeably. Also, a film or layer need not provide complete coverage over the substrate below or the underlying materials. A layer or film, in the context of the description provided for the inventive process, may be a partial layer, for example, or a continuous layer. For some depositions used in the inventive process, the application of a partial layer or film may be necessary to create desired or intended stoichiometries from the inventive method.

Figure 8:
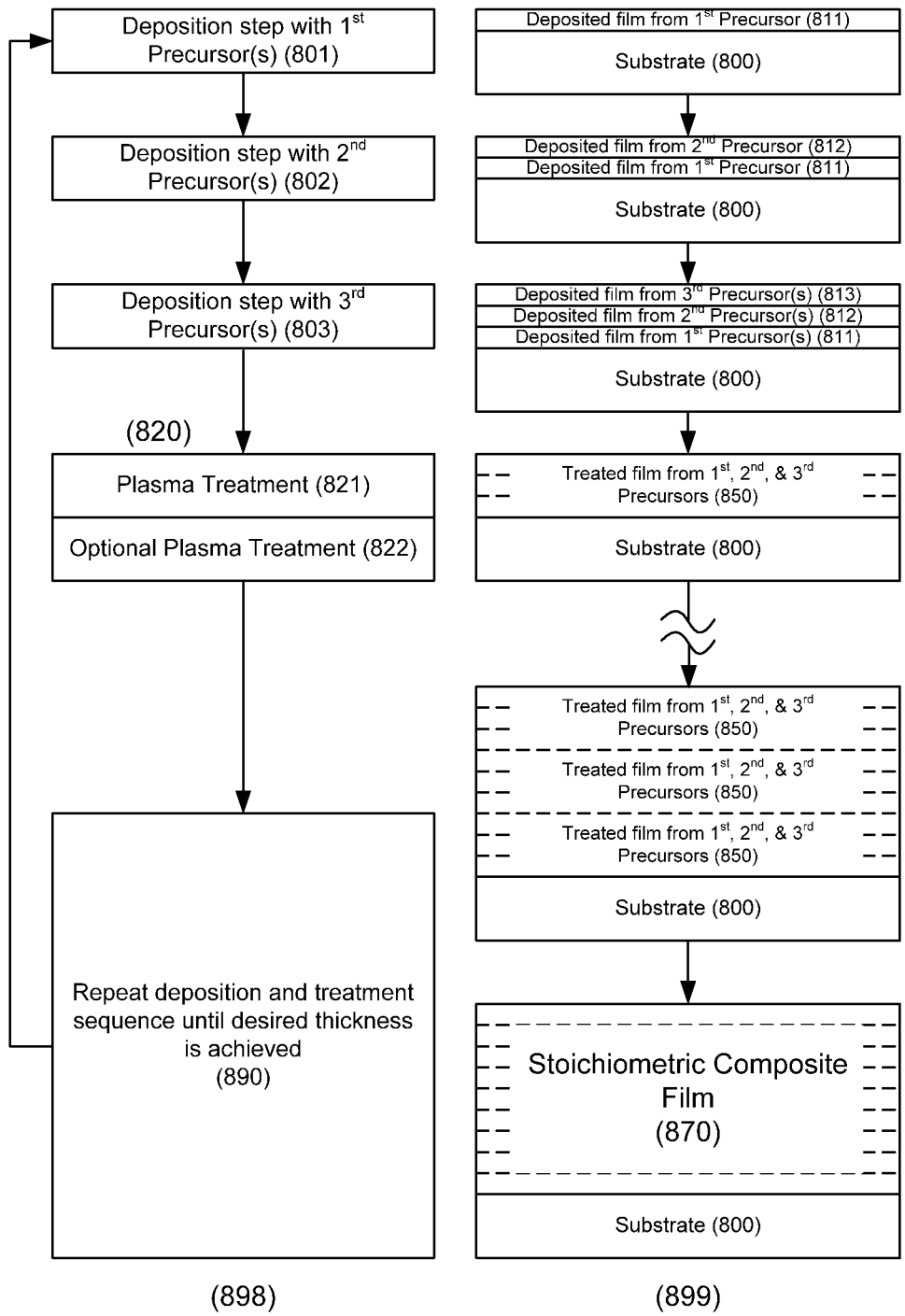
FIG. 8 is a flowchart for the present invention NLD process with three deposition steps, followed by a treatment step, or combination of treatment steps.

FIG. 8 shows a flowchart of an NLD process sequence 898 with corresponding schematic of film growth sequence 899 on substrate 800. Deposition step 801 is the exposure of the substrate 800 to a first precursor, or set of precursors, to deposit a layer 811. The deposition step from the first precursor(s) 801 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

In the embodiment 898, the deposition step 801 with the first set of precursors is followed by a deposition step 802 with a second set of precursors. Deposition step 802 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The second deposition step 802 produces the deposited layer or film 812 in embodiment 899 on the deposited film 811. Some modifications to the properties of the layer 811 may occur as a result of the exposure to the deposition step 812, relative to the as-deposited film, and remain within the scope of the current invention.

In the embodiment, 898, the deposition steps 801 and 802 are followed by a deposition step 803 with a third set of precursors. The third deposition step 803 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The third deposition step 803 produces the deposited layer 813 on the deposited film 812 as illustrated in diagram 899 in FIG. 8. Some modifications to the properties of the layer 812 may occur as a result of the deposition step 813, relative to the as-deposited film, and remain within the scope of the current invention.

Following film deposition 803 from the third set of precursors is the plasma treatment 820 to produce treated film 850. The plasma treatment 820 can be a single step 821 or multiple steps 822. The plasma treatment 820 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 800. Similarly, plasma treatment 821 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 800. Similarly, plasma treatment 822 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 800. The plasma treatment 820, or combination of plasma treatments 820, modifies the properties of the deposited layers 811-813 to produce treated stoichiometric layer 850, a combination of elements from the deposition steps 801-803, and from the plasma treatment(s) 820. The treatment step 820 can modify the property of the as-deposited layers 811-813 to create the treated film 850 by changing the film density, by changing the film thickness, by incorporating impurities, by removing impurities, by changing the crystallinity of the film, by modifying the film composition, by modifying the stoichiometry, or by changing any other physical, electronic, magnetic, or other characteristic of the film.

After the first deposited and treated layer 850 is formed, the process of depositing and treating is repeated 890 to produce a stoichiometric composite film 870, a composition of multiple layers of treated films 850. Variations in the process sequence for the deposition steps 801-803 and the treatment step 820 also can be implemented in the inventive process to produce graded film structures in which the properties in the stack of the thin films 850 used to produce the stoichiometric composite film 870 are varied throughout the sequence of repeated depositions and treatments 890.

As an example, which by no way is intended to limit the scope of the inventive method, the deposition of the quaternary film, Ba—Sr—Ti—O, is presented. In a first example of a process using the inventive method to produce a quaternary film with the elements of Ba—Sr—Ti—O, a first precursor, or set of precursors, is used to provide a deposition step 801 to deposit a thin layer 811, or partial layer that contains the element barium (Ba), followed by the deposition step 802 to deposit a thin layer 812 from a second precursor, or second set of precursors, to produce a thin film 812 containing Strontium (Sr), followed by the deposition step 803 to deposit a thin layer 813 from a third precursor, or set of precursors, of a thin film containing the titanium (Ti), followed by a treatment step 820 using an oxygen-containing plasma to convert the deposited layers to a film 850 with the desired properties that might include one or more or total film thickness, stoichiometry, density, crystallinity, and impurity level. The combination of the deposition steps and treatment steps, in this example, and any purge steps that are incorporated into the process between one or more of these deposition and treatment steps, constitutes one cycle of the cyclical NLD process 898. This one cycle is repeated 890, in this example, until the desired film thickness is achieved. Although not a requirement, the temperature of the electrode upon which the substrate is resting during the process, is maintained at a constant temperature. The thicknesses of the deposited layers 811-813, and the resulting percentage of the various elements in the growing film 870 can be adjusted by varying the duration or other process condition of the deposition steps 801-803. In the case of a Ba—Sr—Ti—O compound used as a high-k dielectric film, the following stoichiometric ratio might be used: $Ba_2SrTi_3O_9$. To create a film with this stoichiometry, assuming the simplest case in which the deposition rates are the same for the Ba, Sr, and Ti precursors, the duration in time for the steps 801, 802, 803 for a single NLD cycle should deposit the elements in a ratio of Ba:Sr:Ti of 2:1:3. In this simple example, the barium step 801 should be twice the duration of the Sr step 802, and ⅔ that of the titanium deposition step 803. This case is provided for example only as the deposition rates of the precursors for the three elements are likely to vary. Some adjustment to the durations of each of the steps 801-803 may be required to account for other effects such as variations in temperature, deposition rates, decomposition efficiency, loss of targeted elements during treatment steps 720, and other effects. In this case, the oxygen is provided from the oxygen-containing plasma during the treatment step 822 and the incorporation of the oxygen will not occur in the same manner as in the deposition steps 801-803. The incorporation of oxygen into the growing film 850 will depend on the duration and process conditions used in the treatment step 820.

The above example is provided for example only, and is not intended to limit the scope of the inventive process. Many variations to the Ba—Sr—Ti—O example are possible that remain within the scope of the current invention.

In the above example, the temperature was assumed to be constant throughout the deposition steps 801-803. This restriction is not a requirement and adjustments from step-to-step in the cycle remain within the scope of the process. Adjustments to the temperature might be accomplished quite rapidly with the application of photon energy from a light source behind the wafer, for example, that would allow for rapid changes in substrate temperature. Adjustments to the substrate temperature might be preferred for one or more of adjusting the deposition rate, reducing or increasing the level of impurities in the individual deposited layers, and improving the efficacy of the treatment step 820, among others.

Means other than adjusting the duration of the deposition step 801-803 and the temperature might be used to modify the stoichiometry of the growing film 870. Any process parameter, such as pressure, precursor gas flow rate, precursor vaporization temperature, carrier gas flow rate and species for cases in which a carrier gas is combined with the precursor, plasma power for cases in which plasma enhancement is used during the deposition steps, can be used to adjust the amount of a particular element that is deposited during the deposition steps 801-803 of the NLD process 898.

Figure 9:
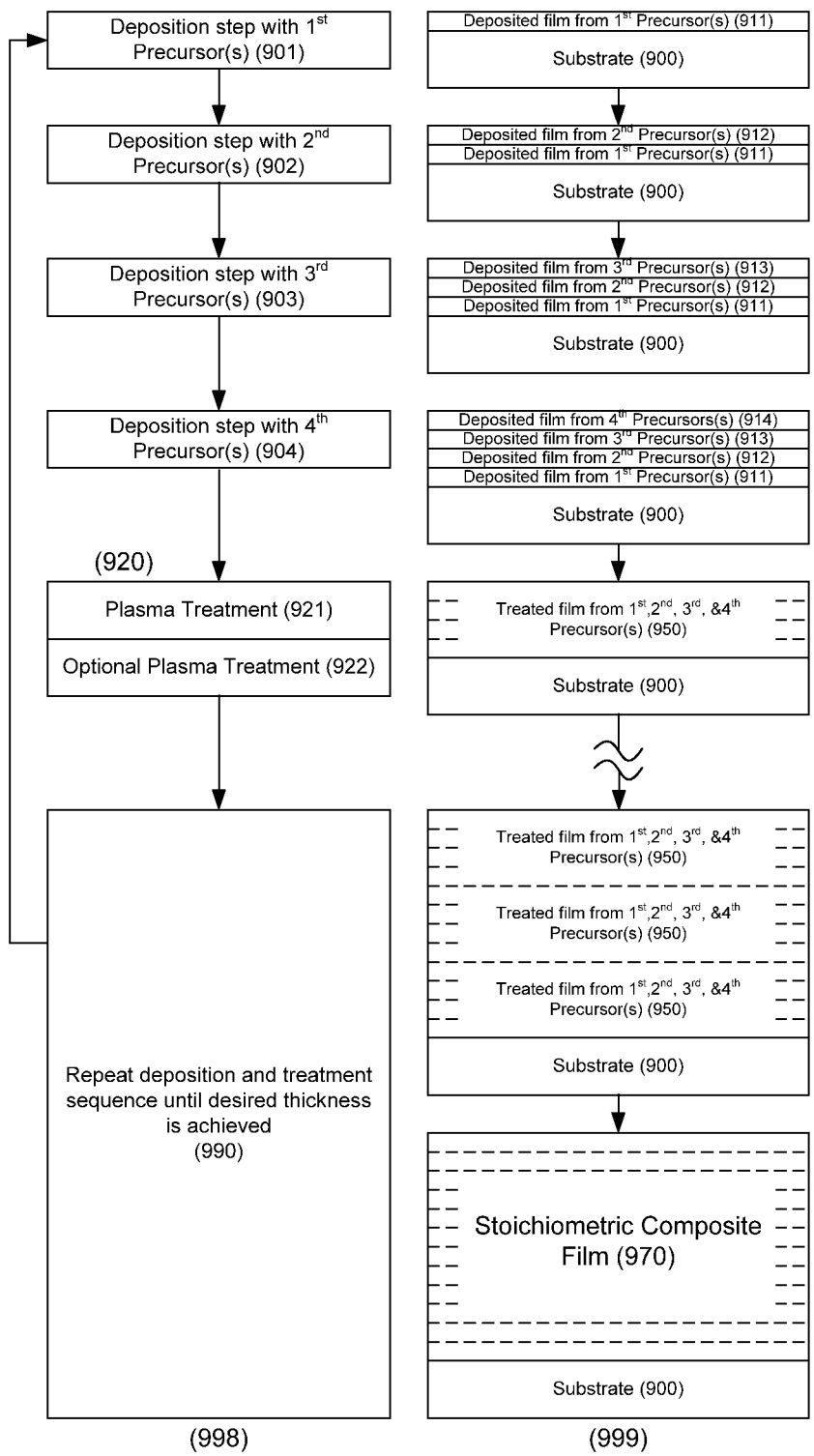
FIG. 9 is a flowchart for the present invention NLD process with four deposition steps, followed by a treatment step, or combination of treatment steps.

FIG. 9 shows a flowchart of an NLD process sequence 998 with a corresponding schematic of film growth sequence 999 on substrate 900. First deposition step 901 is an exposure of the substrate 900 to a first precursor, or set of precursors, to deposit a layer or film 911. The deposition step from the first precursors 901 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

In the embodiment illustrated in FIG. 9, the deposition step 901 with the first set of precursors is followed by a deposition step 902 with a second precursor, or set of precursors. Deposition step 902 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The second deposition step 902 produces the deposited layer or film 912 on the deposited film 911. Some modifications to the properties of the layer 911 may occur as a result of the deposition step 912, relative to the as-deposited film, and remain within the scope of the current invention.

In the embodiment illustrated in FIG. 9, the deposition step 902 is followed by deposition step 903 with a third precursor, or set of precursors. Deposition step 903 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The third deposition step 903 produces the deposited layer or film 913 on the deposited film 912. Some modifications to the properties of the layers 911-912 can occur as a result of the exposure to the deposition step 913, relative to the as-deposited films, and remain within the scope of the current invention.

In the embodiment illustrated in FIG. 9, the deposition step 903 is followed by deposition step 904 with a fourth precursor, or set of precursors. Deposition step 904 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The fourth deposition step 904 produces the deposited layer 914 on the deposited film 913. Some modifications to the properties of the underlying layers 911-913 may occur as a result of the exposure to the deposition step 904, relative to the as-deposited films, and remain within the scope of the current invention.

Following film deposition 904 from the fourth set of precursors, in the embodiment 998 is the plasma treatment 920 to produce treated film 950. The plasma treatment 920 can be a single step 921 or multiple steps 922. The plasma treatment 920 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 900. Similarly, plasma treatment 921 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 900. Similarly, plasma treatment 922 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on the substrate 900. The plasma treatment 920, or combination of plasma treatments 920, modifies the properties of the deposited layers 911-914 to produce treated stoichiometric layer 950, a combination of the elements from the deposition steps 901-904 and the plasma treatment(s) 920. The treatment step 920 can modify the properties of the as-deposited layers 911-914 to create the treated film 950 by changing the film density, by changing the film thickness, by incorporating impurities, by removing impurities, by changing the crystallinity of the film, by modifying the film composition, by modifying the stoichiometry, or by changing any other physical, electronic, magnetic, or other characteristic of the film.

After the first deposited and treated layer 950 is formed, the process of depositing and treating is repeated 990 to produce a stoichiometric composite film 970, a composition of multiple layers of treated films 950. Variations in the process sequence for the deposition steps 901-904 and the treatment step 920 also can be implemented in the inventive process to produce graded film structures in which the properties in the stack of the thin films 950 used to produce the stoichiometric composite film 970 are varied throughout the sequence of repeated depositions and treatments 990.

Figure 10:
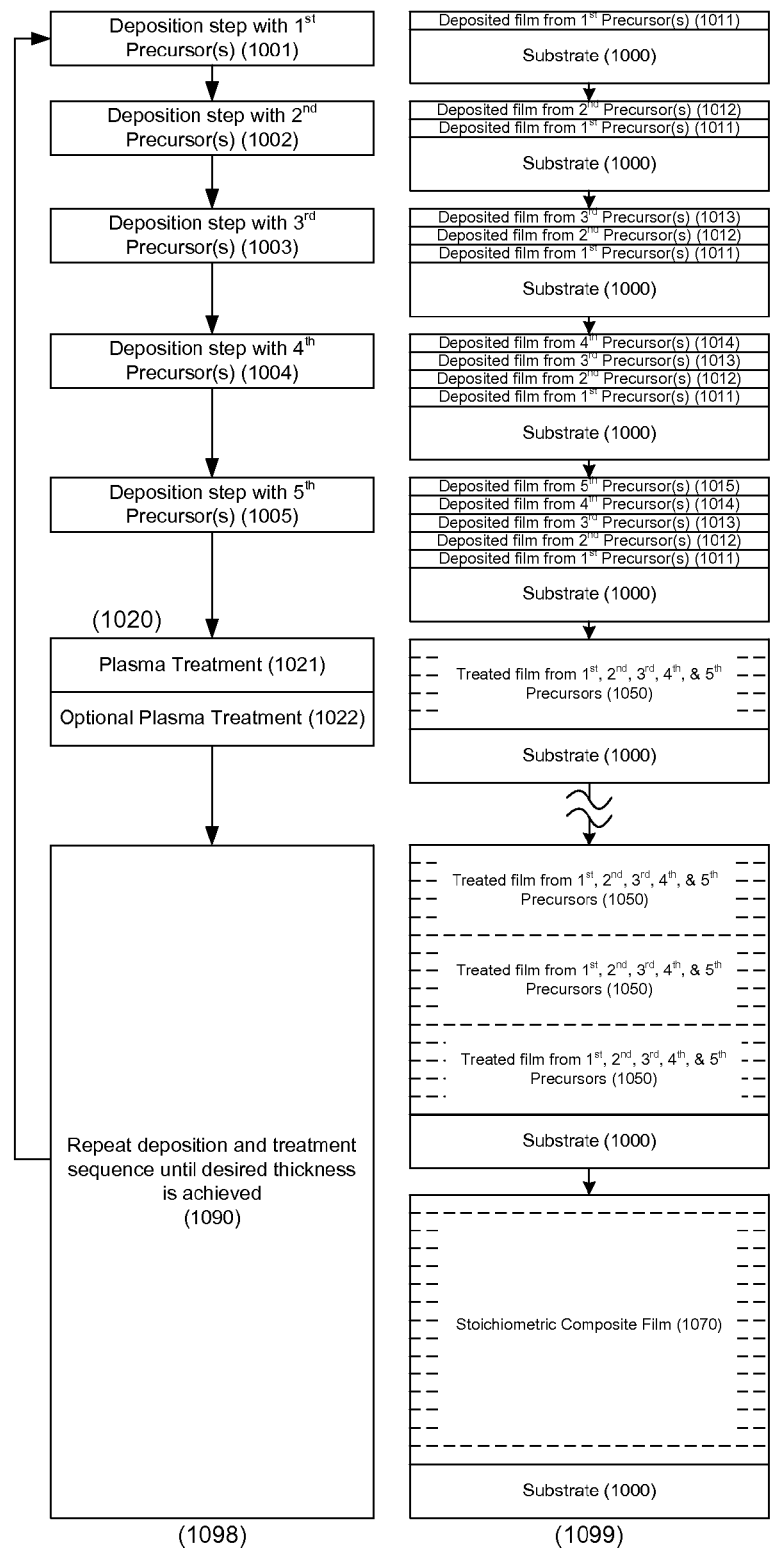
FIG. 10 is a flowchart for the present invention NLD process with five deposition steps, followed by a treatment step, or combination of treatment steps.

FIG. 10 shows a flowchart of an NLD process sequence 1098 with corresponding schematic of film growth sequence 1099 on substrate 1000. First deposition step 1001 is an exposure of the substrate 1000 to a first precursor, or set of precursors, to deposit a layer or film 1011. The deposition step from the first precursors 1001 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

In the embodiment illustrated in FIG. 10, the deposition step 1001 with the first set of precursors is followed by a deposition step 1002 with a second precursor, or set of precursors. Deposition step 1002 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The second deposition step 1002 provides deposited layer 1012 to the deposited layer 1011. Some modifications to the properties of the layer 1011 are possible from the deposition step 1002, relative to the as-deposited film 1011, and remain within the scope of the current invention.

In embodiments in which the films 1012 is not continuous, the deposition step 1002, may not actually produce a layer that resides "on" the underlying layer 1011, but rather some or all of the elements in the deposition may fall within the underlying layer 1011. In this and other embodiments, the term "on" is used to indicate the chronological deposition of the sequence of deposited layers and not necessarily the geometric structure as indicated in the Figures. In these cases in which the films are not continuous, diffusion effects may limit the geometric stacking of the elements as suggested in the diagrams. Discontinuous films that result in exchanging of the geometric stacking of the elements in the structure are within the scope of the current invention.

In the embodiment illustrated in FIG. 10, the deposition step 1002 is followed by a deposition step 1003 with a third precursor, or set of precursors. Deposition step 1003 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The third deposition step 1003 produces the deposited layer or film 1013 on the deposited film 1012. Some modifications to the properties of the layers 1011, and to layer 1012 may occur from the deposition step 1003, relative to the as-deposited films, and remain within the scope of the current invention In the embodiment illustrated in FIG. 10, the deposition step 1003 is followed by a deposition step 1004 with a fourth precursor, or set of precursors. Deposition step 1004 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The fourth deposition step 1004 produces the deposited layer 1014 on the deposited film 1013. Some modifications to the properties of the layers 1011-1013 may occur as a result of the deposition step 1004, relative to the as-deposited films, and remain within the scope of the current invention.

In the embodiment illustrated in FIG. 10, the deposition step 1004 is followed by the deposition step 1005 with a fifth precursor, or set of precursors. Deposition step 1005 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. The fifth deposition step 1005 produces the deposited layer 1015 on the deposited film 1014. Some modifications to the properties of the layers 1011-1014 may occur as a result of the deposition step 1004, relative to the as-deposited films, and remain within the scope of the current invention.

Following film deposition 1005 from the fifth set of precursors, in the embodiment 1098 is the plasma treatment 1020 to produce treated film 1050. The plasma treatment 1020 can be a single step 1021 or multiple steps 1022. The plasma treatment 1020 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1000. Similarly, plasma treatment 1021 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1000. Similarly, plasma treatment 1022 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1000. The plasma treatment 1020, or combination of plasma treatments 1020, modifies the properties of the deposited layers 1011-1015 to produce treated stoichiometric layer 1050, a combination of the elements from the deposition steps 1001-1005 and from the plasma treatment(s) 1020. The treatment step(s) 1020 can modify the properties of the as-deposited layers 1011-1015 to create the treated film 1050 by changing the film density, by changing the film thickness, by incorporating impurities, by removing impurities, by changing the crystallinity of the film, by modifying the film composition, by modifying the stoichiometry, or by changing any other physical, electronic, magnetic, or other characteristic of the film. After the first deposited and treated layer 1050 is formed, the process of depositing and treating is repeated 1090 to produce a stoichiometric composite film 1070, a composition of multiple layers of treated films 1050. Variations in the process sequence for the deposition steps 1001-1005 and the treatment step 1020 also can be implemented in the inventive process to produce graded film structures in which the properties in the stack of the thin films 1050 used to produce the stoichiometric composite film 1070 are varied throughout the sequence of repeated depositions and treatments 1090.

Figure 11:
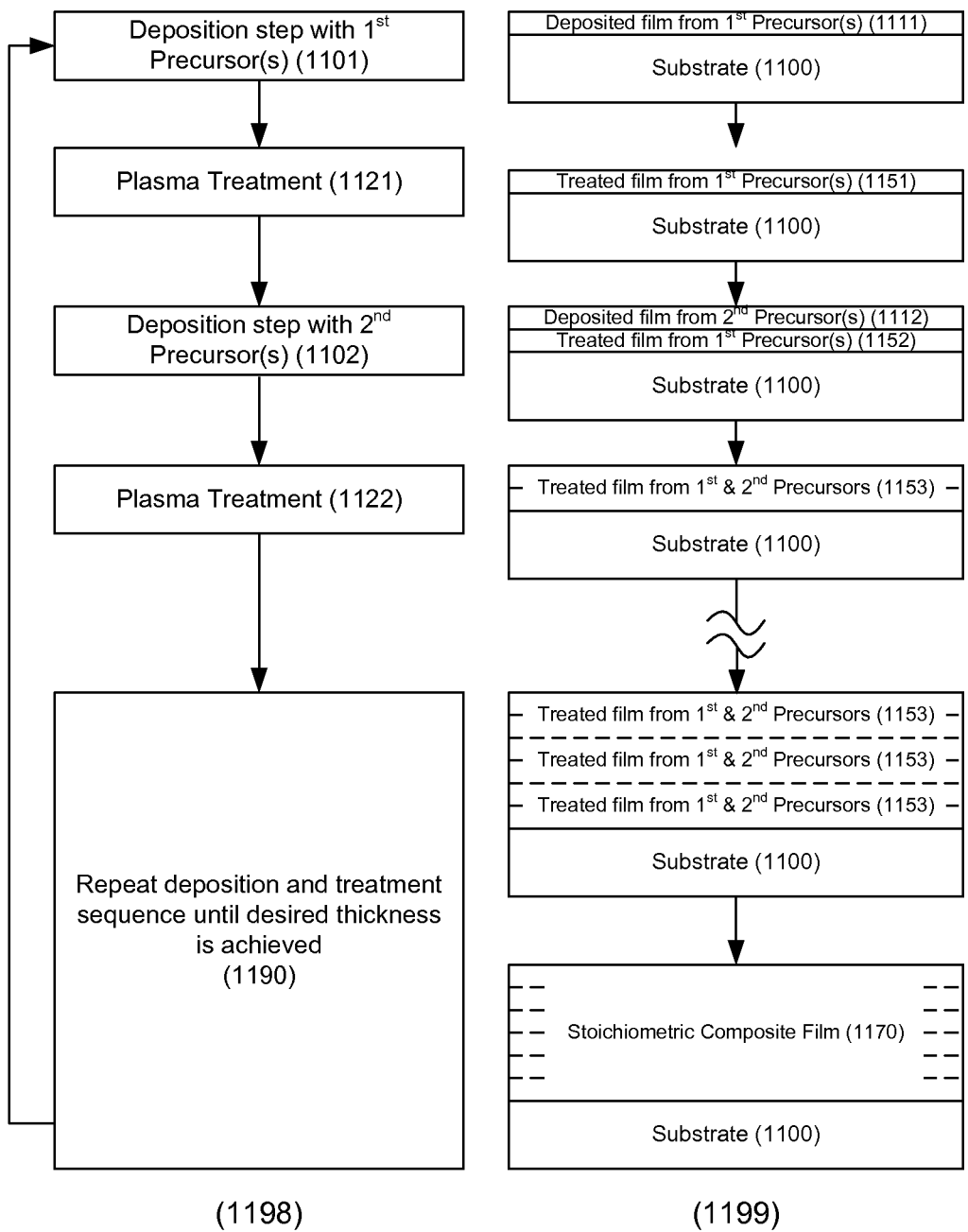
FIG. 11 is a flowchart for the present invention NLD process with two deposition steps that are each optionally followed by a treatment step, or combination of treatment steps.

FIG. 11 shows a flowchart of an NLD process sequence 1198 with corresponding schematic of the film growth sequence 1199 on substrate 1100. First deposition step 1101 is the exposure of the substrate 1100 to a first precursor, or set of precursors, to deposit a layer or film 1111. The first deposition step can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

Following film deposition 1101 from the first precursor, or set of precursors, is the plasma treatment 1121 to produce treated film 1151. The plasma treatment 1121 can be a single step or multiple steps. The plasma treatment 1121 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1100. The plasma treatment, or combination of plasma treatments 1121, modifies the properties of the deposited layers 1111 to produce treated stoichiometric layer 1151, a combination of the elements from the deposited layer from first precursors 1101, from the second precursors 1102, and from the plasma treatment(s) 1121. The modification step can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1198 shown in FIG. 11, the treatment step 1121 is followed by a deposition step with a second set of precursors 1102 that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1102, can impact one or more of the film properties of deposited and treated film 1151 to produce treated film 1152. The second deposition step 1102 produces the deposited layer or film 1112 above the treated film 1152.

Following the film deposition 1102 from the second set of precursors is the plasma treatment 1122 to produce treated composite film layer 1153. The plasma treatment 1122 can be a single step or multiple steps. The plasma treatment 1122 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1100. The plasma treatment 1122, or combination of plasma treatments 1122, modifies the properties of the deposited layers 1111, 1112 to produce treated stoichiometric layer 1153, a combination of the elements from the deposited layer from the first precursor(s) deposition step 1101, from the first plasma treatment(s) 1121, from the second precursor(s) deposition step 1102, and from the plasma treatment(s) 1122. The treatment steps 1121, 1122 can change the film density, change the film thickness, incorporate impurities, remove impurities, change the crystallinity of the film, modify the film composition, modify the stoichiometry, or change any other physical, electronic, magnetic, or other characteristic of the film.

After the first deposited and treated composite layer 1153 is formed, the process of depositing and treating is repeated 1190 to produce a stoichiometric composite film 1170, a composition of multiple layers of treated films 1153. Variations in the process sequence for the deposition steps 1101, 1102 and the treatment steps 1121, 1122 also can be implemented in the inventive process to produce graded film structures in which the properties in the stack of the thin films 1153 used to produce the stoichiometric composite film 1170 are varied throughout the sequence of repeated depositions and treatments 1190 to produce a layer for which the one or more of the properties of the thin layers 1153 are varied for one or more of the individual layers 1153 in producing the composite film 1170.

Figure 12:
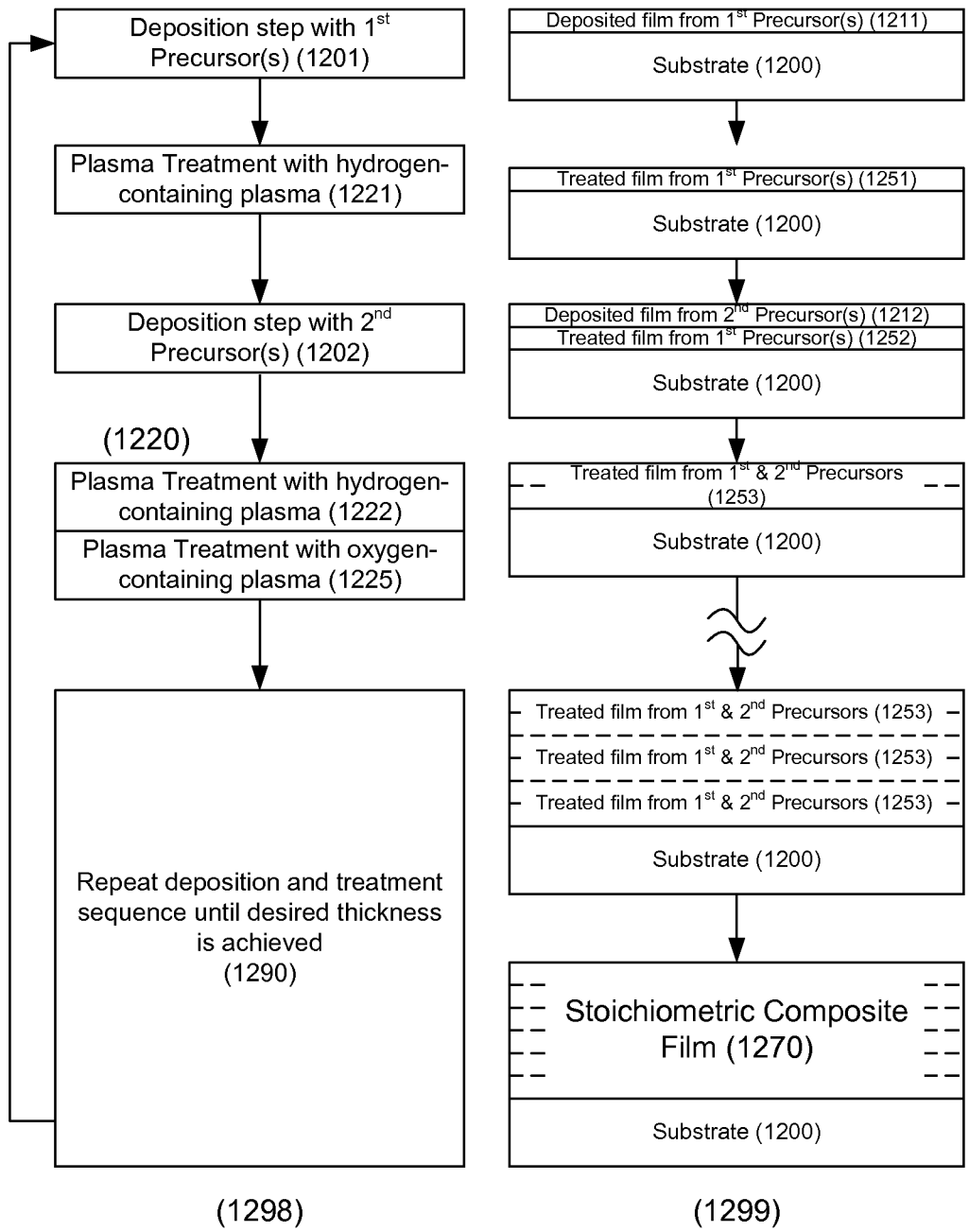
FIG. 12 is a flowchart for an embodiment of the present invention NLD process with two deposition steps that are each followed by a treatment step. In this embodiment, a hydrogen-containing plasma treatment is used to remove excess impurities from the decomposition of the CVD precursors after both the first and second deposition steps and an additional oxygen-containing plasma treatment is used after the second deposition step to incorporate oxygen into the film.

In FIG. 12, an example of the embodiment described in FIG. 11 is further illustrated.

FIG. 12 shows a flowchart of an NLD process sequence 1298 with corresponding schematic of the film growth sequence 1299 on substrate 1200. First deposition step 1201 is the exposure of the substrate 1200 to a first precursor, or set of precursors, to deposit a layer or film 1211. The first deposition step can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. For the purposes of this example, the first deposition step 1201 is a deposition from a single precursor, namely an MOCVD precursor, containing a metal element such as Ti, Ta, W, Cu, Al, Ni, Ru, Ir, Mo, Sb, or any other metal element. Alternatively, the MOCVD can contain Si, Ge, Te, or any other element for which metallo-organic precursors are available. In this embodiment, the substrate 1200 is set to a fixed temperature, sufficiently high so as to produce a non-saturating deposition characteristic typical of CVD-like deposition. Temperatures for MOCVD precursors typically fall in the range of 100 to 500 degrees Celsius, and can vary widely for the range of available precursors. For the purpose of example, the MOCVD precursor in the deposition step 1201 is TDMAT, and the operating temperature is 300 degrees Celsius.

Following film deposition 1201 from the first MOCVD precursor, is the plasma treatment 1221 to produce treated film 1251. The plasma treatment 1221 in this embodiment is a single step plasma treatment using a hydrogen-containing gas such as molecular hydrogen, ammonia, methane, silane, or another gas containing hydrogen. Alternatively, plasma treatment 1221 is a mixture of a hydrogen-containing gas and one or more of nitrogen or an inert gas such as argon or helium. Preferably, the plasma treatment 1221 is hydrogen, a mixture of hydrogen and nitrogen, a mixture of ammonia and nitrogen, or a mixture of hydrogen and helium. For the purpose of example, the plasma treatment 1221 in this embodiment, is a mixture of hydrogen and helium and is a single step process. Also, for the purpose of example, the gas mixture is in the range of 3-20% hydrogen in helium, and for the purpose of providing an example, in the range of 3-6% hydrogen in helium, although a wide range of hydrogen/helium gas mixtures will provide the necessary condition for the plasma treatment 1221. The gas flow of the hydrogen/helium mix is in the range of 5-200 sccm, and for the purpose of example, 50 sccm although a wide range of gas flows will provide necessary condition for the plasma treatment 1221. The pressure for the plasma can be in the range of 1 mTorr to 100 Torr to provide the necessary conditions for effectively providing plasma treatment 1221, and for the purpose of providing an example of a typical flow, the pressure is 100 mT. The plasma source provides a means for delivering ionized gaseous species to the substrate to interact with the growing film on substrate 1200. As such, ions and reactive species can be provided by a wide range of techniques known in the art, any of which can be implemented in the inventive process. The plasma source can be an inductively-coupled plasma source, a capacitively-coupled plasma source, a microwave plasma source, an ion source, or any other type of plasma source that is known in the art for delivering ionized gas species to the films on substrate 1200. The plasma source can be rf-powered in the range of 10's of kHz to 100's of MHz in frequency. The plasma source can be microwave powered. The plasma source can be a secondary source that utilizes a primary source, such as an electron current to ionize a gas, which is then extracted and accelerated to the substrate, as in an ion source or ion milling machine. For the purpose of example, the plasma is generated using a 13.56 Mhz generator attached to the wafer electrode with a matching network to provide impedance matching between the generator and the wafer electrode. In this configuration, a wide range of power can be used to produce conditions that would effectively treat the growing films on substrate 1200. For the purpose of example, power levels in the range of 1 W to 500 W are used. Optimal power levels for a given process 1221 will depend on wafer size, plasma pressure, precursor selection, deposited film specifications, sputter rate of the growing film (if power is above the sputtering threshold), among other factors. For the purpose of example, the wafer size is 200 mm and the power level is 300 W. For other plasma sources, such as an inductively-coupled plasma source, the required power levels are likely to be different, and can depend on additional factors such as the distance between the plasma source and the substrate 1200, the operating pressure, and the choice of gas, among other factors.

The plasma treatment 1221, modifies the properties of the deposited layers 1211 to produce treated stoichiometric layer 1251, a combination of the elements from the deposited layer from first precursors 1201, and from the plasma treatment 1221. The modification step can change the film density, change the film thickness, incorporate impurities, remove impurities, change the crystallinity of the film, modify the film composition, modify the stoichiometry, or change any other physical, electronic, magnetic, or other characteristic of the film. In the exemplary embodiment described in FIG. 12, the plasma treatment step 1221 is used to remove impurities such as carbon from the deposited film 1211. Other purposes for the treatment step 1221 might also be provided in the inventive process and remain within the scope of the present invention.

In the embodiment 1298 shown in FIG. 12, the treatment step 1221 is followed by a deposition step with a second set of precursors 1202 that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. For the purposes of this example, the second deposition step 1202 is a deposition from a single precursor, namely an MOCVD precursor, containing a metal element such as Ti, Ta, W, Cu, Al, Ni, Ru, Ir, Mo, Sb, or any other metal element. Alternatively, the MOCVD can contain Si, Ge, Te, Ba, Ca, or any other element for which metallo-organic precursors are available. For the purpose of example, the MOCVD precursor in deposition step 1202 is a barium containing MOCVD precursor, and the operating temperature is 300 degrees Celsius.

Inadvertent or intentional effects from the deposition step 1202, can impact one or more of the film properties of deposited and treated film 1251 to produce treated film 1252. The second deposition step 1202 produces the deposited layer 1212 on the treated film 1252.

Following the film deposition 1202 from the second precursor is the plasma treatment 1220 to produce treated composite film layer 1253. The plasma treatment 1220 can be a single step or multiple steps. The plasma treatment 1220 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1200. The plasma treatment 1220, or combination of plasma treatments 1220, modifies the properties of the deposited layers 1212 to produce treated stoichiometric layer 1253, a combination of the elements from the deposited layer from the deposition steps 1201-1202, and from the plasma treatment(s) 1221, 1220. The treatment steps 1220 can change the film density, change the film thickness, incorporate impurities, remove impurities, change the crystallinity of the film, modify the film composition, modify the stoichiometry, or change any other physical, electronic, magnetic, or other characteristic of the film.

In the embodiment shown in FIG. 12, the plasma treatment 1220 is a sequence of multiple steps 1222 and 1225. Plasma treatment 1222 is a first step of the plasma treatment 1220, and for the purpose of example, is a plasma treatment using a hydrogen-containing plasma. In this exemplary embodiment, the plasma treatment conditions are similar to those described for plasma treatment step 1221 that followed the deposition step from the first precursors 1201.

In this exemplary embodiment, the hydrogen-containing plasma treatment 1222 is a step for removing impurities such as carbon from the deposited film 1212. Other purposes for plasma treatment step 1222 might also be used that remain within the scope of the present invention.

Plasma treatment 1225 is a second step of the plasma treatment 1220, and for the purpose of example, is a plasma treatment using a oxygen-containing plasma. In this exemplary embodiment, the plasma treatment 1225 is a plasma treatment using an oxygen-containing gas such as molecular oxygen, ozone, or another gas containing oxygen. Alternatively, plasma treatment 1225 is a mixture of an oxygen-containing gas and one or more of nitrogen and an inert gas such as argon or helium. Preferably, the plasma treatment 1221 is oxygen, or a mixture of oxygen and argon, or oxygen and helium. For the purpose of example, the plasma treatment 1225 in this embodiment, is a mixture of oxygen and argon and is single step process. Also, for the purpose of example, the gas mixture is in the range of 20-50% oxygen in argon, and for the purpose of providing an example, 30% oxygen in argon, although a wide range of oxygen/argon gas mixtures will provide the necessary condition for the plasma treatment 1225. The gas flow of the oxygen/argon mix is in the range of 5-200 sccm, and for the purpose of example, 50 sccm although a wide range of gas flows will provide necessary condition for the plasma treatment 1225. The pressure for the plasma can be in the range of 1 mTorr to 100 Torr to provide the necessary conditions for effectively providing plasma treatment 1225, and for the purpose of providing an example, the pressure is 500 mT. The plasma source provides a means for delivering ionized gaseous species to the substrate to interact with the growing film on substrate 1200. As such, ions and reactive species can be provided by a wide range of techniques known in the art, any of which can be implemented in the inventive process. The plasma source can be an inductively-coupled plasma source, a capacitively-coupled plasma source, a microwave plasma source, an ion source, or any other type of plasma source that is known in the art for delivering ionized gas species to the films on substrate 1200. The plasma source can be rf-powered in the range of 10's of kHz to 100's of MHz in frequency. The plasma source can be microwave powered. The plasma source can be a secondary source that utilizes a primary source, such as an electron current to ionize a gas, which is then extracted and accelerated to the substrate, as in an ion source or ion milling machine. For the purpose of example, the plasma is generated using a 13.56 Mhz generator attached to the wafer electrode with a matching network to provide impedance matching between the generator and the wafer electrode. In this configuration, a wide range of power can be used to produce conditions that would effectively treat the growing films on substrate 1200. For the purpose of example, power levels in the range of 1 W to 500 W are used. Optimal power levels for a given process 1225 will depend on wafer size, plasma pressure, precursor selection, deposited film specifications, sputter rate of the growing film (if power is above the sputtering threshold), among other factors. For the purpose of example, the wafer size is 200 mm and the power level is 300 W. For other plasma sources, such as an inductively-coupled plasma source, the required power levels are likely to be different, and can depend on additional factors such as the distance between the plasma source and the substrate 1200, the operating pressure, and the choice of gas, among other factors.

The plasma treatment 1225, modifies the properties of the deposited layers 1212, 1252 to produce treated stoichiometric layer 1253, a combination of elements from the deposition steps 1201, and from steps 1221 and 1225 of the plasma treatment 1220. The modification step 1220 can change the film density, change the film thickness, incorporate impurities, remove impurities, change the crystallinity of the film, modify the film composition, modify the stoichiometry, or change any other physical, electronic, magnetic, or other characteristic of the film. In the exemplary embodiment described in FIG. 12, the plasma treatment step 1221 is used to remove impurities such as carbon from the deposited films 1212, 1252. In this exemplary embodiment, the plasma treatment step 1225 is used to remove impurities such as carbon from the deposited film 1212, 1252 and to incorporate oxygen into the films 1212, 1252 to produce the desired stoichiometric layer 1253 and stoichiometric film 1270.

Other purposes for the treatment step 1221 might also be provided in the inventive process and remain within the scope of the present invention.

After the first deposited and treated composite layer 1253 is formed, the process of depositing and treating is repeated 1290 to produce a stoichiometric composite film 1270, a composition of multiple layers of treated films 1253.

Variations in the process sequence for the deposition steps 1201, 1202 and the treatment steps 1221, 1220 also can be implemented in the inventive process to produce graded film structures in which the properties in the stack of the thin films 1253 used to produce the stoichiometric composite film 1270 are varied throughout the sequence of repeated depositions and treatments 1290 to produce a layer for which the one or more of the properties of the thin layers 1253 are varied for one or more of the individual layers 1253 in producing the composite film 1270.

Figure 13:
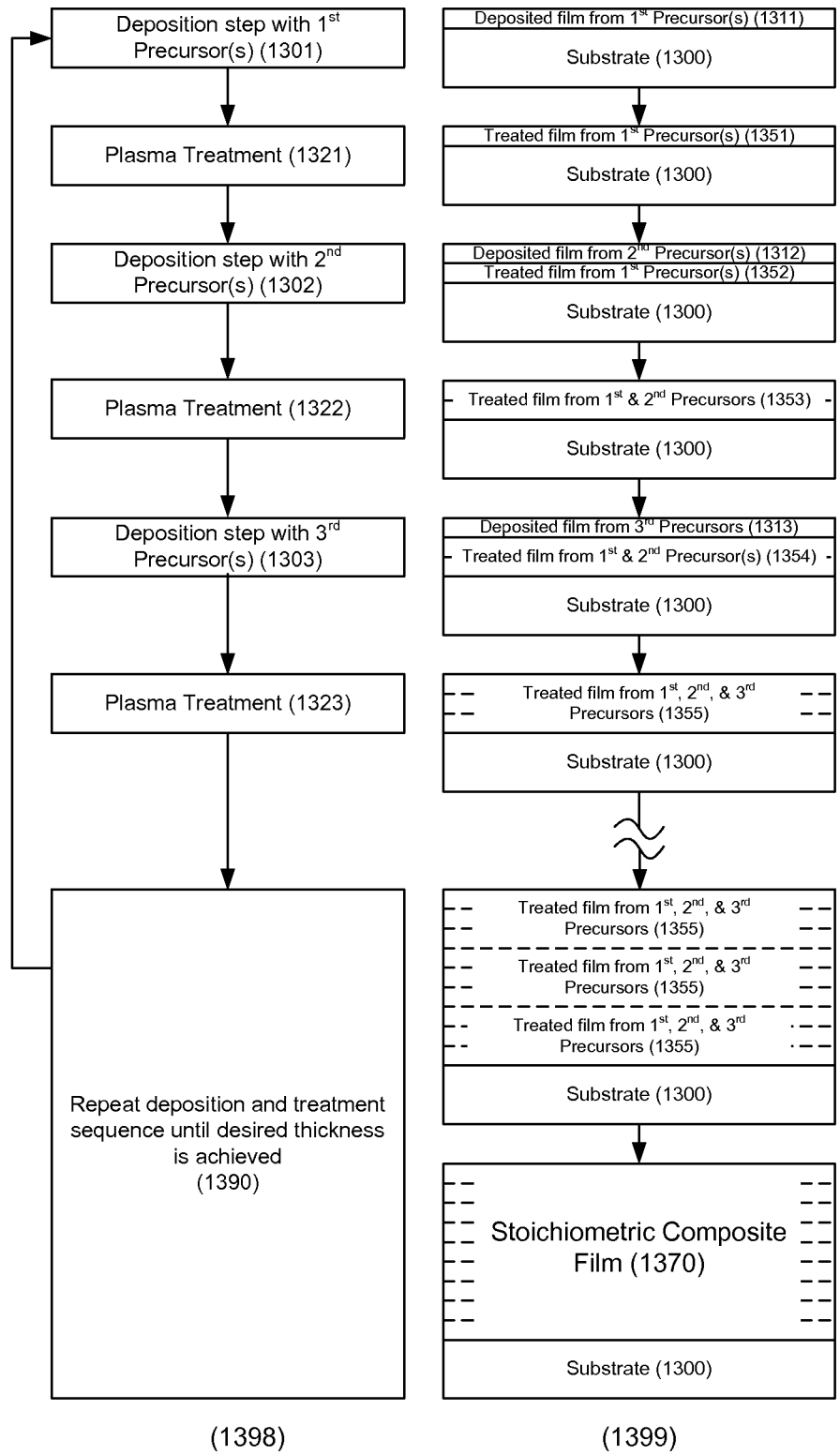
FIG. 13 is a flow chart for the present invention NLD process with three deposition steps that are each optionally followed by a treatment step, or combination of treatment steps that can be used to fabricate tertiary and quaternary compound films.

FIG. 13 shows a flowchart of an NLD process sequence 1398 with corresponding schematic of the film growth sequence 1399 on substrate 1300. First deposition step 1301 is the exposure of the substrate 1300 to a first precursor, or set of precursors, to deposit a layer or film 1311. The first deposition step can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

Following film deposition 1301 from the first precursor, or set of precursors, is the plasma treatment 1321 to produce treated film 1351. The plasma treatment 1321 can be a single step or multiple steps. The plasma treatment 1321 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1300. The plasma treatment, or combination of plasma treatments 1321, modifies the properties of the deposited layers 1311 to produce treated layer 1351, a combination of the elements from the deposited layer from first precursors 1301, and from the plasma treatment(s) 1321. The modification step 1321 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1398 shown in FIG. 13, the treatment step 1321 is followed by a deposition step with a second set of precursors 1302 to produce layer 1312, that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1302, can impact one or more of the film properties of deposited and treated film 1351 to produce treated film 1352. The second deposition step 1302 produces the deposited layer or film 1312 on the treated film 1352.

Following the film deposition 1302 from the second set of precursors is the plasma treatment 1322 to produce treated composite film layer 1353. The plasma treatment 1322 can be a single step or multiple steps. The plasma treatment 1322 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1300. The plasma treatment 1322, or combination of plasma treatments 1322, modifies the properties of the deposited layers 1311, 1312 to produce treated stoichiometric layer 1353, a combination of elements from the deposited layer from the deposition steps 1301-1302, and from the plasma treatment(s) 1321-1322. The treatment steps 1321, 1322 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1398 shown in FIG. 13, the treatment step 1322 is followed by a deposition step with a third set of precursors 1303 to produce layer 1313, that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1303, can impact one or more of the film properties of deposited and treated film 1353 to produce treated film 1354. The third deposition step 1303 produces the deposited layer 1313 above the treated film 1354.

Following the film deposition 1303 from the third set of precursors is the plasma treatment 1323 to produce treated composite film layer 1355. The plasma treatment 1323 can be a single step or multiple steps. The plasma treatment 1323 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1300. The plasma treatment 1323, or combination of plasma treatments 1323, modifies the properties of the deposited layers 1313, 1354 to produce treated stoichiometric layer 1355, a combination of elements from the deposition steps 1301-1303, and from the first plasma treatment(s) 1321-1323. The treatment steps 1321-1323 can change the film density, change the film thickness, incorporate impurities, remove impurities, change the crystallinity of the film, modify the film composition, modify the stoichiometry, or change any other physical, electronic, magnetic, or other characteristic of the film.

After the first deposited and treated composite layer 1355 is formed, the process of depositing and treating is repeated 1390 to produce a stoichiometric composite film 1370, a composition of multiple layers of treated films 1355. Variations in the process sequence for the deposition steps 1301-1303 and the treatment steps 1321-1323 also can be implemented in the inventive process to produce graded film structures in which the properties in the stack of the thin films 1355 used to produce the stoichiometric composite film 1370 are varied throughout the sequence of repeated depositions and treatments 1390 to produce a layer for which the one or more of the properties of the thin layers 1355 are varied for one or more of the individual layers 1355 in producing the composite film 1370.

Figure 14:
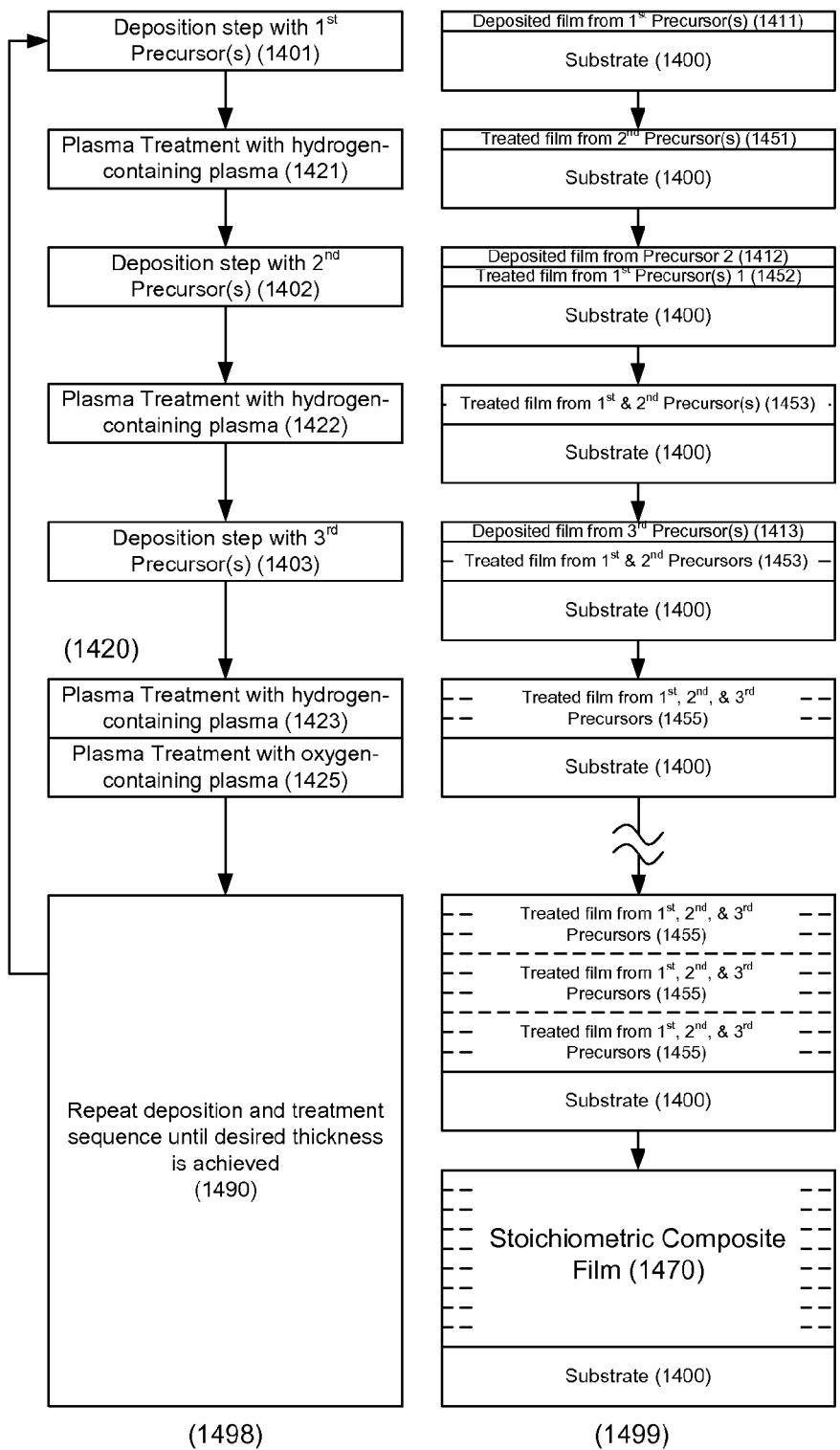
FIG. 14 is a flow chart for the present invention NLD process with three deposition steps that are each followed by a hydrogen-containing plasma treatment step, with a second treatment in an oxygen-containing plasma after the third deposition step that can be used to fabricate quaternary compound films.

In FIG. 14, an example of the embodiment described in FIG. 13 is further illustrated.

FIG. 14 shows a flowchart of an NLD process sequence 1498 with corresponding schematic of the film growth sequence 1499 on substrate 1400. First deposition step 1401 is the exposure of the substrate 1400 to a first precursor, or set of precursors, to deposit a layer or film 1411. The first deposition step can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. For the purposes of this example, the first deposition step 1401 is a deposition from a single precursor, namely an MOCVD precursor, containing a metal element such as Ti, Ta, W, Cu, Al, Ni, Ru, Ir, Mo, Sb, or any other metal element. Alternatively, the MOCVD can contain Si, Ge, Te, or any other element for which metallo-organic precursors are available. In this embodiment, the substrate 1400 is set to a fixed temperature, sufficiently high so as to produce a non-saturating deposition characteristic typical of CVD-like deposition. Temperatures for MOCVD precursors typically fall in the range of 100 to 500 degrees Celsius, and can vary widely for the range of available precursors. For the purpose of example, the MOCVD precursor in the deposition step 1401 is TDMAT, and the operating temperature is in the range of 250 to 300 degrees Celsius.

Following film deposition 1401 from the first MOCVD precursor, is the plasma treatment 1421 to produce treated film 1451. The plasma treatment 1421 in this embodiment is a single step plasma treatment using a hygrogen-containing gas such as molecular hydrogen, ammonia, methane, silane, or another gas containing hydrogen. Alternatively, plasma treatment 1421 is a mixture of a hydrogen-containing gas and one or more of nitrogen or an inert gas such as argon or helium. Preferably, the plasma treatment 1421 is hydrogen, a mixture of hydrogen and argon, or a mixture of hydrogen and helium. For the purpose of example, the plasma treatment 1421 in this embodiment, is a mixture of hydrogen and helium and is a single step process. Also, for the purpose of example, the gas mixture is in the range of 3-20% hydrogen in helium, and for the purpose of providing an example, in the range of 3-6% hydrogen in helium, although a wide range of hydrogen/helium gas mixtures will provide the necessary condition for the plasma treatment 1421. Premixed gases are commonly available to the semiconductor industry in mixtures of approximately 5% hydrogen in helium. The gas flow of the hydrogen/helium mix is in the range of 5-200 sccm, and for the purpose of example, 50 sccm although a wide range of gas flows will provide necessary condition for the plasma treatment 1421. The pressure for the plasma can be in the range of 1 mTorr to 100 Torr to provide the necessary conditions for effectively providing plasma treatment 1421, and for the purpose of providing an example of a typical flow, the pressure is 100 mT. The plasma source provides a means for delivering ionized gaseous species to the substrate to interact with the growing film on substrate 1400. As such, ions and reactive species can be provided by a wide range of techniques known in the art, any of which can be implemented in the inventive process. The plasma source can be an inductively-coupled plasma source, a capacitively-coupled plasma source, a microwave plasma source, an ion source, or any other type of plasma source that is known in the art for delivering ionized gas species to the films on substrate 1400. The plasma source can be rf-powered in the range of 10's of kHz to 100's of MHz in frequency. The plasma source can be microwave powered. The plasma source can be a secondary source that utilizes a primary source, such as an electron current to ionize a gas, which is then extracted and accelerated to the substrate, as in an ion source or ion milling machine. For the purpose of example, the plasma is generated using a 13.56 Mhz generator attached to the wafer electrode with a matching network to provide impedance matching between the generator and the wafer electrode. In this configuration, a wide range of power can be used to produce conditions that would effectively treat the growing films on substrate 1400. For the purpose of example, power levels in the range of 1 W to 500 W are used. Optimal power levels for a given process 1421 will depend on wafer size, plasma pressure, precursor selection, deposited film specifications, sputter rate of the growing film (if power is above the sputtering threshold), among other factors. For the purpose of example, the wafer size is 200 mm and the power level is 300 W. For other plasma sources, such as an inductively-coupled plasma source, the required power levels are likely to be different, and can depend on additional factors such as the distance between the plasma source and the substrate 1400, the operating pressure, and the choice of gas, among other factors.

The plasma treatment 1421, modifies the properties of the deposited layers 1411 to produce treated stoichiometric layer 1451, a combination of elements from the deposited step 1401, and from the plasma treatment 1421. The modification step can change the film density, change the film thickness, incorporate impurities, remove impurities, change the crystallinity of the film, modify the film composition, modify the stoichiometry, or change any other physical, electronic, magnetic, or other characteristic of the film. In the exemplary embodiment described in FIG. 14, the plasma treatment step 1421 is used to remove impurities such as carbon from the deposited film 1411. Other purposes for the treatment step 1421 might also be provided in the inventive process that remain within the scope of the present invention.

In the embodiment 1498 shown in FIG. 14, the treatment step 1421 is followed by a deposition step with a second set of precursors 1402 that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. For the purposes of this example, the second deposition step 1402 is a deposition from a single precursor, namely an MOCVD precursor, containing a metal element such as Ti, Ta, W, Cu, Al, Ni, Ru, Ir, Mo, Sb, or any other metal element. Alternatively, the MOCVD can contain Si, Ge, Te, Ba, Ca, or any other element for which metallo-organic precursors are available. For the purpose of example, the MOCVD precursor in deposition step 1402 is a barium-containing MOCVD precursor, and the operating temperature is in the range of 250 to 300 degrees Celsius.

Inadvertent or intentional effects from the deposition step 1402, can impact one or more of the film properties of deposited and treated film 1451 to produce treated film 1452. The second deposition step 1402 produces the deposited layer 1412 on the treated film 1452.

Following film deposition 1402 from the first MOCVD precursor, is the plasma treatment 1422 to produce treated film 1453. The plasma treatment 1422 in this embodiment is a single step plasma treatment using a hydrogen-containing gas such as molecular hydrogen, ammonia, methane, silane, or another gas containing hydrogen. Alternatively, plasma treatment 1422 is a mixture of a hydrogen-containing gas and one or more of nitrogen or an inert gas such as argon or helium. Preferably, the plasma treatment 1422 is hydrogen, a mixture of hydrogen and argon, or a mixture of hydrogen and helium. For the purpose of example, the plasma treatment 1422 in this embodiment, is a mixture of hydrogen and helium and is a single step process. Also, for the purpose of example, the gas mixture is in the range of 3-20% hydrogen in helium, and for the purpose of providing an example, in the range of 3-6% hydrogen in helium, although a wide range of hydrogen/helium gas mixtures will provide the necessary condition for the plasma treatment 1422. Premixed gases are commonly available to the semiconductor industry in mixtures of approximately 5% hydrogen in helium. The gas flow of the hydrogen/helium mix is in the range of 5-200 sccm, and for the purpose of example, 50 sccm although a wide range of gas flows will provide necessary condition for the plasma treatment 1422. The pressure for the plasma can be in the range of 1 mTorr to 100 Torr to provide the necessary conditions for effectively providing plasma treatment 1422, and for the purpose of providing an example of a typical flow, the pressure is 100 mT. The plasma source provides a means for delivering ionized gaseous species to the substrate to interact with the growing film on substrate 1400. As such, ions and reactive species can be provided by a wide range of techniques known in the art, any of which can be implemented in the inventive process. The plasma source can be an inductively-coupled plasma source, a capacitively-coupled plasma source, a microwave plasma source, an ion source, or any other type of plasma source that is known in the art for delivering ionized gas species to the films on substrate 1400. The plasma source can be rf-powered in the range of 10's of kHz to 100's of MHz in frequency. The plasma source can be microwave powered. The plasma source can be a secondary source that utilizes a primary source, such as an electron current to ionize a gas, which is then extracted and accelerated to the substrate, as in an ion source or ion milling machine. For the purpose of example, the plasma is generated using a 13.56 Mhz generator attached to the wafer electrode with a matching network to provide impedance matching between the generator and the wafer electrode. In this configuration, a wide range of power can be used to produce conditions that would effectively treat the growing films on substrate 1400. For the purpose of example, power levels in the range of 1 W to 500 W are used. Optimal power levels for a given process 1422 will depend on wafer size, plasma pressure, precursor selection, deposited film specifications, sputter rate of the growing film (if power is above the sputtering threshold), among other factors. For the purpose of example, the wafer size is 200 mm and the power level is 300 W. For other plasma sources, such as an inductively-coupled plasma source, the required power levels are likely to be different, and can depend on additional factors such as the distance between the plasma source and the substrate 1400, the operating pressure, and the choice of gas, among other factors.

The plasma treatment 1422, modifies the properties of the deposited layers 1412, 1452 to produce treated stoichiometric layer 1453, a combination of the elements from the deposit steps 1401-1402, and from the plasma treatment 1422. The modification step can change the film density, change the film thickness, incorporate impurities, remove impurities, change the crystallinity of the film, modify the film composition, modify the stoichiometry, or change any other physical, electronic, magnetic, or other characteristic of the film. In the exemplary embodiment described in FIG. 14, the plasma treatment step 1422 is used to remove impurities such as carbon from the deposited films 1412, 1452. Other purposes for the treatment step 1422 might also be provided in the inventive process and remain within the scope of the present invention.

In the embodiment 1498 shown in FIG. 14, the treatment step 1422 is followed by a deposition step with a third set of precursors 1403 that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. For the purposes of this example, the third deposition step 1403 is a deposition from a single precursor, namely an MOCVD precursor, containing a metal element such as Ti, Ta, W, Cu, Al, Ni, Ru, Ir, Mo, Sb, or any other metal element. Alternatively, the MOCVD can contain Si, Ge, Te, Ba, Ca, or any other element for which metallo-organic precursors are available. For the purpose of example, the MOCVD precursor in deposition step 1403 is a strontium-containing MOCVD precursor, and the operating temperature is in the range of 250 to 300 degrees Celsius.

Inadvertent or intentional effects from the deposition step 1403, can impact one or more of the film properties of deposited and treated film 1452 to produce treated film 1453. The third deposition step 1403 produces the deposited layer 1413 on the treated film 1453.

Following the film deposition 1403 from the third precursor(s) is the plasma treatment 1420 to produce treated composite film layer 1455. The plasma treatment 1420 can be a single step or multiple steps. The plasma treatment 1420 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1400. The plasma treatment 1420, or combination of plasma treatments 1420, modifies the properties of the deposited layers 1413,1453 to produce treated stoichiometric layer 1455, a combination of the elements from the deposited layer from the deposition steps 1401-1403 and from the plasma treatment(s) 1421-1422. The treatment steps 1420 can change the film density, change the film thickness, incorporate impurities, remove impurities, change the crystallinity of the film, modify the film composition, modify the stoichiometry, or change any other physical, electronic, magnetic, or other characteristic of the film.

In the embodiment shown in FIG. 14, the plasma treatment 1420 is a sequence of multiple steps 1423 and 1425. Plasma treatment 1423 is a first step of the plasma treatment 1420, and for the purpose of example, is a plasma treatment using a hydrogen-containing plasma. In this exemplary embodiment, the plasma treatment conditions are similar to those described for plasma treatment step 1421 and 1422 that followed the deposition steps 1401, 1402 respectively.

In this exemplary embodiment, the hydrogen-containing plasma treatment 1423 is a step for removing impurities such as carbon from the deposited films 1413, 1453. Other purposes for plasma treatment step 1423 might also be used that remain within the scope of the present invention.

Plasma treatment 1425 is a second step of the plasma treatment 1420, and for the purpose of example, is a plasma treatment using a oxygen-containing plasma. In this exemplary embodiment, the plasma treatment 1425 is a plasma treatment using an oxygen-containing gas such as molecular oxygen, ozone, or another gas containing oxygen. Alternatively, plasma treatment 1425 is a mixture of an oxygen-containing gas and one or more of nitrogen and an inert gas such as argon or helium. Preferably, the plasma treatment 1425 is oxygen, or a mixture of oxygen and argon, or oxygen and helium. For the purpose of example, the plasma treatment 1425 in this embodiment, is a mixture of oxygen and argon and is single step process. Also, for the purpose of example, the gas mixture is in the range of 20-50% oxygen in argon, and for the purpose of providing an example, 30% oxygen in argon, although a wide range of oxygen/argon gas mixtures will provide the necessary condition for the plasma treatment 1425. The gas flow of the oxygen/argon mix is in the range of 5-200 sccm, and for the purpose of example, 50 sccm although a wide range of gas flows will provide necessary condition for the plasma treatment 1425. The pressure for the plasma can be in the range of 1 mTorr to 100 Torr to provide the necessary conditions for effectively providing plasma treatment 1425, and for the purpose of providing an example, the pressure is 500 mT. The plasma source provides a means for delivering ionized gaseous species to the substrate to interact with the growing film on substrate 1400. As such, ions and reactive species can be provided by a wide range of techniques known in the art, any of which can be implemented in the inventive process. The plasma source can be an inductively-coupled plasma source, a capacitively-coupled plasma source, a microwave plasma source, an ion source, or any other type of plasma source that is known in the art for delivering ionized gas species to the films on substrate 1400. The plasma source can be rf-powered in the range of 10's of kHz to 100's of MHz in frequency. The plasma source can be microwave powered. The plasma source can be a secondary source that utilizes a primary source, such as an electron current to ionize a gas, which is then extracted and accelerated to the substrate, as in an ion source or ion milling machine. For the purpose of example, the plasma is generated using a 13.56 Mhz generator attached to the wafer electrode with a matching network to provide impedance matching between the generator and the wafer electrode. In this configuration, a wide range of power can be used to produce conditions that would effectively treat the growing films on substrate 1400. For the purpose of example, power levels in the range of 1 W to 500 W are used. Optimal power levels for a given process 1425 will depend on wafer size, plasma pressure, precursor selection, deposited film specifications, sputter rate of the growing film (if power is above the sputtering threshold), among other factors. For the purpose of example, the wafer size is 200 mm and the power level is 300 W. For other plasma sources, such as an inductively-coupled plasma source, the required power levels are likely to be different, and can depend on additional factors such as the distance between the plasma source and the substrate 1400, the operating pressure, and the choice of gas, among other factors.

The plasma treatment 1425, modifies the properties of the deposited layers 1413, 1453 to produce treated stoichiometric layer 1455, a combination of the elements from the deposition steps 1401-1403 and from treatment steps 1421-1423, 1425. The modification step 1420 can change the film density, change the film thickness, incorporate impurities, remove impurities, change the crystallinity of the film, modify the film composition, modify the stoichiometry, or change any other physical, electronic, magnetic, or other characteristic of the film. In the exemplary embodiment described in FIG. 14, the plasma treatment step 1423 is used to remove impurities such as carbon from the deposited films 1413, 1453. In this exemplary embodiment, the plasma treatment step 1425 is used to remove impurities such as carbon from the deposited film 1413, 1453 and to incorporate oxygen into the films 1413, 1453 to produce the desired stoichiometric layer 1455 and stoichiometric film 1470.

Other purposes for the treatment step 1421 might also be provided in the inventive process and remain within the scope of the present invention.

After the first deposited and treated composite layer 1455 is formed, the process of depositing and treating is repeated 1490 to produce a stoichiometric composite film 1470, a composition of multiple layers of treated films 1455.

Variations in the process sequence for the deposition steps 1401-1403 and the treatment steps 1421-1423, 1425 also can be implemented in the inventive process to produce graded film structures in which the properties in the stack of the thin films 1453 used to produce the stoichiometric composite film 1470 are varied throughout the sequence of repeated depositions and treatments 1490 to produce a layer for which the one or more of the properties of the thin layers 1455 are varied for one or more of the individual layers 1455 in producing the composite film 1470.

Figure 15:
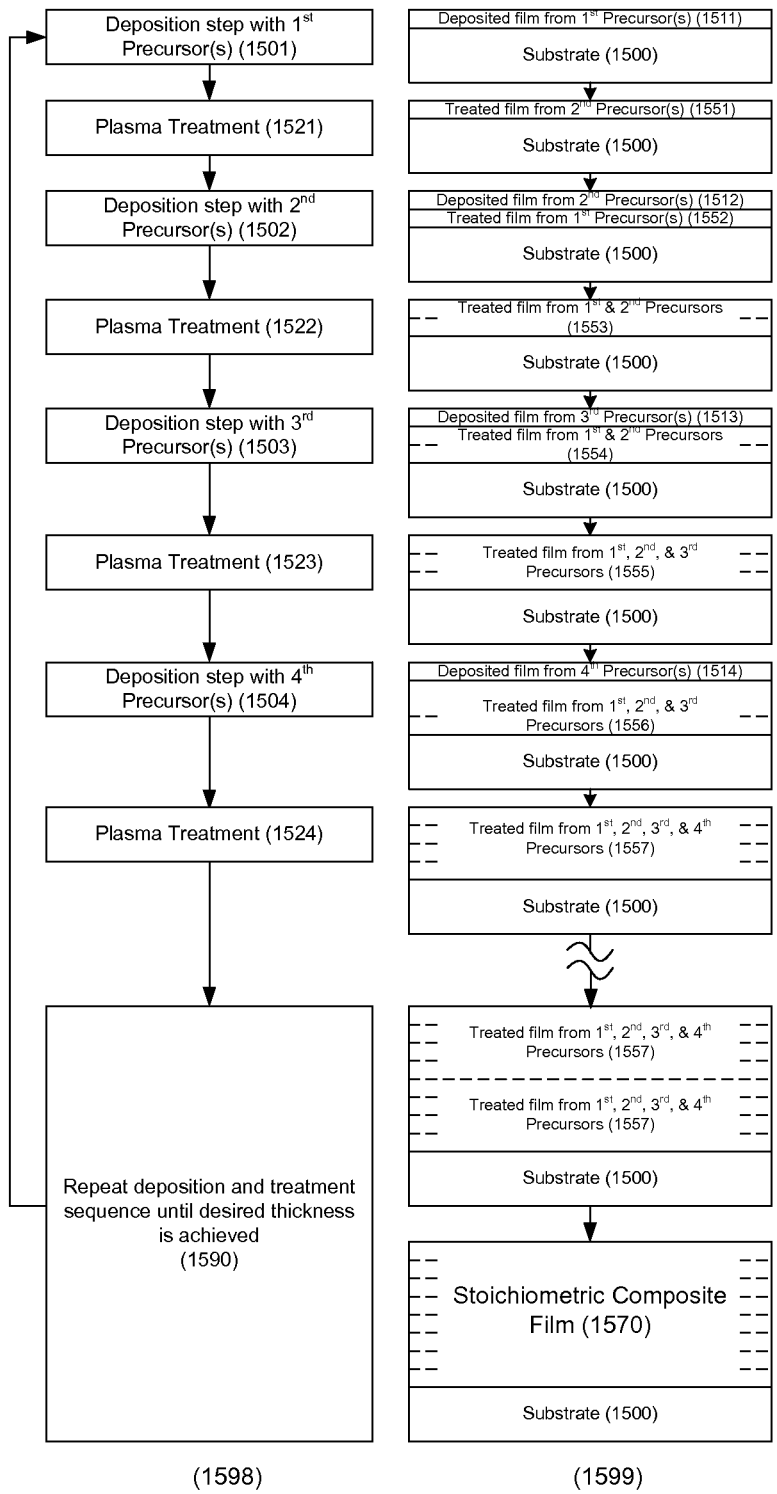
FIG. 15 is a flowchart for the present invention NLD process with four deposition steps that are each optionally followed by a treatment step, or combination of treatment steps used to fabricate quaternary and pentary compound films.

FIG. 15 shows a flowchart of an NLD process sequence 1598 with corresponding schematic of the film growth sequence 1599 on substrate 1500. First deposition step 1501 is the exposure of the substrate 1500 to a first precursor, or set of precursors, to deposit a layer or film 1511. The first deposition step can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

Following film deposition 1501 from the first precursor, or set of precursors, is the plasma treatment 1521 to produce treated film 1551. The plasma treatment 1521 can be a single step or multiple steps. The plasma treatment 1521 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1500. The plasma treatment, or combination of plasma treatments 1521, modifies the properties of the deposited layers 1511 to produce treated layer 1551, a combination of elements from the deposited layer from first precursors 1501, and from the plasma treatment(s) 1521. The modification step 1521 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1598 shown in FIG. 15, the treatment step 1521 is followed by a deposition step with a second set of precursors 1502 to produce layer 1512, that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1502, can impact one or more of the film properties of deposited and treated film 1551 to produce treated film 1552. The second deposition step 1502 produces the deposited layer or film 1512 on the treated film 1552.

Following the film deposition 1502 from the second set of precursors is the plasma treatment 1522 to produce treated composite film layer 1553. The plasma treatment 1522 can be a single step or multiple steps. The plasma treatment 1522 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1500. The plasma treatment 1522, or combination of plasma treatments 1522, modifies the properties of the deposited layers 1512, 1552 to produce treated stoichiometric layer 1553, a combination of elements from the deposition steps 1501-1502, and from the plasma treatment(s) 1521-1522. The treatment steps 1521, 1522 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1598 shown in FIG. 15, the treatment step 1522 is followed by a deposition step with a third set of precursors 1503 to produce layer 1513, that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1503, can impact one or more of the film properties of deposited and treated film 1553 to produce treated film 1554. The third deposition step 1503 produces the deposited layer 1513 above the treated film 1554.

Following the film deposition 1503 from the third set of precursors is the plasma treatment 1523 to produce treated composite film layer 1555. The plasma treatment 1523 can be a single step or multiple steps. The plasma treatment 1523 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1500. The plasma treatment 1523, or combination of plasma treatments 1523, modifies the properties of the deposited layers 1513, 1554 to produce treated stoichiometric layer 1555, a combination of elements from the deposition steps 1501-1503, and from the plasma treatment steps 1521-1523. The treatment steps 1521-1523 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1598 shown in FIG. 15, the treatment step 1523 is followed by a deposition step with a fourth precursor or set of precursors 1504 to produce layer 1514, that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

Inadvertent or intentional effects from the deposition step 1504, can impact one or more of the film properties of deposited and treated film 1555 to produce treated film 1556. The fourth deposition step 1504 produces the deposited layer 1514 above the treated film 1556.

Following the film deposition 1504 from the fourth precursor, or set of precursors, is the plasma treatment 1524 to produce treated composite film layer 1557. The plasma treatment 1524 can be a single step or multiple steps. The plasma treatment 1524 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1500. The plasma treatment 1524, or combination of plasma treatments 1524, modifies the properties of the deposited layers 1514, 1556 to produce treated stoichiometric layer 1557, a combination of elements from the deposition steps 1501-1504, and from the plasma treatment steps 1521-1524. The treatment steps 1521-1524 can change the film density, change the film thickness, incorporate impurities, remove impurities, change the crystallinity of the film, modify the film composition, modify the stoichiometry, or change any other physical, electronic, magnetic, or other characteristic of the film.

After the first deposited and treated composite layer 1557 is formed, the process of depositing and treating is repeated 1590 to produce a stoichiometric composite film 1570, a composition of multiple layers of treated films 1557. Variations in the process sequence for the deposition steps 1501-1504 and the treatment steps 1521-1524 also can be implemented in the inventive process to produce graded film structures in which the properties in the stack of the thin films 1557 used to produce the stoichiometric composite film 1570 are varied throughout the sequence of repeated depositions and treatments 1590 to produce a layer for which the one or more of the properties of the thin layers 1557 are varied for one or more of the individual layers 1557 in producing the composite film 1570.

Figure 16A:
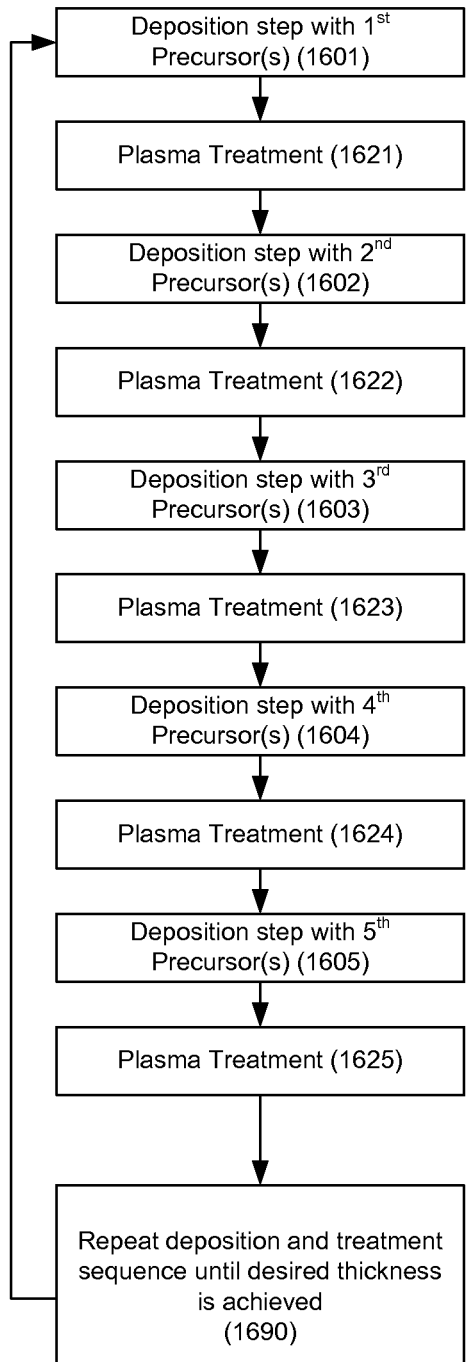
FIG. 16a is a flow chart for the present invention NLD process with five deposition steps that are each optionally followed by a treatment step, or combination of treatment steps that can be used to fabricate pentary or hexary compound films.
Figure 16B:
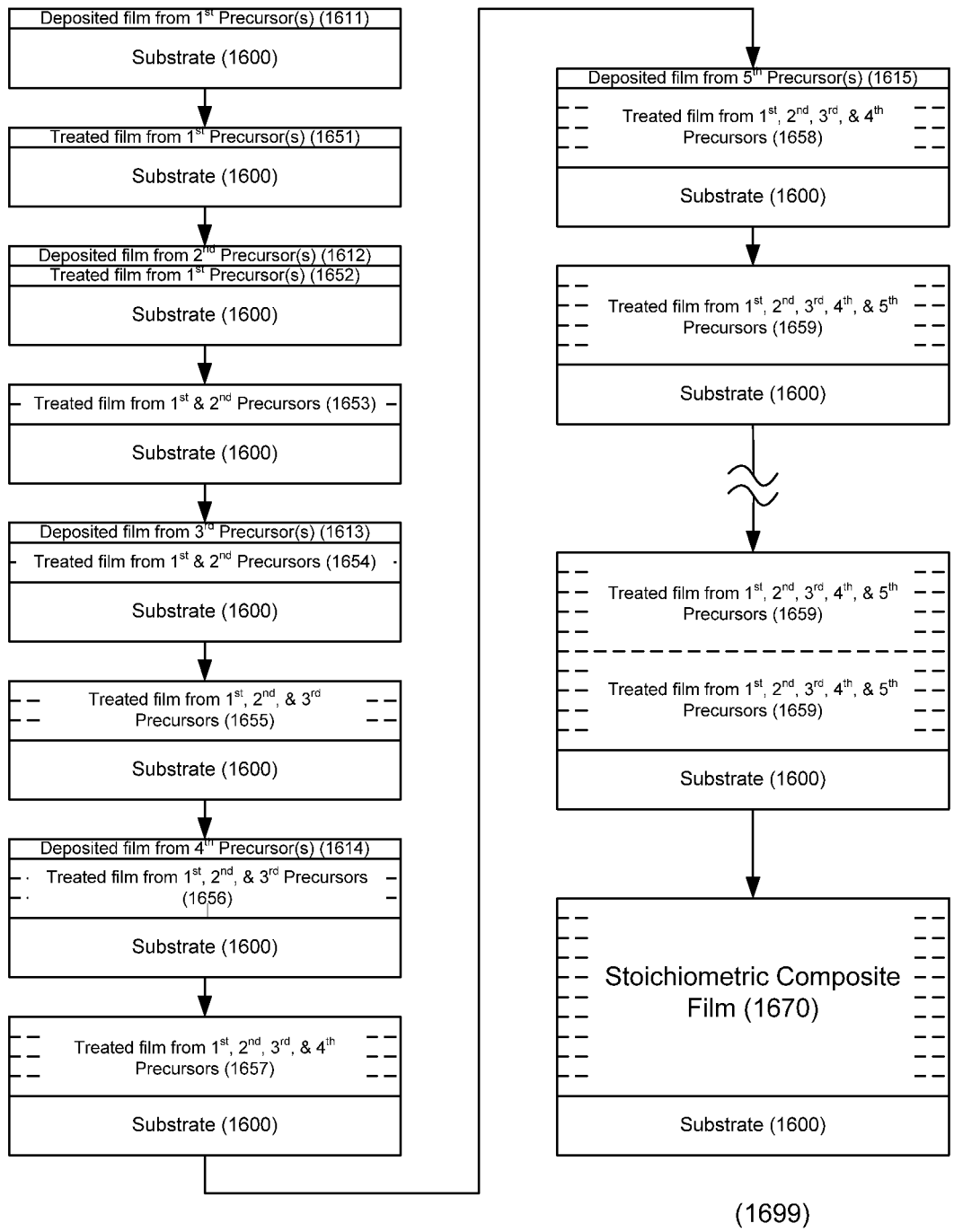
FIG. 16b is a schematic of the film structure for the present invention NLD process with five deposition steps that are each optionally followed by a treatment step, or combination of treatment steps used to produce pentary or hexary compound films

FIG. 16a shows a flowchart of an NLD process sequence 1698 with corresponding schematic of the film growth sequence 1699 on substrate 1600 shown in FIG. 16b. First deposition step 1601 is the exposure of the substrate 1600 to a first precursor, or set of precursors, to deposit a layer or film 1611. The first deposition step can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent.

Following film deposition 1601 from the first precursor, or set of precursors, is the plasma treatment 1621 to produce treated film 1651. The plasma treatment 1621 can be a single step or multiple steps. The plasma treatment 1621 can be a single step or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1600. The plasma treatment, or combination of plasma treatments 1621, modifies the properties of the deposited layers 1611 to produce treated layer 1651, a combination of elements from the deposition step 1601, and from the plasma treatment(s) 1621. The modification step 1621 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1698 shown in FIG. 16a, the treatment step 1621 is followed by a deposition step with a second set of precursors 1602 to produce layer 1612, that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1602, can impact one or more of the film properties of deposited and treated film 1651 to produce treated film 1652. The second deposition step 1602 produces the deposited layer or film 1612 above the treated film 1652.

Following the film deposition 1602 from the second set of precursors is the plasma treatment 1622 to produce treated composite film layer 1653 shown in FIG. 16b. The plasma treatment 1622 can be a single step or multiple steps. The plasma treatment 1622 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1600. The plasma treatment 1622, or combination of plasma treatments 1622, modifies the properties of the deposited layers 1612, 1652 to produce treated stoichiometric layer 1653, a combination of elements from the deposition step 1601-1602, and from the plasma treatments 1621-1622. The treatment steps 1621, 1622 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1698 shown in FIG. 16a, the treatment step 1622 is followed by a deposition step with a third set of precursors 1603 to produce layer 1613 shown in FIG. 16b. Treatment step 1613 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1603, can impact one or more of the film properties of deposited and treated film 1653 to produce treated film 1654. The third deposition step 1603 produces the deposited layer 1613 above the treated film 1654.

Following the film deposition 1603 from the third set of precursors is the plasma treatment 1623 to produce treated composite film layer 1655. The plasma treatment 1623 can be a single step or multiple steps. The plasma treatment 1623 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1600. The plasma treatment 1623, or combination of plasma treatments 1623, modifies the properties of the deposited layers 1613, 1654 to produce treated stoichiometric layer 1655, a combination of elements from the deposition steps 1601-1603, and from the plasma treatments 1621-1623. The treatment steps 1621-1623 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1698 shown in FIG. 16a, the treatment step 1623 is followed by a deposition step 1604 with a fourth precursor, or set of precursors, to produce layer 1614, that can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1604, can impact one or more of the film properties of deposited and treated film 1655 to produce treated film 1656. The fourth deposition step 1604 produces the deposited layer 1614 above the treated film 1656.

Following the film deposition 1604 from the fourth precursor, or set of precursors, is the plasma treatment 1624 to produce treated composite film layer 1657. The plasma treatment 1624 can be a single step or multiple steps. The plasma treatment 1624 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1600. The plasma treatment 1624, or combination of plasma treatments 1624, modifies the properties of the deposited layers 1614, 1656 to produce treated stoichiometric layer 1657, a combination of elements from the deposition steps 1601-1604, and from the plasma treatments 1621-1624. The treatment steps 1621-1624 can change the film density, change the film thickness, incorporate impurities, remove impurities, change the crystallinity of the film, modify the film composition, modify the stoichiometry, or change any other physical, electronic, magnetic, or other characteristic of the film.

In the embodiment 1698 shown in FIG. 16a, the treatment step 1624 is followed by a deposition step 1605 with a fifth precursor, or set of precursors, to produce layer 1615 shown in FIG. 16b. The treatment step 1624 can be a deposition from a single precursor, such as a CVD precursor or an MOCVD precursor; or it can be a set of precursors, such as a CVD precursor or an MOCVD precursor and another CVD or MOCVD precursor, a reactive gas, or a non-reactive gas; or it can be any combination of one or more of a CVD precursor, an MOCVD precursor, a reactive gas, a non-reactive gas, an inert gas, or a diluent. Inadvertent or intentional effects from the deposition step 1605, can impact one or more of the film properties of deposited and treated film 1657 to produce treated film 1658. The fifth deposition step 1605 produces the deposited layer 1615 on the treated film 1658.

Following the film deposition 1605 from the fifth precursor, or set of precursors, is the plasma treatment 1625 to produce treated composite film layer 1659. The plasma treatment 1625 can be a single step or multiple steps. The plasma treatment 1625 can be a single step plasma treatment or set of process conditions or can consist of multiple steps, with multiple chemistries, and with variations from step-to-step for any of a range of process parameters such as pressure, temperature, gas flow, plasma power, bias power, or other process condition that would vary the conditions imposed by the plasma onto the films on substrate 1600. The plasma treatment 1625, or combination of plasma treatments 1625, modifies the properties of the deposited layers 1615, 1658 to produce treated stoichiometric layer 1659, a combination of elements from the deposition steps 1601-1605, and from the plasma treatments 1621-1625. The treatment steps 1621-1625 can change the film density, change the film thickness, incorporate impurities, remove impurities, change the crystallinity of the film, modify the film composition, modify the stoichiometry, or change any other physical, electronic, magnetic, or other characteristic of the film.

After the first deposited and treated composite layer 1659 is formed, the process of depositing and treating is repeated 1690 to produce a stoichiometric composite film 1670, a composition of multiple layers of treated films 1659. Variations in the process sequence for the deposition steps 1601-1605 and the treatment steps 1621-1625 also can be implemented in the inventive process to produce graded film structures in which the properties in the stack of the thin films 1559 used to produce the stoichiometric composite film 1670 are varied throughout the sequence of repeated depositions and treatments 1690 to produce a layer for which the one or more of the properties of the thin layers 1659 are varied for one or more of the individual layers 1659 in producing the composite film 1670.

Other means for adjusting the stoichiometry of the growing film is to vary the sequence of the deposition steps from cycle to cycle. For example, in a first cycle, the duration of the one or more of the elemental deposition steps might have a duration that differs from the duration of the elemental deposition steps in a subsequent cycle. Variations across multiple cycles are within the scope of this invention. In cases in which the deposition times are not the same for all cycles for a particular element, or elements, the sum of the deposited elements from each deposition in the super-cycle (the combination of cycles with at least one differing condition prior to repeating) is used to produce the targeted stoichiometric contribution in the final film. For the stoichiometric film, $Ba_2SrTi_3O_9$, for example, the intracycle durations of the deposition steps might not always provide the stoichiometric mix defined by the target stoichiometry for the film, but rather the net contributions over all cycles must provide this stoichiometry. An example of a case in which the intracycle contributions differ from the stoichiometric composition is as follows. A first barium containing layer is deposited, followed by a strontium layer, followed by a titanium layer, followed by a treatment in oxygen for the completion of a first cycle, which is then followed by a second barium layer, a second titanium layer, and a second treatment in an oxygen-containing plasma for completion of a second cycle. In this example, the second cycle does not contain a deposited layer of strontium. In this simple example, a third cycle would be the same as the first cycle, and the fourth cycle would be the same as the second cycle. The desired stoichiometry is obtained by summing the contributions from the two subsequent cycles (the super-cycle) in this example, rather than from a single cycle as in the earlier example. Other iterations can be conceived in which the ratios of the elements during a single cycle do not sum to the desired stoichiometry but the ratios of the elements across a number of subsequent cycles sums to provide the desired stoichiometric ratio. This technique of changing the sequence of steps over multiple sub-cycles provides an additional method for controlling the delivered quantity of an element and is particularly useful for films in which the impurity levels are below a few atomic percent for one or more of the elements in the compound film.

In the preceding examples, the assumption is made that purge steps are introduced as needed between deposition and treatment steps. In many of the examples listed, the purge steps are optional, and depend largely on the compatibility between the precursors.

In yet another embodiment of the present invention, rather than using a sequence of Ba-deposition, Sr-deposition, Ti-deposition, and treatment in an oxygen containing plasma, an alternative sequence can be used in which a first treatment step is inserted after the deposition of the barium-containing layer, or partial layer, from a barium-containing first precursor, or set of precursors, and in which a second treatment step is inserted after the deposition of the strontium-containing layer, or partial layer, from a strontium-containing second precursor, or set of precursors, and in which a third treatment step is inserted after the deposition of the titanium-containing layer, or partial layer, from a titanium-containing third precursor, or set of precursors. The first treatment could be an oxygen-containing plasma exposure, a hydrogen-containing plasma exposure, an inert gas-containing plasma exposure, a nitrogen-containing plasma exposure, or other treatment to produce a barium layer with the desired film properties that might include one or more of film thickness, stoichiometry, density, crystallinity, and impurity level, among others. Similarly, the second treatment could be an oxygen-containing plasma exposure, a hydrogen-containing plasma exposure, an inert gas-containing plasma exposure, a nitrogen-containing plasma exposure, or other treatment to produce a barium-strontium composite layer with the desired film properties that might include one or more of film thickness, stoichiometry, density, crystallinity, and impurity level, among others. Similarly, the third treatment could be a hydrogen-containing plasma exposure, an inert gas-containing plasma exposure, a nitrogen-containing plasma exposure, or other treatment to produce a barium-strontium-titanium composite layer with the desired film properties that might include one or more of film thickness, stoichiometry, density, crystallinity, and impurity level, among others. Alternatively, the third treatment could be an exposure to an oxygen-containing plasma to produce a barium-strontium-titanium-oxygen composite layer with the desired film properties that might include one or more of film thickness, stoichiometry, density, crystallinity, and impurity level, among others. Alternatively, the third treatment step could be an exposure to a hydrogen-containing plasma exposure, an inert gas-containing plasma exposure, a nitrogen-containing plasma exposure, or other treatment to produce a barium-strontium-titanium composite layer with the desired film properties that might include one or more of film thickness, stoichiometry, density, crystallinity, and impurity level, among others, followed by an exposure to an oxygen-containing plasma to produce a barium-strontium-titanium-oxygen composite layer with the desired film properties that might include one or more of film thickness, stoichiometry, density, crystallinity, and impurity level, among others. The treatment step in this example is a composite treatment step consisting of a first exposure to a plasma treatment that does not contain oxygen, followed by a second exposure to a plasma treatment that does contain oxygen. This approach provides a practical method for firstly removing unwanted impurities from the deposited layer or layers using hydrogen, ammonia, or an inert gas, for example, and secondly for oxidizing the compound after removal of the impurities.

Example process sequences provided for the Ba—Sr—Ti—O compound are summarized below:

1) Evacuation→deposit-Ba layer→purge→deposit-Sr layer→purge→deposit-Ti layer→purge→treat Ba—Sr—Ti composite layer to form Ba—Sr—Ti—O film (repeat contents of brackets, [ ], until the desired thickness is achieved)

2) Evacuation→[deposit-Ba layer→purge→deposit-Sr layer→purge→deposit-Ti layer→purge→treat Ba—Sr—Ti composite layer to form Ba—Sr—Ti—O film→deposit-Ba layer→purge→deposit-Ti layer→purge→treat Ba—Sr—Ti—O—Ba—Ti composite layer to form Ba—Sr—Ti—O film] (repeat contents of brackets, [ ], until the desired thickness is achieved)

3) Evacuation→[deposit-Ba layer→purge→treat-Ba layer→purge deposit-Sr layer→purge→treat-Ba—Sr layer→purge→deposit-Ti layer→purge→treat Ba—Sr—Ti composite layer to form Ba—Sr—Ti—O layer] (repeat contents of brackets, [ ], until the desired thickness is achieved)

4) Evacuation→[deposit-Ba layer→purge→treat-Ba layer→purge→deposit-Sr layer→purge→treat-Ba—Sr layer→purge→deposit-Ti layer→purge→treat Ba—Sr—Ti composite layer with one or more non-oxygen plasma steps, followed by one or more treatments with oxygen-containing plasma to form Ba—Sr—Ti—O film] (repeat contents of brackets, [ ], until the desired thickness is achieved)

Numerous embodiments of the inventive process are possible within the scope of the present invention. Other embodiments for this example might include the following sequences:

1) Evacuation→[deposit-Ba layer→purge→deposit-Sr layer→purge→treat-Ba—Sr layer→purge→deposit-Ti layer→purge→treat Ba—Sr—Ti composite layer with one or more oxygen-containing plasma steps to form Ba—Sr—Ti—O film] (repeat contents of brackets, [ ], until the desired thickness is achieved)
2) Evacuation→[deposit-Ba layer→purge→deposit-Sr layer→purge→treat-Ba—Sr layer→purge→deposit-Ti layer→purge→treat Ba—Sr—Ti composite layer with one or more non-oxygen plasma steps, followed by one or more treatments with oxygen-containing plasma to form Ba—Sr—Ti—O film] (repeat contents of brackets, [ ], until the desired thickness is achieved)
3) Evacuation→[deposit-Ba layer→purge→treat-Ba layer→deposit-Sr layer→purge→deposit-Ti layer→treat-Ba—Sr—Ti composite layer with one or more treatments with an oxygen-containing plasma to form Ba—Sr—Ti—O film] (repeat contents of brackets, [ ], until the desired thickness is achieved)
4) Evacuation→[deposit-Ba layer→purge→treat→Ba layer→deposit-Sr layer→purge→deposit-Ti layer→treat-Ba—Sr—Ti composite layer with one or more non-oxygen plasma steps, followed by one or more treatments with oxygen-containing plasma to form Ba—Sr—Ti—O film] (repeat contents of brackets, [ ], until the desired thickness is achieved)

It should be understood that the actual depth of a treatment may be difficult to limit to simply the prior deposited one or two layers as noted in these examples and that the treatments may extend to an arbitrary depth below the layers mentioned in these sequences for any given treatment step described.

It should also be understood that the order shown in these examples is for the purposes of example only. Reversal of the order of the depositions and treatments associated with any of the elements in the compound film, for example, is within the scope of the present invention. Other ordered sequences are also possible that are within the scope of the present invention such as the deposition of the titanium layer first, followed by the Sr, followed by the Ba layer, followed by the treatment in the oxygen plasma. The ultimate intent of the process to produce a targeted stoichiometric films using a combination of depositions and treatments is within the scope of the inventive process, and is not restricted to the order of the depositions and treatments. For some stoichiometric combinations, a specific sequence of depositions and treatments could conceivably preferentially produce a desired result, and for other stoichiometric combinations, a different sequence of depositions and treatments might be better suited.

Additionally, it should be understood that multiple depositions of a single element over the course of one or more cycles are within the scope of the present invention. Examples of deposition and treatment steps in which the deposition and treatment of layers of one or more elements is provided below:

1) Evacuation→[deposit Ti-layer→purge→treat Ti-layer with one or more treatments with and/or without oxygen-containing plasma→deposit-Ba layer→purge→treat-Ba layer→purge→deposit Ti-layer→purge→treat Ti-layer with one or more treatments with and/or without oxygen-containing plasma→deposit-Sr layer→purge→treat-Sr layer→purge→deposit-Ti layer→purge→treat Ti-layer with one or more exposures to oxygen-containing plasma to form Ba—Sr—Ti—O film] (repeat contents of brackets, [ ], until the desired thickness is achieved)
2) Evacuation→[deposit Ti-layer→purge→treat Ti-layer with one or more treatments with and/or without oxygen-containing plasma→deposit-Ba layer→purge→treat-Ba layer→purge→deposit Ti-layer→purge→treat Ti-layer with one or more treatments with and/or without oxygen-containing plasma deposit-Sr layer→purge→treat-Sr layer→purge→deposit-Ti layer→purge→treat Ti-layer with one or more non-oxygen plasma steps, followed by one or more treatments with oxygen-containing plasma to form desired Ba—Sr—Ti—O film composition] (repeat contents of brackets, [ ], until the desired thickness is achieved)
3) Evacuation→[deposit Ti-layer→purge→treat Ti-layer with one or more non-oxygen plasma steps, followed by one or more treatments with oxygen-containing plasma→deposit-Ba layer→purge→treat-Ba layer→purge→deposit Ti-layer→purge→treat Ti-layer with one or more non-oxygen plasma steps, followed by one or more treatments with oxygen-containing plasma→deposit-Sr layer→purge→treat-Sr layer→purge→deposit-Ti layer→purge→treat Ti-layer with one or more non-oxygen plasma steps, followed by one or more treatments with oxygen-containing plasma to form desired Ba—Sr—Ti—O film composition] (repeat contents of brackets, [ ], until the desired thickness is achieved)
4) Evacuation→[deposit Ti-layer→purge→treat Ti-layer with one or more non-oxygen plasma steps, followed by one or more treatments with oxygen-containing plasma→deposit-Ba layer→purge→treat-Ba layer→purge→deposit Ti-layer→purge→treat Ti-layer with one or more non-oxygen plasma steps, followed by one or more treatments with oxygen-containing plasma→deposit-Sr layer→purge→treat-Sr layer→purge→deposit-Ti layer→purge→treat Ti-layer with one or more non-oxygen plasma steps, followed by one or more treatments with oxygen-containing plasma to form desired Ba—Sr—Ti—O film composition] (repeat contents of brackets, [ ], until the desired thickness is achieved)
5) Evacuation→[deposit-Ba layer→purge→treat-Ba layer→purge→deposit-Sr layer→purge→treat Ba—Sr layer→purge→deposit Ti-layer→purge→treat Ba—Sr—Ti-layer oxygen-containing plasma to form desired Ba—Sr—Ti—O film composition→deposit-Ba layer→purge→treat-Ba layer→purge→deposit Ti-layer→purge→treat Ba—Ti-layer in an oxygen-containing plasma to form desired Ba—Sr—Ti—O film composition→deposit-Ba layer→purge→treat-Ba layer→purge→deposit-Sr layer→purge→treat Ba—Sr layer→purge→deposit Ti-layer→purge→treat Ba—Sr—Ti-layer oxygen-containing plasma to form desired Ba→Sr—Ti—O film composition] (repeat contents of brackets, [ ], until the desired thickness is achieved)

Additional combinations of the inventive process that utilize variations in the sub-cycles are possible within the scope of the present invention.

In addition to variations in adjacent cycles to create targeted concentrations of elements in the growing films, additional variations in the cycles can be introduced in the inventive technique to produce graded film structures across the full depth of the film. For example, in the case of a Ba—Sr—Ti—O film, it might be desirable to reduce the concentration of one of the elements in the vicinity of the interface with the growing film and the substrate. In these cases, the number of deposition and treatment steps for this particular element can be reduced, eliminated altogether, or reduced and gradually increased in the vicinity of the interface. The gradation in the concentration of elements can be implemented for one or more elements, and at one or more interfaces.

The gradation of elements in the deposited film can result in a lowering of the concentration of one or more elements near the interface or interfaces, can result in an increase in the concentration of one or more elements near an interface or interfaces, and can result in any variation of desired distributions in the concentration of the constituent elements in the film stack. The gradation need not be symmetric. The gradation can produce an increase in the concentration of one or more elements at one interface and a decrease in the concentration, relative to the bulk concentration, at another interface.

In yet another embodiment of the inventive process, the deposited films are treated after the deposition with a thermal treatment, or anneal. The post deposition treatment can be in-situ or ex-situ. The post deposition treatment can be in a separate module on the same, or different single wafer cluster tool as is typically used in semiconductor wafer processing. The post-deposition treatment can be performed with a hot electrode, with a rapid thermal treatment, with lamps, or any other means for heating the film or substrate. The post-deposition treatment can be in a furnace in which multiple wafers are processed.

In the examples of the inventive processes that are provided for the deposition of Ba—Sr—Ti—O films, and by extension to other complex quaternary films, the Ba, Sr, and Ti can be constituents of a gas, such as TiCl4 for the case of Ti. Alternatively, the metallic components of the deposited film can be from a metallic-organic precursor such as TDMAT. The metallic components of the deposited film can be from a liquid precursor that is vaporized prior to delivery to the chamber. The gaseous precursors can be delivered to the chamber with, or without, a carrier gas such as nitrogen, argon, helium, or any other gas that is used for the purpose of assisting in the delivery of the precursor to the process chamber.

The treatment step can be one step with the same parameters applied throughout, or the treatment step can be a compilation of a number of steps in which conditions are varied.

In yet another embodiment, using the deposition of the Ba—Sr—Ti—O compound film as an example, the following sequence might be used. A first deposition of a layer containing barium, followed by a plasma treatment in an oxygen-containing plasma, a second deposition of a layer containing strontium (Sr), followed by another plasma treatment in an oxygen-containing plasma, a third deposition of a layer containing titanium, followed by another plasma treatment in an oxygen-containing plasma.

In yet another embodiment, again using the example of the Ba—Sr—Ti—O compound, a first deposition of a layer containing barium is deposited; followed by a second deposition of a layer containing strontium; followed by a treatment in a hydrogen-containing plasma to convert the desired Ba—Sr film properties that might include one of more of film thickness, stoichiometry, density, crystallinity, and impurity level; followed by a deposition of a layer containing titanium, followed by a plasma treatment in an oxygen-containing plasma to convert the combined Ba—Sr and the Ti—O to the desired Ba—Sr—Ti—O film properties that includes one or more of film thickness, stoichiometry, density, crystallinity, and impurity level. These steps are repeated until the desired overall film thickness is achieved.

In yet another embodiment, using the Ba—Sr—Ti—O compound as an example, the following sequence might be used. A first deposition of a layer containing barium, followed by a plasma treatment in an hydrogen-containing plasma, a second deposition of a layer containing strontium, followed by another plasma treatment in an hydrogen-containing plasma, a third deposition of a layer containing titanium, followed by another plasma treatment in an oxygen-containing plasma to convert the combined Ba—Sr and the Ti—O to the desired Ba—Sr—Ti—O film properties that includes one or more of film thickness, stoichiometry, density, crystallinity, and impurity level. These steps are repeated until the desired overall film thickness is achieved.

In yet another embodiment, using the Ba—Sr—Ti—O compound as an example, the following sequence might be used. A first deposition of a layer containing titanium, followed by a plasma treatment in an oxygen-containing plasma, a second deposition of a layer containing strontium (Sr), followed by a plasma treatment in an hydrogen-containing plasma, a third deposition of a layer containing barium, followed by another plasma treatment in a hydrogen-containing plasma to convert the combined Ti—O and the Ba—Sr layers to the desired Ba—Sr—Ti—O film properties that might include one or more of film thickness, stoichiometry, density, crystallinity, and impurity level. These steps are repeated until the desired overall film thickness is achieved.

In yet another embodiment, using the Ba—Sr—Ti—O compound as an example, the following sequence might be used. A first deposition of a layer containing titanium, followed by a plasma treatment in an oxygen-containing plasma, a second deposition of a layer containing strontium (Sr), followed by a plasma treatment in an hydrogen-containing plasma, a third deposition of a layer containing barium, followed by another plasma treatment in a hydrogen-containing plasma to convert the combined Ti—O and the Ba—Sr layers to the desired Ba—Sr—Ti—O film properties that might include one or more of film thickness, stoichiometry, density, crystallinity, and impurity level. In this embodiment, the steps in the process step times are not repeated exactly but rather are varied in some manner with the growing film to achieve the desired overall film thickness. For example, in some applications, a higher concentration of barium may be preferred at the top of the overall film thickness. In this case, the duration of the barium deposition step may be longer than in latter depositions in the middle of the overall film stack. In another example, a lower concentration of oxygen may be preferred in some parts of the overall film thickness. In this example, the oxygen concentration in the plasma might be lowered or diluted to reduce the concentration of oxygen in the film at these locations in the film stack. If a reduced oxygen concentration is preferred at the interface with the layer on the substrate that comes in contact with the Ba—Sr—Ti—O layer, for example, the oxygen concentration in the plasma treatment step can be reduced, or diluted, or the duration of the oxygen-containing plasma treatment step can be reduced to lower the oxygen concentration in the first few deposition cycles relative to the oxygen concentration in layers deposited at steps in the process that follow these initial deposition cycles. Alternatively, a higher concentration of oxygen may be desirable. In cases in which higher levels of oxygen are desirable, the duration of the oxygen treatment steps could be extended relative to the oxygen-containing plasma treatment steps used throughout the bulk of the film to increase the level of incorporated oxygen.

In yet other embodiments of the present invention, the deposition times are varied to vary the concentration of one or more of the elements in the film stack.

In yet other embodiments of the present invention, the treatment times of one or more plasma treatment steps are varied to vary the concentration of one or more of the elements in the film stack.

In yet other embodiments, the concentration of one or more elements in the film structure with the growing film thickness is varied, by varying the duration of the deposition steps, or the duration of the treatment steps.

In yet other embodiments, one or more of film thickness, stoichiometry, density, oxidation, crystallinity, and impurity level are varied by varying the duration of the individual film deposition steps or the duration of the treatment steps.

The embodiments provided above are for example only and are not intended to limit the scope of the inventive process.

The inventive method can be used to deposit other films, for example, that include films with high dielectric constants, ferroelectric oxides, oxides used in resistive memories, piezoelectric films, pyroelectric films, and superconducting oxides. Table 1 shows list of examples of some of the types of films that can be deposited using the inventive technique.

TABLE 1

Examples of compound films.

HIGH k Dielectrics

Ba—Ti—O compounds
Ca—Cu—Ti—O compounds
La—Al—O compounds
Sr—Ta—O compounds
Pb—Mg—Nb—O compounds
Pb—La—Zr—Ti—O compounds
Ba—Sr—Ti—O compounds
Ba—Zr—Ti—O compounds
Bi—Zn—Nb—O Compounds
Sr—Ti—O compounds
Ag—Ta—Nb—O compounds
Ba—Ca—Ti—Zr—O compunds
Sr—Bi—Ta—O compounds
Ferroelectrics Pb—Zr—Ti—O compounds
Ba—Sr—Ti—O compounds
Sr—Bi—Ta—O compounds
Superconductors Y—Ba—Cu—O compounds
Nd—Ba—Cu—O compounds
Th—Ba—Cu—O compounds
La—Sr—Cu—O compounds
Piezoelectrics Ba—Ti—O compounds
Sr—Bi—Ti—O compounds
Pb—Zr—Ti—O compounds
Pb—Ti—O compounds
Pyroelectrics Li—Nb—O compounds
K—Nb—O compounds
Na—Nb—O compounds The oxygen-containing plasma treatment can be oxygen only, or a mixture of oxygen and argon, oxygen and helium, oxygen and nitrogen, oxygen and hydrogen (low pressure) and oxygen with other gases such as ammonia. The oxygen-containing plasma treatment can be $CO_2$, CO, $NO_2$, NO or a combination of $CO_2$, CO, $NO_2$, and NO mixed with other gases such as argon, helium, hydrogen, nitrogen, ammonia. The oxygen-containing plasma can be an ozone treatment. The source of the oxygen-containing plasma can be a high density plasma source, a low density plasma source, a remote plasma source, or ion source, or other source of excited molecular and atomic species.

Films that do not require the incorporation of oxygen or nitrogen, the oxygen step need not be applied. In the case of a deposition of an alloy of GeSbTe, for example, the treatments can be limited to reducing chemistries that remove excess material from the deposited layers without the intended incorporation of gaseous elements such as oxygen and nitrogen. Examples include hydrogen and ammonia. In these cases, the metal films are deposited using the deposition sequences described without the oxidizing steps.

Figure 17:
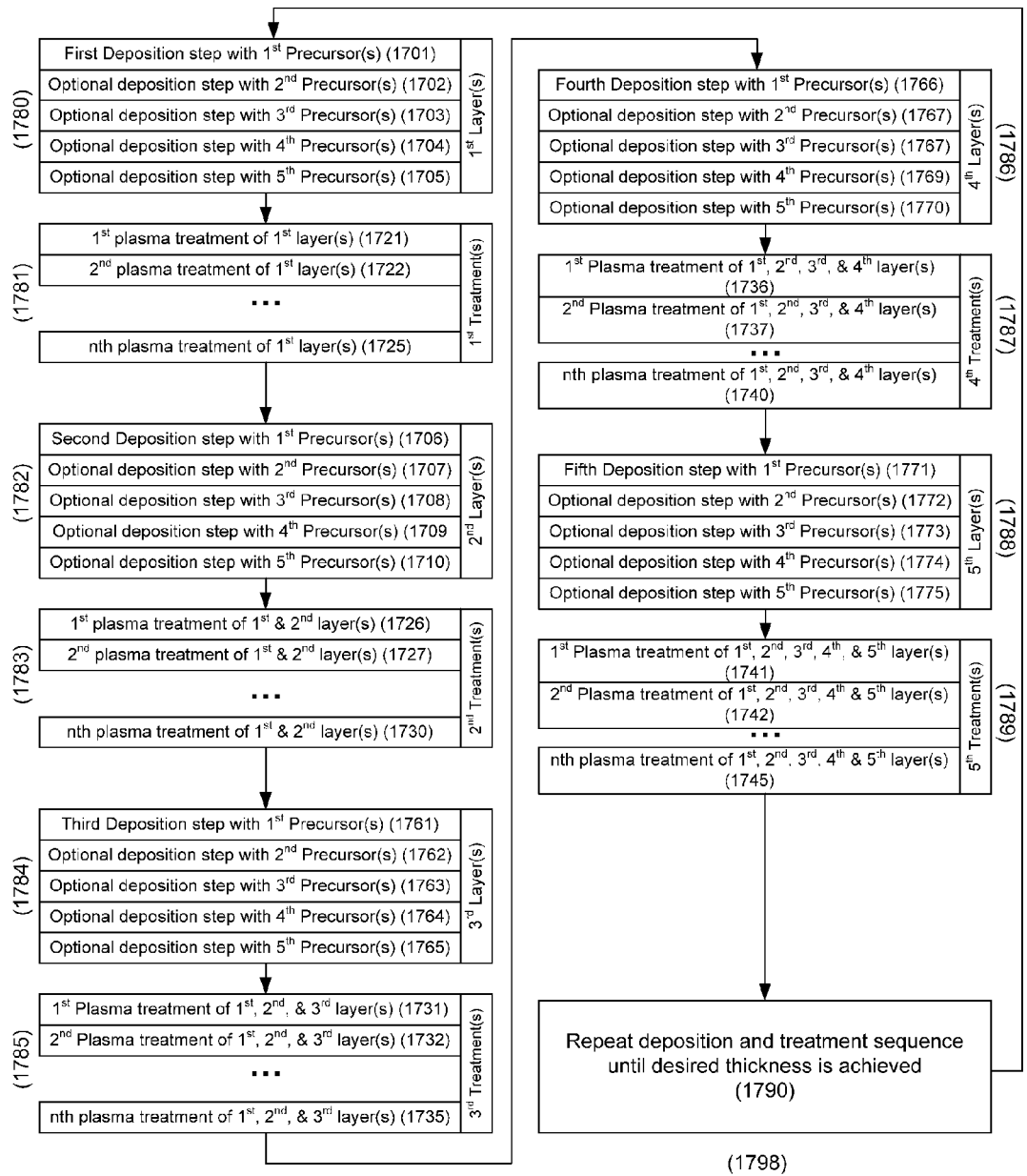
FIG. 17 is a flow chart for the present invention NLD process showing the general case with up to five deposition steps and with multiple optional treatment steps after each deposition step to fabricate binary, tertiary, quaternary, pentary, and hexary compound thin films.

FIG. 17 is a flow chart for the present invention NLD process showing a general case with up to five deposition steps and with multiple optional treatment steps after each deposition step to produce binary, tertiary, quaternary, pentary, and hexary compound thin films. A first layer is deposited 1780, comprising a deposition step with first precursor, or set of precursors 1701, followed by optional deposition steps 1702-1705 with second to fifth precursors, or sets of precursors, respectively.

The first layer is then plasma treated 1781 with a first treatment 1721. Plasma treatment 1781 comprises up to 'n' plasma treatment steps.

A second layer is deposited 1782 on the treated first layer, comprising a deposition step 1706 with a first precursor for the second layer. Additional, optional, deposition steps 1707-1710 with second to fifth precursors can also be used to apply additional elements or films.

The second layer, with underlying first layer, is then plasma treated 1783, with treatment step 1726 and optionally 1727-1730, comprising up to 'n' plasma treatment steps for the combined stack of $1^{st}$ and $2^{nd}$ layers.

A third layer is deposited 1784 on the treated first and second layers, comprising a deposition step 1761 with a first precursor deposition for the third layer. Additional, optional, deposition steps 1762-1765 with second to fifth precursors can also be used to apply additional elements or films.

The third layer, with underlying first and second layers, are then plasma treated 1785, with treatment step 1731, and optionally 1732-1735.

A fourth layer is deposited 1786 on the treated first, second, and third layers, comprising a deposition step 1766 with a first precursor deposition for the fourth layer. Additional, optional, deposition steps 1767-1770 with second to fifth precursors can also be used to apply additional elements or films.

The fourth layer, with underlying first, second, and third layers, is then plasma treated 1787, with treatment step 1736, and optionally 1737-1740.

A fifth layer is deposited 1788 on the treated first, second, third, and fourth layers, comprising a deposition step 1771 with a first precursor deposition for the fifth layer. Additional, optional, deposition steps 1772-1775 with second to fifth precursors can also be used to apply additional elements or films.

The fifth layer, with underlying first, second, third, and fourth layers, is then plasma treated 1788, with treatment step 1741, and optionally 1742-1745.

The sequence is repeated 1790 until a desired thickness is achieved.

Figure 18:
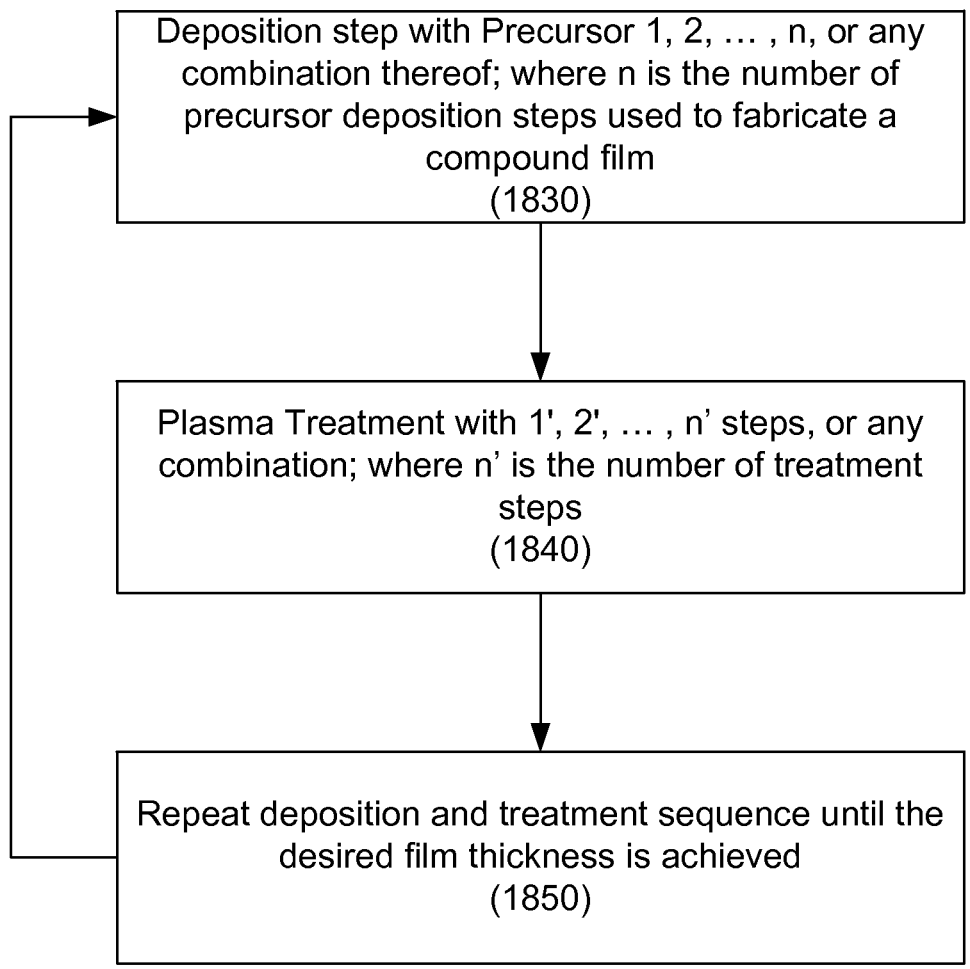
FIG. 18 is a flow chart for a general case for the present invention NLD process with n deposition steps, where n is the number of deposition steps used to deposit a layer or group of layers, and with n' treatment steps, where n' is the number of plasma treatment steps that are used to treat the layer(s) from the corresponding deposition steps, n.

FIG. 18 is a flow chart for the present invention NLD process showing a general case of deposition and treatment. Operation 1830 deposits with Precursor 1, 2, . . . , n, or any combination thereof, where n is the number of precursor deposition steps used to deposit a layer. Operation 1840 plasma treats the deposited layers with 1', 2', ..., n' steps, or any combination thereof, where n' is the number of treatment steps. Operation 1850 repeats deposition and treatment sequence until the desired film thickness is achieved.

While the invention has been described and illustrated in connection with the preferred embodiments of nanolayer deposition processes, many variations and modifications, as will be apparent to those of skill in the art, may be made without departing from the spirit and scope of the invention. The invention as set forth in the appended clams is thus not limited to the precise details of construction set forth above as such variations and modifications are intended to be included within the spirit and scope of the invention as set forth in the defined claims.

What is claimed is:

1. A cyclical method of depositing and treating a composite film on a substrate, the method comprising a cycle of:
    introducing into a reaction chamber one or more first precursors;
    depositing a first layer from the one or more first precursors on the substrate, the deposition being not self-limiting;
    introducing into the reaction chamber one or more second precursors;
    depositing a second layer from the one or more second precursors onto the first layer, the second layer having a different material composition from the first layer; and
    treating, in the reaction chamber, the first layer and the second layer in an oxygen-containing plasma ambient to create a compound oxide film, wherein the compound oxide film is created from reaction between the first layer and the different material composition of the second layer during the treating,
wherein the cycle is repeated until an overall desired thickness is obtained, and wherein, in each cycle a layer of less than a nanometer to a few nanometers is deposited.

2. A method of depositing and treating as in claim 1 further comprising treating at least one of the first and second layers in a hydrogen-containing plasma ambient using a gas containing molecular hydrogen.

3. A method of depositing and treating as in claim 1 wherein at least a relative composition of the first and second layers and oxygen are different in subsequent layers to form a graded composite film.

4. A method of depositing and treating as in claim 1 further comprising forming an oxygen-rich composite film at a top or bottom interface.

5. A method of depositing and treating as in claim 1 wherein the first precursors comprise Li, wherein the second precursors comprise Nb, and wherein the compound oxide film comprises Li—Nb-Oxide.

6. A method of depositing and treating as in claim 1 wherein the first precursors comprise K, wherein the second precursors comprise Nb, and wherein the compound oxide film comprises K13 Nb-Oxide.

7. A method of depositing and treating as in claim 1 wherein the first precursors comprise Na, wherein the second precursors comprise Nb, and wherein the compound oxide film comprises Na13 Nb-Oxide.

8. A method of depositing and treating as in claim 1 wherein the first precursors comprise La, wherein the second precursors comprise Al, and wherein the compound oxide film comprises La13 Al-Oxide.

9. A method of depositing and treating as in claim 1 wherein the first precursors comprise Sr, wherein the second precursors comprise Ta, and wherein the compound oxide film comprises Sr13 Ta-Oxide.

10. A method of depositing and treating as in claim 1 wherein the first precursors comprise Sr, wherein the second precursors comprise Ti, and wherein the compound oxide film comprises Sr13 Ti-Oxide.

11. A method of depositing and treating as in claim 1 wherein the first precursors comprise Ba, wherein the second precursors comprise Ti, and wherein the compound oxide film comprises Ba13 Ti-Oxide.

12. A method of depositing and treating as in claim 1 further comprising an exposing step to a heating treatment to modify the properties of the deposited layers.

13. A method of depositing and treating as in claim 1 further comprising treating at least one of the first and second layers in the oxygen-containing plasma ambient before treating the first layer and the second layer in the oxygen-containing plasma ambient to create the compound oxide film.

14. A method of depositing and treating as in claim 1, further comprising plasma treating the first layer before depositing the second layer, wherein the plasma treating comprises at least one of an oxygen-containing plasma ambient and a hydrogen-containing plasma ambient.

15. A method of depositing and treating as in claim 1, further comprising plasma treating the second layer before treating the first layer and the second layer in an oxygen-containing plasma ambient, wherein the plasma treating comprises at least one of an oxygen-containing plasma ambient and a hydrogen-containing plasma ambient.

16. The method of claim 1, wherein, in each cycle, less than a nanometer to 2 nanometers is deposited.

17. A method of depositing and treating a composite film on a substrate, the method comprising a cycle of:
    introducing into a reaction chamber one or more first precursors;
    depositing a first layer from the one or more first precursors on the substrate, the deposition being not self-limiting;
    introducing into the reaction chamber one or more second precursors;
    depositing a second layer from the one or more second precursors onto the first layer, wherein the second layer has a different material composition from the first layer;
    introducing into the reaction chamber one or more third precursors;
    depositing a third layer from the one or more third precursors onto the second layer, wherein the third layer has a different material composition from the first and second layers; and
    treating the first, second and third layers in the reaction chamber in an oxygen-containing plasma ambient to create a compound oxide film from a reaction between the different material compositions of the first, second, and third layers,
wherein the cycle is repeated until an overall desired thickness is obtained, and wherein in each cycle a layer of less than a nanometer to a few nanometers is deposited.

18. A method of depositing and treating as in claim 17 further comprising:
    treating at least one of the first, second, and third layers in an hydrogen-containing plasma ambient.

19. A method of depositing and treating as in claim 17 wherein at least a relative composition of the first, second, third layers and oxygen are different in subsequent layers to form a graded composite film.

20. A method of depositing and treating as in claim 17 further comprising forming an oxygen-rich composite film at a top or bottom interface.

21. A method of depositing and treating as in claim 17 wherein the first precursors comprise Sr, wherein the second precursors comprise Bi, wherein the third precursors comprise Ti, and wherein the compound oxide film comprises Sr13 Bi13 Ti-Oxide.

22. A method of depositing and treating as in claim 17 wherein the first precursors comprise Sr, wherein the second precursors comprise Bi, wherein the third precursors comprise Ta, and wherein the compound oxide film comprises Sr—Bi13 Ta-Oxide.

23. A method of depositing and treating as in claim 17 wherein the first precursors comprise Y, wherein the second precursors comprise Ba, wherein the third precursors comprise Cu, and wherein the compound oxide film comprises Y13 Ba13 Cu-Oxide.

24. A deposition method of depositing and treating as in claim 17 wherein the first precursors comprise N d, wherein the second precursors comprise Ba, wherein the third precursors comprise Cu, and wherein the compound oxide film comprises Nd13 Ba13 Cu-Oxide.

25. A method of depositing and treating as in claim 17 wherein the first precursors comprise Th, wherein the second precursors comprise Ba, wherein the third precursors comprise Cu, and wherein the compound oxide film comprises Th13 Ba13 Cu-Oxide.

26. A method of depositing and treating as in claim 17 wherein the first precursors comprise La, wherein the second precursors comprise Sr, wherein the third precursors comprise Cu, and wherein the compound oxide film comprises La13 Sr13 Cu-Oxide.

27. A method of depositing and treating as in claim 17 wherein the first precursors comprise Ba, wherein the second precursors comprise Sr, wherein the third precursors comprise Ti, and wherein the compound oxide film comprises Ba13 Sr13 Ti-Oxide.

28. A method of depositing and treating as in claim 17 wherein the first precursors comprise Ba, wherein the second precursors comprise Zr, wherein the third precursors comprise Ti, and wherein the compound oxide film comprises Ba13 Zr13 Ti-Oxide.

29. A method of depositing and treating as in claim 17 wherein the first precursors comprise Bi, wherein the second precursors comprise Zn, wherein the third precursors comprise Nb, and wherein the compound oxide film comprises Bi13 Zn13 Nb-Oxide.

30. A method of depositing and treating as in claim 17 wherein the first precursors comprise Ag, wherein the second precursors comprise Ta, wherein the third precursors comprise Nb, and wherein the compound oxide film comprises Ag13 Ta13 Nb-Oxide.

31. A method of depositing and treating as in claim 17 wherein the first precursors comprise Ca, wherein the second precursors comprise Cu, wherein the third precursors comprise Ti, and wherein the compound oxide film comprises Ca13 Cu13 Ti-Oxide.

32. A method of depositing and treating as in claim 17 wherein the first precursors comprise Pb, wherein the second precursors comprise Zr, wherein the third precursors comprise Ti, and wherein the compound oxide film comprises Pb13 Zr13 Ti-Oxide.

33. A method of depositing and treating as in claim 17 further comprising an exposing step to a heating treatment to modify the properties of the deposited layers.

34. A method of depositing and treating as in claim 17 further comprising treating at least one of the first, second, and third layers in an oxygen-containing plasma ambient before treating the first, second and third layers in an oxygen-containing plasma ambient to create the compound oxide film.

35. The method of claim 17, wherein, in each cycle, less than a nanometer to 2 nanometers is deposited.

* * * * *

UNITED STATES PATENT AND TRADEMARK OFFICE
CERTIFICATE OF CORRECTION

PATENT NO. : 9,121,098 B2  
APPLICATION NO. : 13/235909  
DATED : September 1, 2015  
INVENTOR(S) : Ditizio et al.

Page 1 of 2

It is certified that error appears in the above-identified patent and that said Letters Patent is hereby corrected as shown below:

Title Page

Page 1 (item 63, Related U.S. Application Data) at line 2, Change "and" to --which is--.

In column 1 (page 3, item 56) at line 6, Under Other Publications, Change "Pag e" to --Page--.

In the Specification

In column 1 at line 66, Change "metalo-organic" to --metallo-organic--.

In column 7 at line 17, Change "films" to --films.--.

In column 14 at line 49, Change "metalo-organic" to --metallo-organic--.

In column 20 at line 16, Change "described. p" to --described.--.

In column 26 at line 47, Change "invention" to --invention.--.

In column 35 at line 7, Change "hygrogen" to --hydrogen--.

In column 48 at line 59 (approx.), Change "Ba→Sr-Ti-O" to --Ba-Sr-Ti-O--.

In column 51 at line 40 (approx.), Change "compunds" to --compounds--.

In the Claims

In column 53 at line 55, In Claim 6, change "K13 Nb-Oxide." to --K-Nb-Oxide.--.

In column 53 at line 59, In Claim 7, change "Na13 Nb-Oxide." to --Na-Nb-Oxide.--.

In column 53 at line 63, In Claim 8, change "La13 Al-Oxide." to --La-Al-Oxide.--.

In column 53 at line 67, In Claim 9, change "Sr13 Ta-Oxide." to --Sr-Ta-Oxide.--.

In column 54 at line 4, In Claim 10, change "Sr13 Ti-Oxide." to --Sr-Ti-Oxide.--.

In column 54 at line 8, In Claim 11, change "Ba13 Ti-Oxide." to --Ba-Ti-Oxide.--.

In column 55 at line 3, In Claim 21, change "Sr13 Bi13 Ti-Oxide." to --Sr-Bi-Ti-Oxide.--.

In column 55 at line 8, In Claim 22, change "Sr-Bi13 Ta-Oxide." to --Sr-Bi-Ta-Oxide.--.

In column 55 at line 13, In Claim 23, change "Y13 Ba13 Cu-Oxide." to --Y-Ba-Cu-Oxide.--.

In column 55 at line 14, In Claim 24, after "A" delete "deposition".

Signed and Sealed this  
Twenty-fourth Day of May, 2016

Michelle K. Lee  
*Director of the United States Patent and Trademark Office*

CERTIFICATE OF CORRECTION (continued)
U.S. Pat. No. 9,121,098 B2

In column 55 at line 15 (approx.), In Claim 24, change "N d," to --Nd,--.

In column 55 at line 18, In Claim 24, change "Nd13 Ba13 Cu-Oxide." to --Nd-Ba-Cu-Oxide.--.

In column 55 at line 23, In Claim 25, change "Th13 Ba 13 Cu-Oxide." to --Th-Ba-Cu-Oxide.--.

In column 55 at line 28, In Claim 26, change "La13 Sr13 Cu-Oxide." to --La-Sr-Cu-Oxide.--.

In column 55 at line 33, In Claim 27, change "Ba13 Sr13 Ti-Oxide." to --Ba-Sr-Ti-Oxide.--.

In column 56 at line 3, In Claim 28, change "Ba13 Zr13 Ti-Oxide." to --Ba-Zr-Ti-Oxide.--.

In column 56 at line 8, In Claim 29, change "Bi13 Zn13 Nb-Oxide." to --Bi-Zn-Nb-Oxide.--.

In column 56 at line 13, In Claim 30, change "Ag13 Ta13 Nb-Oxide." to --Ag-Ta-Nb-Oxide.--.

In column 56 at line 18, In Claim 31, change "Ca13 Cu13 Ti-Oxide." to --Ca-Cu-Ti-Oxide.--.

In column 56 at line 23, In Claim 32, change "Pb13 Zr13 Ti-Oxide." to --Pb-Zr-Ti-Oxide.--.